(12) United States Patent
Xiong et al.

(10) Patent No.: US 9,756,698 B2
(45) Date of Patent: Sep. 5, 2017

(54) LED TUBE LAMP WITH TWO OPERATING MODES COMPATIBLE WITH ELECTRICAL BALLASTS

(71) Applicant: JIAXING SUPER LIGHTING ELECTRIC APPLIANCE CO., LTD., Zhejiang (CN)

(72) Inventors: Aiming Xiong, Zhejiang (CN); Xintong Liu, Zhejiang (CN); Xiaojia Wu, Zhejiang (CN)

(73) Assignee: Jiaxing Super Lighting Electric Appliance Co., Ltd., Xiuzhou Area, Jiaxing, Zhejiang (CN)

( * ) Notice: Subject to any disclaimer, the term of this patent is extended or adjusted under 35 U.S.C. 154(b) by 0 days.

(21) Appl. No.: 15/211,813

(22) Filed: Jul. 15, 2016

(65) Prior Publication Data

US 2017/0094746 A1 Mar. 30, 2017

Related U.S. Application Data

(63) Continuation-in-part of application No. 14/865,387, filed on Sep. 25, 2015, now Pat. No. 9,609,711, and
(Continued)

(30) Foreign Application Priority Data

Sep. 28, 2014 (CN) .......................... 2014 1 0507660
Sep. 28, 2014 (CN) .......................... 2014 1 0508899
(Continued)

(51) Int. Cl.
*H05B 37/00* (2006.01)
*H05B 41/00* (2006.01)
(Continued)

(52) U.S. Cl.
CPC ......... *H05B 33/0887* (2013.01); *F21K 9/272* (2016.08); *F21K 9/278* (2016.08);
(Continued)

(58) Field of Classification Search
None
See application file for complete search history.

(56) References Cited

U.S. PATENT DOCUMENTS 5,936,599 A    8/1999  Reymond
7,380,961 B2   6/2008  Moriyama
(Continued)

FOREIGN PATENT DOCUMENTS

CN    200965185    10/2007
CN    101715265     5/2010
(Continued)

*Primary Examiner* — Anh Tran
(74) *Attorney, Agent, or Firm* — Muir Patent Law, PLLC

(57) ABSTRACT

An LED tube lamp is disclosed. The LED tube lamp includes an LED module for emitting light, the LED module comprising an LED unit comprising an LED; a rectifying circuit for rectifying an external driving signal to produce a rectified signal; and a mode determination circuit configured to detect a state of a property of the rectified signal, for selectively determining on performing a first mode or a second mode of lighting according to the state of the property of the rectified signal; wherein when the LED tube lamp performs the first mode of lighting, the mode determination circuit allows continual current to flow through the LED unit until the external driving signal is disconnected from the LED tube lamp; and when the LED tube lamp performs the second mode of lighting, the mode determination circuit regulates the continuity of current to flow through the LED unit.

30 Claims, 22 Drawing Sheets

Related U.S. Application Data a continuation-in-part of application No. 15/150,458, filed on May 10, 2016, which is a continuation-in-part of application No. 14/699,138, filed on Apr. 29, 2015, now Pat. No. 9,480,109.

(30) Foreign Application Priority Data

| Date | Country | Number |
|---|---|---|
| Nov. 6, 2014 | (CN) | 2014 1 0623355 |
| Dec. 5, 2014 | (CN) | 2014 1 0734425 |
| Feb. 12, 2015 | (CN) | 2015 1 0075925 |
| Mar. 10, 2015 | (CN) | 2015 1 0104823 |
| Mar. 25, 2015 | (CN) | 2015 1 0133689 |
| Mar. 26, 2015 | (CN) | 2015 1 0134586 |
| Mar. 27, 2015 | (CN) | 2015 1 0136796 |
| Apr. 3, 2015 | (CN) | 2015 1 0155807 |
| Apr. 14, 2015 | (CN) | 2015 1 0173861 |
| Apr. 22, 2015 | (CN) | 2015 1 0193980 |
| May 19, 2015 | (CN) | 2015 1 0259151 |
| May 22, 2015 | (CN) | 2015 1 0268927 |
| May 29, 2015 | (CN) | 2015 1 0284720 |
| Jun. 10, 2015 | (CN) | 2015 1 0315636 |
| Jun. 17, 2015 | (CN) | 2015 1 0338027 |
| Jun. 26, 2015 | (CN) | 2015 1 0364735 |
| Jun. 26, 2015 | (CN) | 2015 1 0372375 |
| Jun. 26, 2015 | (CN) | 2015 1 0373492 |
| Jun. 29, 2015 | (CN) | 2015 1 0378322 |
| Jul. 2, 2015 | (CN) | 2015 1 0391910 |
| Jul. 10, 2015 | (CN) | 2015 1 0406595 |
| Jul. 20, 2015 | (CN) | 2015 1 0428680 |
| Aug. 7, 2015 | (CN) | 2015 1 0482944 |
| Aug. 8, 2015 | (CN) | 2015 1 0483475 |
| Aug. 8, 2015 | (CN) | 2015 1 0486115 |
| Sep. 2, 2015 | (CN) | 2015 1 0555543 |
| Sep. 6, 2015 | (CN) | 2015 1 0557717 |
| Sep. 18, 2015 | (CN) | 2015 1 0595173 |
| Sep. 25, 2015 | (CN) | 2015 1 0617370 |
| Oct. 10, 2015 | (CN) | 2015 1 0651572 |
| Oct. 20, 2015 | (CN) | 2015 1 0680883 |
| Oct. 29, 2015 | (CN) | 2015 1 0724135 |
| Dec. 9, 2015 | (CN) | 2015 1 0903680 |
| Dec. 31, 2015 | (CN) | 2015 1 1025998 |
| Jan. 22, 2016 | (CN) | 2016 1 0043864 |
| Jan. 26, 2016 | (CN) | 2016 1 0050944 |
| Feb. 15, 2016 | (CN) | 2016 1 0085895 |
| Feb. 23, 2016 | (CN) | 2016 1 0098424 |
| Mar. 3, 2016 | (CN) | 2016 1 0120993 |
| Mar. 4, 2016 | (CN) | 2016 1 0123852 |
| Mar. 4, 2016 | (CN) | 2016 2 165131 U |
| Mar. 25, 2016 | (CN) | 2016 1 0177706 |
| Apr. 22, 2016 | (CN) | 2016 1 0256190 |
| Apr. 29, 2016 | (CN) | 2016 1 0281812 |
| May 18, 2016 | (CN) | 2016 1 0327806 |
| May 27, 2016 | (CN) | 2016 1 0363805 |
| Jun. 14, 2016 | (CN) | 2016 1 0420790 |
| Jul. 11, 2016 | (CN) | 2016 1 0554799 |

(51) Int. Cl.

| | |
|---|---|
| H05B 33/08 | (2006.01) |
| F21K 9/278 | (2016.01) |
| F21K 9/272 | (2016.01) |
| F21V 15/015 | (2006.01) |
| F21V 23/06 | (2006.01) |
| F21V 19/02 | (2006.01) |
| F21V 29/70 | (2015.01) |
| F21V 23/00 | (2015.01) |
| F21Y 115/10 | (2016.01) |

(52) U.S. Cl.

CPC .......... *F21V 15/015* (2013.01); *F21V 19/02* (2013.01); *F21V 23/003* (2013.01); *F21V 23/06* (2013.01); *F21V 29/70* (2015.01); *H05B 33/083* (2013.01); *H05B 33/0815* (2013.01); *F21Y 2115/10* (2016.08)

(56) References Cited

U.S. PATENT DOCUMENTS

| | | |
|---|---|---|
| 8,525,427 B2 | 9/2013 | Samoilenko et al. |
| 8,648,542 B2 | 2/2014 | Kim et al. |
| 8,749,167 B2 | 6/2014 | Hsia et al. |
| 8,796,943 B2 | 8/2014 | Miyamichi |
| 9,210,744 B2 | 12/2015 | Carmen et al. |
| D761,216 S | 7/2016 | Jiang |
| 9,447,929 B2 | 9/2016 | Jiang |
| D768,891 S | 10/2016 | Jiang et al. |
| 9,521,718 B2 | 12/2016 | Xiong et al. |
| 2002/0176262 A1 | 11/2002 | Tripathi |
| 2003/0102819 A1 | 6/2003 | Min |
| 2007/0127242 A1 | 6/2007 | Allen et al. |
| 2010/0096976 A1 | 4/2010 | Park |
| 2010/0102729 A1 | 4/2010 | Katzir |
| 2010/0181925 A1* | 7/2010 | Ivey ............ H05B 33/0815 315/224 |
| 2010/0220469 A1 | 9/2010 | Ivey et al. |
| 2011/0057572 A1 | 3/2011 | Kit et al. |
| 2011/0121756 A1 | 5/2011 | Thomas et al. |
| 2011/0148313 A1 | 6/2011 | Ramaker |
| 2011/0149563 A1 | 6/2011 | Hsia et al. |
| 2011/0176297 A1 | 7/2011 | Hsia et al. |
| 2011/0181190 A1 | 7/2011 | Lin et al. |
| 2011/0260614 A1 | 10/2011 | Hartikka et al. |
| 2012/0181952 A1 | 7/2012 | Rooer |
| 2012/0299501 A1 | 11/2012 | Kost et al. |
| 2012/0300445 A1 | 11/2012 | Chu et al. |
| 2012/0313540 A1 | 12/2012 | Lin |
| 2013/0320869 A1* | 12/2013 | Jans ............ H05B 33/0803 315/186 |
| 2014/0035463 A1 | 2/2014 | Saburo |
| 2014/0055029 A1 | 2/2014 | Jans |
| 2014/0239827 A1 | 8/2014 | Park |
| 2014/0265900 A1 | 9/2014 | Sadwick et al. |
| 2015/0077001 A1 | 3/2015 | Takahashi |
| 2015/0173138 A1 | 6/2015 | Roberts |
| 2015/0176770 A1 | 6/2015 | Wilcox et al. |
| 2015/0181661 A1* | 6/2015 | Hsia ............ F21V 25/04 315/160 |
| 2015/0351171 A1 | 12/2015 | Tao et al. |
| 2016/0081147 A1 | 3/2016 | Guang |
| 2016/0091147 A1 | 3/2016 | Jiang et al. |
| 2016/0091156 A1 | 3/2016 | Li et al. |
| 2016/0091179 A1 | 3/2016 | Jiang et al. |
| 2016/0102813 A1 | 4/2016 | Ye et al. |
| 2016/0178135 A1 | 6/2016 | Xu et al. |
| 2016/0178137 A1 | 6/2016 | Jiang |
| 2016/0178138 A1 | 6/2016 | Jiang |
| 2016/0198535 A1 | 7/2016 | Ye et al. |
| 2016/0212809 A1 | 7/2016 | Xiong et al. |
| 2016/0215936 A1 | 7/2016 | Jiang |
| 2016/0215937 A1 | 7/2016 | Jiang |
| 2016/0219658 A1 | 7/2016 | Xiong et al. |
| 2016/0219666 A1 | 7/2016 | Xiong et al. |
| 2016/0219672 A1 | 7/2016 | Liu |
| 2016/0223180 A1 | 8/2016 | Jiang |
| 2016/0223182 A1 | 8/2016 | Jiang |
| 2016/0229621 A1 | 8/2016 | Jiang et al. |
| 2016/0255694 A1 | 9/2016 | Jiang et al. |
| 2016/0255699 A1 | 9/2016 | Ye et al. |
| 2016/0270163 A1 | 9/2016 | Hu et al. |
| 2016/0270164 A1 | 9/2016 | Xiong et al. |
| 2016/0270165 A1 | 9/2016 | Xiong et al. |
| 2016/0270166 A1 | 9/2016 | Xiong et al. |

(56) References Cited

U.S. PATENT DOCUMENTS

| | | |
|---|---|---|
| 2016/0270173 A1 | 9/2016 | Xiong |
| 2016/0270184 A1 | 9/2016 | Xiong et al. |
| 2016/0290566 A1 | 10/2016 | Jiang et al. |
| 2016/0290567 A1 | 10/2016 | Jiang et al. |
| 2016/0290568 A1 | 10/2016 | Jiang et al. |
| 2016/0290569 A1 | 10/2016 | Jiang et al. |
| 2016/0290570 A1 | 10/2016 | Jiang et al. |
| 2016/0290598 A1 | 10/2016 | Jiang |
| 2016/0290609 A1 | 10/2016 | Jiang et al. |
| 2016/0295706 A1 | 10/2016 | Jiang |
| 2016/0309550 A1 | 10/2016 | Xiong et al. |
| 2016/0323948 A1 | 11/2016 | Xiong et al. |
| 2016/0341414 A1 | 11/2016 | Jiang |
| 2016/0356472 A1 | 12/2016 | Jiang et al. |
| 2016/0363267 A1 | 12/2016 | Jiang et al. |
| 2016/0381746 A1 | 12/2016 | Ye et al. |
| 2016/0381760 A1 | 12/2016 | Xiong et al. |
| 2017/0001793 A1 | 1/2017 | Jiang et al. |

FOREIGN PATENT DOCUMENTS

| | | |
|---|---|---|
| CN | 102155642 | 8/2011 |
| CN | 102355780 | 2/2012 |
| CN | 102932997 | 2/2013 |
| CN | 203240337 U | 10/2013 |
| CN | 203384716 U | 1/2014 |
| CN | 203413396 U | 1/2014 |
| CN | 203453866 U | 2/2014 |
| CN | 203585876 U | 5/2014 |
| CN | 104735873 | 6/2015 |
| EP | 2914065 | 9/2015 |
| GB | 2533683 | 6/2016 |
| WO | WO2012139691 | 10/2012 |

\* cited by examiner

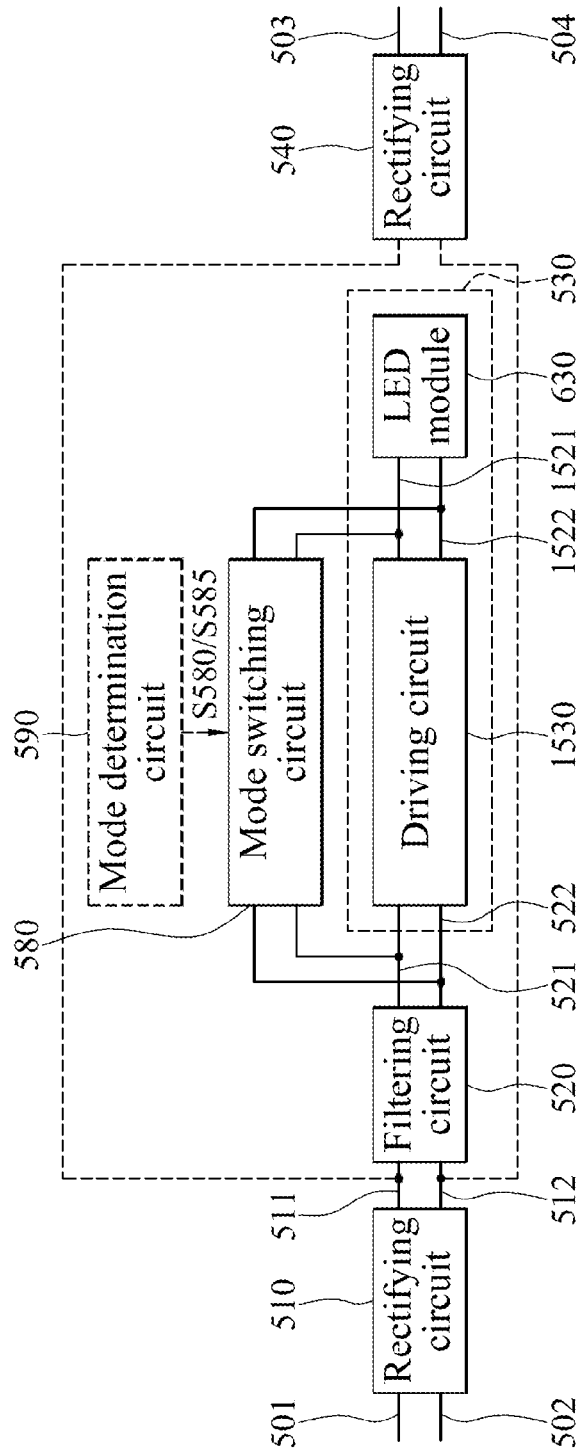
Fig.21A
Fig.21B
Fig.21C

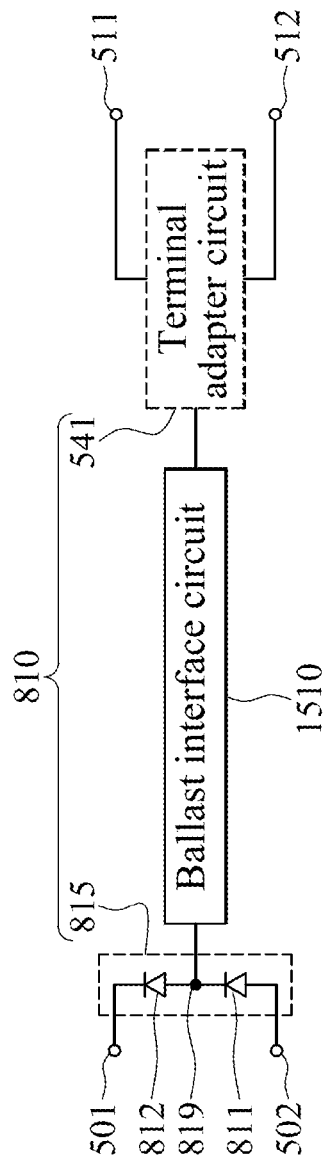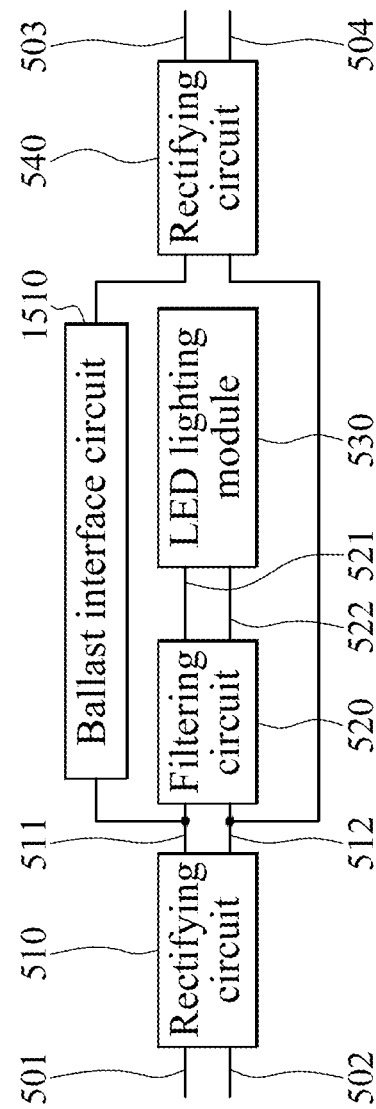
Fig.22C
Fig.22D

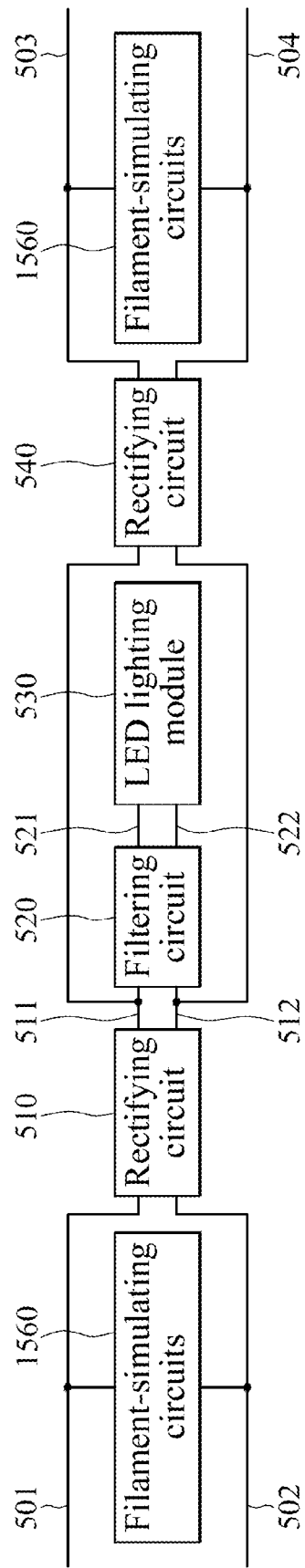
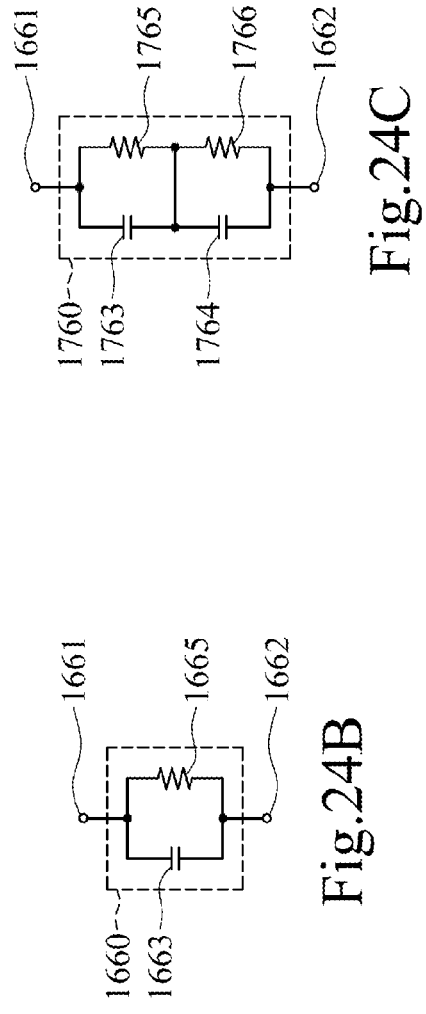
Fig.24A
Fig.24B
Fig.24C

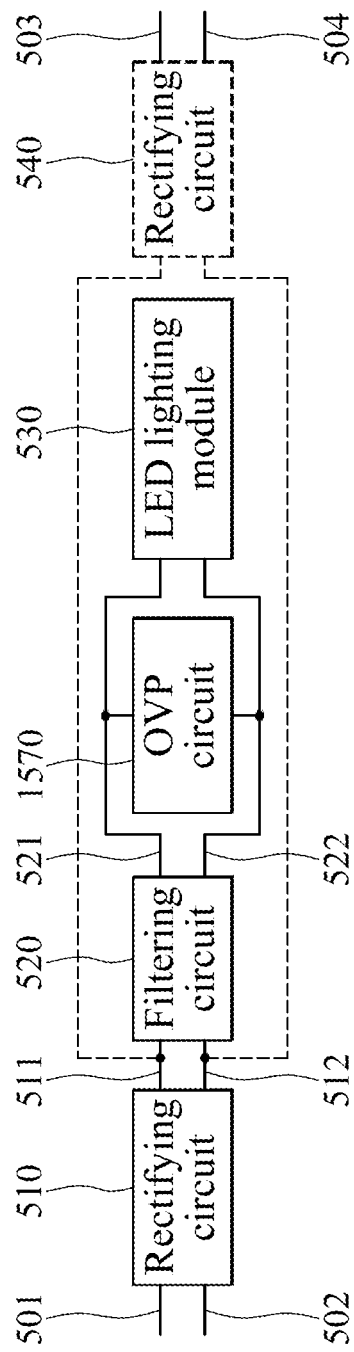
Fig.25A
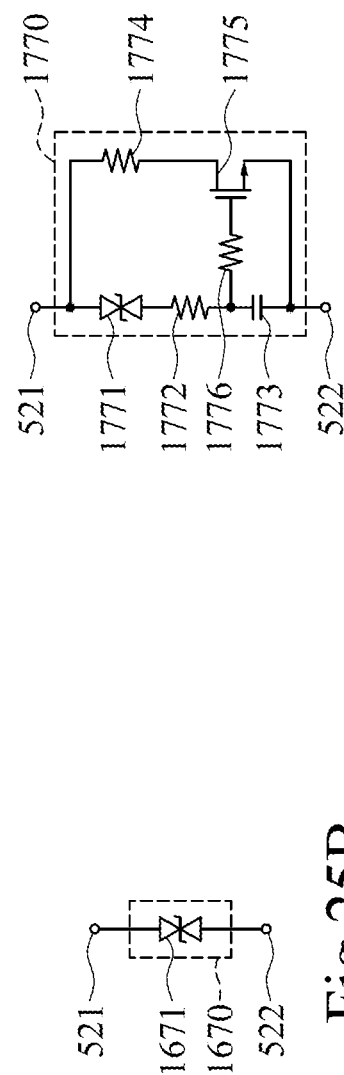
Fig.25C
Fig.25B

LED TUBE LAMP WITH TWO OPERATING MODES COMPATIBLE WITH ELECTRICAL BALLASTS

This application is a continuation-in-part application of U.S. patent application Ser. No. 14/865,387, filed Sep. 25, 2015, and Ser. No. 15/150,458, filed May 10, 2016, the contents of both applications are incorporated herein by reference in their entirety, and this application claims priority to Chinese Patent Application Nos. 201510724135.7, filed Oct. 29, 2015, and 201610043864.0, filed Jan. 22, 2016, each of which is incorporated herein by reference in its entirety.

If any terms in this application conflict with terms used in any application(s) from which this application claims priority, or terms incorporated by reference into this application or the application(s) from which this application claims priority, a construction based on the terms as used or defined in this application should be applied.

BACKGROUND

Technical Field

The present disclosure relates to illumination devices, and more particularly relates to an LED tube lamp.

Related Art

LED (light emitting diode) lighting technology is rapidly developing to replace traditional incandescent and fluorescent lightings. LED tube lamps are mercury-free in comparison with fluorescent tube lamps that need to be filled with inert gas and mercury. Thus, it is not surprising that LED tube lamps are becoming a highly desired illumination option among different available lighting systems used in homes and workplaces, which used to be dominated by traditional lighting options such as compact fluorescent light bulbs (CFLs) and fluorescent tube lamps. Benefits of LED tube lamps include improved durability and longevity and far less energy consumption; therefore, when taking into account all factors, they would typically be considered as a cost effective lighting option.

Typical LED tube lamps have a lamp tube, a circuit board disposed inside the lamp tube with light sources being mounted on the circuit board, and end caps accompanying a power supply provided at two ends of the lamp tube with the electricity from the power supply transmitted to the light sources through the circuit board. However, existing LED tube lamps have certain drawbacks.

First, the typical circuit board is rigid and allows the entire lamp tube to maintain a straight tube configuration when the lamp tube is partially ruptured or broken, and this gives the user a false impression that the LED tube lamp remains usable and is likely to cause the user to be electrically shocked upon handling or installation of the LED tube lamp.

Second, the rigid circuit board is typically electrically connected with the end caps by way of wire bonding, in which the wires may be easily damaged and even broken due to any move during manufacturing, transportation, and usage of the LED tube lamp and therefore may disable the LED tube lamp.

Further, circuit design of current LED tube lamps mostly doesn't provide suitable solutions for complying with relevant certification standards and for better compatibility with the driving structure using an electronic ballast originally for a fluorescent lamp. For example, since there are usually no electronic components in a fluorescent lamp, it's fairly easy for a fluorescent lamp to be certified under EMI (electromagnetic interference) standards and safety standards for lighting equipment as provided by Underwriters Laboratories (UL). However, there are a considerable number of electronic components in an LED tube lamp, and therefore consideration of the impacts caused by the layout (structure) of the electronic components is important, resulting in difficulties in complying with such standards.

Common main types of electronic ballast include instant-start ballast and programmed-start ballast. Electronic ballast typically includes a resonant circuit and is designed to match the loading characteristics of a fluorescent lamp in driving the fluorescent lamp. For example, for properly starting a fluorescent lamp, the electronic ballast provides driving methods respectively corresponding to the fluorescent lamp working as a capacitive device before emitting light, and working as a resistive device upon emitting light. But an LED is a nonlinear component with significantly different characteristics from a fluorescent lamp. Therefore, using an LED tube lamp with an electronic ballast impacts the resonant circuit design of the electronic ballast, which may cause a compatibility problem. Generally, a programmed-start ballast will detect the presence of a filament in a fluorescent lamp, but traditional LED driving circuits cannot support the detection and may cause a failure of the filament detection and thus failure of the starting of the LED tube lamp. Further, electronic ballast is in effect a current source, and when it acts as a power supply of a DC-to-DC converter circuit in an LED tube lamp, problems of overvoltage and overcurrent or undervoltage and undercurrent are likely to occur, resulting in damaging of electronic components in the LED tube lamp or unstable provision of lighting by the LED tube lamp.

Further, the driving of an LED uses a DC driving signal, but the driving signal for a fluorescent lamp is a low-frequency, low-voltage AC signal as provided by an AC powerline or an inductive ballast, a high-frequency, high-voltage AC signal provided by an electronic ballast, or even a DC signal provided by a battery for emergency lighting applications. Since the voltages and frequency spectrums of these types of signals differ significantly, simply performing a rectification to produce the required DC driving signal in an LED tube lamp is typically not competent at achieving the LED tube lamp's compatibility with traditional driving systems of a fluorescent lamp.

In addition, conventional fluorescent lamps and LED lamps are not equipped with advanced abilities both to regulate their electrical currents for better qualities or functions and to be compatible with various types of ballasts avoiding typical needs to find a suitable lamp when the fluorescent or LED lamp is not compatible with a present type of ballast.

Accordingly, the present disclosure and its embodiments are herein provided.

SUMMARY

It's specially noted that the present disclosure may actually include one or more inventions claimed currently or not yet claimed, and for avoiding confusion due to unnecessarily distinguishing between those possible inventions at the stage of preparing the specification, the possible plurality of inventions herein may be collectively referred to as "the (present) invention" herein.

Various embodiments are summarized in this section, and are described with respect to the "present invention," which terminology is used to describe certain presently disclosed embodiments, whether claimed or not, and is not necessarily an exhaustive description of all possible embodiments, but rather is merely a summary of certain embodiments. Certain of the embodiments described below as various aspects of the "present invention" can be combined in different manners to form an LED tube lamp or a portion thereof. As such, the term "present invention" used in this specification is not intended to limit the claims in any way or to indicate that any particular embodiment or component is required to be included in a particular claim, and is intended to be synonymous with the "present disclosure."

An aspect of the disclosure is a light emitting diode tube lamp configured to receive an external driving signal, the LED tube lamp including an LED module for emitting light, the LED module comprising an LED unit comprising an LED; a rectifying circuit for rectifying the external driving signal to produce a rectified signal; and a mode determination circuit configured to detect a state of a property of the rectified signal, for selectively determining on performing a first mode or a second mode of lighting according to the state of the property of the rectified signal; wherein the mode determination circuit is configured such that when the LED tube lamp performs the first mode of lighting, the mode determination circuit allows continual current to flow through the LED unit until the external driving signal is disconnected from the LED tube lamp; and when the LED tube lamp performs the second mode of lighting, the mode determination circuit regulates the continuity of current to flow through the LED unit.

Another aspect of the disclosure is a light emitting diode tube lamp including a lamp tube; a first external connection terminal and a second external connection terminal coupled to the lamp tube and for receiving an external driving signal from an electrical ballast; a rectifying circuit for rectifying the external driving signal to produce a rectified signal; a ballast interface circuit configured to detect a state of a property of the rectified signal, for selectively determining on performing a first mode or a second mode of lighting according to the state of the property of the rectified signal; and an LED module for emitting light, the LED module comprising an LED unit comprising an LED; wherein the ballast interface circuit is configured such that when the LED tube lamp performs the first mode of lighting, the ballast interface circuit allows continual current to flow through the LED unit until the external driving signal is disconnected from the LED tube lamp; and when the LED tube lamp performs the second mode of lighting, the ballast interface circuit regulates the continuity of current to flow through the LED unit.

Another aspect of the disclosure is a ballast interface circuit, for transmitting power from the electrical ballast to the LED unit. The ballast interface circuit includes: a detecting circuit configured to detect a state of a property of the external driving signal; and a control circuit for selectively determining on performing a first mode or a second mode of lighting according to the state of the property of the external driving signal; wherein the control circuit is configured such that when the LED tube lamp performs the first mode of lighting, the control circuit allows continual current to flow through the LED unit until the external driving signal is disconnected from the LED tube lamp; and when the LED tube lamp performs the second mode of lighting, the control circuit regulates the continuity of current to flow through the LED unit.

In addition to using the ballast interface circuit or mode determination circuit to facilitate the LED tube lamp starting by the electrical ballast, other innovations of mechanical structures of the LED tube lamp disclosed herein, such as the LED tube lamp including improved structures of a flexible circuit board or a bendable circuit sheet, and soldering features of the bendable circuit sheet and a printed circuit board bearing the power supply module of the LED tube lamp, may also be used to improve the stability of power supplying by the ballast and to provide strengthened conductive path through, and connections between, the power supply module and the bendable circuit sheet.

BRIEF DESCRIPTION OF THE DRAWINGS

FIG. 21A is a block diagram of an LED lamp according to some embodiments;

FIG. 21B is a schematic diagram of a mode determination circuit in an LED lamp according to some embodiments;

FIG. 21C is a schematic diagram of a mode determination circuit in an LED lamp according to some embodiments;

FIG. 22C illustrates an arrangement with a ballast interface circuit in an LED lamp according to some embodiments;

FIG. 22D is a block diagram of an LED lamp according to some embodiments;

FIG. 24A is a block diagram of an LED tube lamp according to some embodiments;

FIG. 24B is a schematic diagram of a filament-simulating circuit according to some embodiments;

FIG. 24C is a schematic diagram of a filament-simulating circuit according to some embodiments;

FIG. 25A is a block diagram of an LED tube lamp according to some embodiments;

FIG. 25B is a schematic diagram of an OVP circuit according to an embodiment; and FIG. 25C is a schematic diagram of an overvoltage protection (OVP) circuit according to an embodiment.

DETAILED DESCRIPTION

Figure 1:
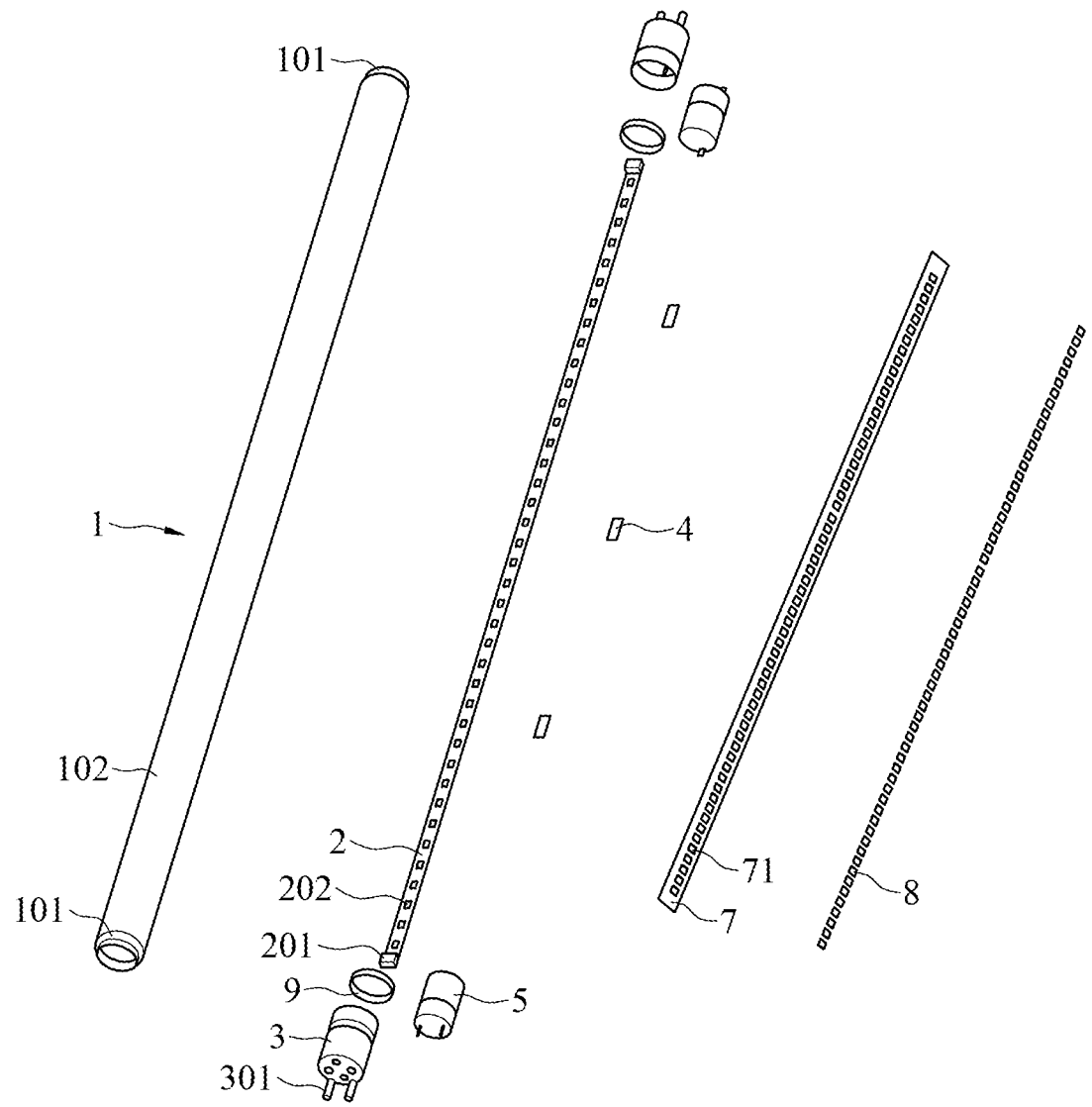
FIG. 1 is an exemplary exploded view schematically illustrating an exemplary LED tube lamp, according to certain embodiments.

The present disclosure provides a novel LED tube lamp, and also provides some features that can be used in LED lamps that are not LED tube lamps. The present disclosure will now be described in the following embodiments with reference to the drawings. The following descriptions of various implementations are presented herein for purpose of illustration and giving examples only. This invention is not intended to be exhaustive or to be limited to the precise form disclosed. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, the size and relative sizes of components may be exaggerated for clarity. Like numbers refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. As used herein, the term "and/or" includes any and all combinations of one or more of the associated listed items and may be abbreviated as "/".

It will be understood that, although the terms first, second, third etc. may be used herein to describe various elements, components, regions, layers, or steps, these elements, components, regions, layers, and/or steps should not be limited by these terms. Unless the context indicates otherwise, these terms are only used to distinguish one element, component, region, layer, or step from another element, component, region, or step, for example as a naming convention. Thus, a first element, component, region, layer, or step discussed below in one section of the specification could be termed a second element, component, region, layer, or step in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "connected" or "coupled" to or "on" another element, it can be directly connected or coupled to or on the other element or intervening elements may be present. In contrast, when an element is referred to as being "directly connected" or "directly coupled," or "immediately connected" or "immediately coupled" to another element, there are no intervening elements present. Other words used to describe the relationship between elements should be interpreted in a like fashion (e.g., "between" versus "directly between," "adjacent" versus "directly adjacent," etc.). However, the term "contact," as used herein refers to a direct connection (i.e., touching) unless the context indicates otherwise.

Embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures may have schematic properties, and shapes of regions shown in figures may exemplify specific shapes of regions of elements to which aspects of the invention are not limited.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

Terms such as "about" or "approximately" may reflect sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

As used herein, items described as being "electrically connected" are configured such that an electrical signal can be passed from one item to the other. Therefore, a passive electrically conductive component (e.g., a wire, pad, internal electrical line, etc.) physically connected to a passive electrically insulating component (e.g., a prepreg layer of a printed circuit board, an electrically insulating adhesive connecting two devices, an electrically insulating underfill or mold layer, etc.) is not electrically connected to that component. Moreover, items that are "directly electrically connected," to each other are electrically connected through one or more passive elements, such as, for example, wires, pads, internal electrical lines, resistors, etc. As such, directly electrically connected components do not include components electrically connected through active elements, such as transistors or diodes. Two immediately adjacent conductive components may be described as directly electrically connected and directly physically connected. Also in this disclosure, ballast-compatible circuit may also be referred to herein as a ballast interface circuit, as it serves as an interface between an electrical ballast and an LED lighting module (or LED module) of an LED lamp.

Figure 2:
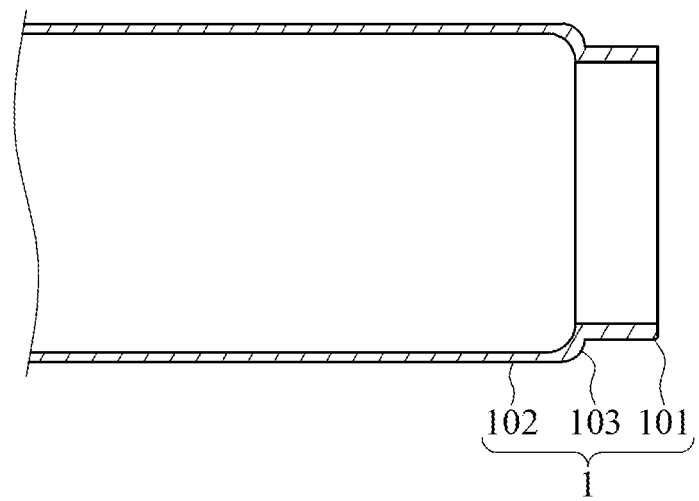
FIG. 2 is a plane cross-sectional view schematically illustrating an example of an end structure of a lamp tube of an LED tube lamp according to certain embodiments.

Referring to FIG. 1 and FIG. 2, a glass made lamp tube of an LED tube lamp according to one embodiment of the present invention has structure-strengthened end regions described as follows. The glass made lamp tube 1 includes a main body region 102, two rear end regions 101 (or just end regions 101) respectively formed at two ends of the main body region 102, and end caps 3 that respectively sleeve the rear end regions 101. The outer diameter of at least one of the rear end regions 101 is less than the outer diameter of the main body region 102. In the embodiment of FIGS. 1 and 2, the outer diameters of the two rear end regions 101 are less than the outer diameter of the main body region 102. In addition, the surface of the rear end region 101 may be parallel to the surface of the main body region 102 in a cross-sectional view. Specifically, in some embodiments, the glass made lamp tube 1 is strengthened at both ends, such that the rear end regions 101 are formed to be strengthened structures. In certain embodiments, the rear end regions 101 with strengthened structure are respectively sleeved with the end caps 3, and the outer diameters of the end caps 3 and the main body region 102 have little or no differences. For example, the end caps 3 may have the same or substantially the same outer diameters as that of the main body region 102 such that there is no gap between the end caps 3 and the main body region 102. In this way, a supporting seat in a packing box for transportation of the LED tube lamp contacts not only the end caps 3 but also the lamp tube 1 and makes uniform the loadings on the entire LED tube lamp to avoid situations where only the end caps 3 are forced, therefore preventing breakage at the connecting portion between the end caps 3 and the rear end regions 101 due to stress concentration. The quality and the appearance of the product are therefore improved.

In one embodiment, the end caps 3 and the main body region 102 have substantially the same outer diameters. These diameters may have a tolerance for example within +/−0.2 millimeter (mm), or in some cases up to +/−1.0 millimeter (mm). Depending on the thickness of the end caps 3, the difference between an outer diameter of the rear end regions 101 and an outer diameter of the main body region 102 can be about 1 mm to about 10 mm for typical product applications. In some embodiments, the difference between the outer diameter of the rear end regions 101 and the outer diameter of the main body region 102 can be about 2 mm to about 7 mm.

Referring to FIG. 2, the lamp tube 1 is further formed with a transition region 103 between the main body region 102 and the rear end regions 101. In one embodiment, the transition region 103 is a curved region formed to have cambers at two ends to smoothly connect the main body region 102 and the rear end regions 101, respectively. For example, the two ends of the transition region 103 may be arc-shaped in a cross-section view along the axial direction of the lamp tube 1. Furthermore, one of the cambers connects the main body region 102 while the other one of the cambers connects the rear end region 101. In some embodiments, the arc angle of the cambers is greater than 90 degrees while the outer surface of the rear end region 101 is a continuous surface in parallel with the outer surface of the main body region 102 when viewed from the cross-section along the axial direction of the lamp tube. In other embodiments, the transition region 103 can be without curve or arc in shape. In certain embodiments, the length of the transition region 103 along the axial direction of the lamp tube 1 is between about 1 mm to about 4 mm. Upon experimentation, it was found that when the length of the transition region 103 along the axial direction of the lamp tube 1 is less than 1 mm, the strength of the transition region would be insufficient; when the length of the transition region 103 along the axial direction of the lamp tube 1 is more than 4 mm, the main body region 102 would be shorter and the desired illumination surface would be reduced, and the end caps 3 would be longer and the more materials for the end caps 3 would be needed.

Figure 3:
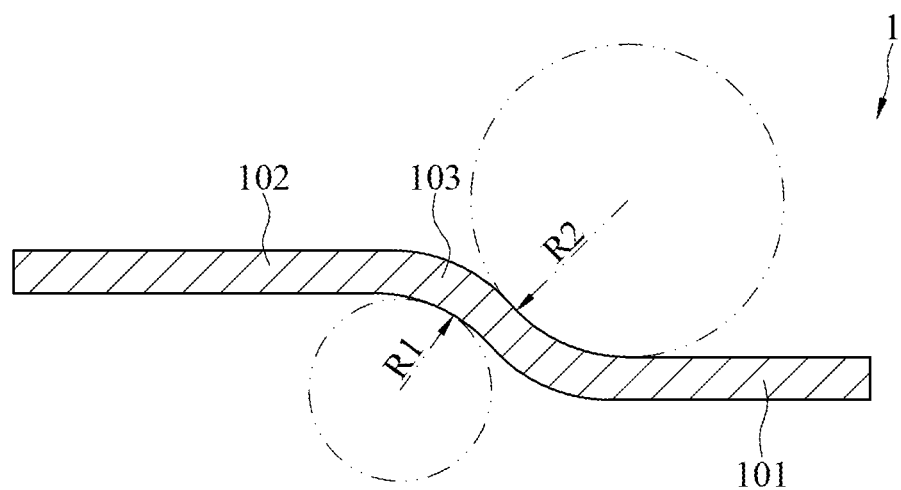
FIG. 3 is an exemplary plane cross-sectional view schematically illustrating an exemplary local structure of the transition region of the end of the lamp tube of FIG. 2.

As can be seen in FIG. 2, and in the more detailed closer-up depiction in FIG. 3, in certain embodiments, in the transition region 102, the lamp tube 1 narrows, or tapers to have a smaller diameter when moving along the length of the lamp tube 1 from the main region 102 to the end region 101. The tapering/narrowing may occur in a continuous, smooth manner (e.g., to be a smooth curve without any linear angles). By avoiding angles, in particular any acute angles, the lamp tube 1 is less likely to break or crack under pressure.

Referring to FIG. 3, in certain embodiments, the lamp tube 1 is made of glass, and has a rear end region 101, a main body region 102, and a transition region 103. The transition region 103 has two arc-shaped cambers at both ends to from an S shape; one camber positioned near the main body region 102 is convex outwardly, while the other camber positioned near the rear end region 101 is concaved inwardly. Generally speaking, the radius of curvature, R1, of the camber/arc between the transition region 103 and the main body region 102 is smaller than the radius of curvature, R2, of the camber/arc between the transition region 103 and the rear end region 101. The ratio R1:R2 may range, for example, from about 1:1.5 to about 1:10, and in some embodiments is more effective from about 1:2.5 to about 1:5, and in some embodiments is even more effective from about 1:3 to about 1:4. In this way, the camber/arc of the transition region 103 positioned near the rear end region 101 is in compression at outer surfaces and in tension at inner surfaces, and the camber/arc of the transition region 103 positioned near the main body region 102 is in tension at outer surfaces and in compression at inner surfaces. Therefore, the goal of strengthening the transition region 103 of the lamp tube 1 is achieved. As can be seen in FIG. 3, the transition region 103 is formed by two curves at both ends, wherein one curve is toward inside of the light tube 1 and the other curve is toward outside of the light tube 1. For example, one curve closer to the main body region 102 is convex from the perspective of an inside of the lamp tube 1 and one curve closer to the end region 101 is concave from the perspective of an inside of the lamp tube 1. The transition region of the lamp tube 1 in one embodiment includes only smooth curves, and does not include any angled surface portions.

Taking the standard specification for a T8 lamp as an example, the outer diameter of the rear end region 101 is configured between 20.9 mm to 23 mm. An outer diameter of the rear end region 101 being less than 20.9 mm would be too small to fittingly insert the power supply into the lamp tube 1. The outer diameter of the main body region 102 is in some embodiments configured to be between about 25 mm to about 28 mm. An outer diameter of the main body region 102 being less than 25 mm would be inconvenient to strengthen the ends of the main body region 102 according to known current manufacturing methods, while an outer diameter of the main body region 102 being greater than 28 mm is not compliant to the current industrial standard.

Figure 4:
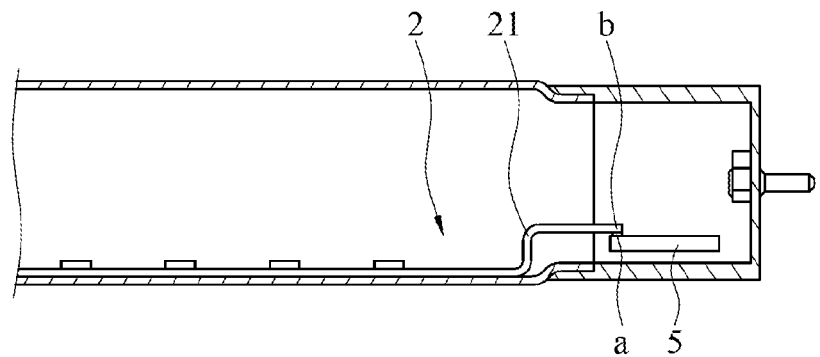
FIG. 4 is a sectional view schematically illustrating an LED light strip that includes a bendable circuit sheet with ends thereof passing across a transition region of a lamp tube of an LED tube lamp to be soldering bonded to the output terminals of the power supply according to one embodiment.
Figure 9:
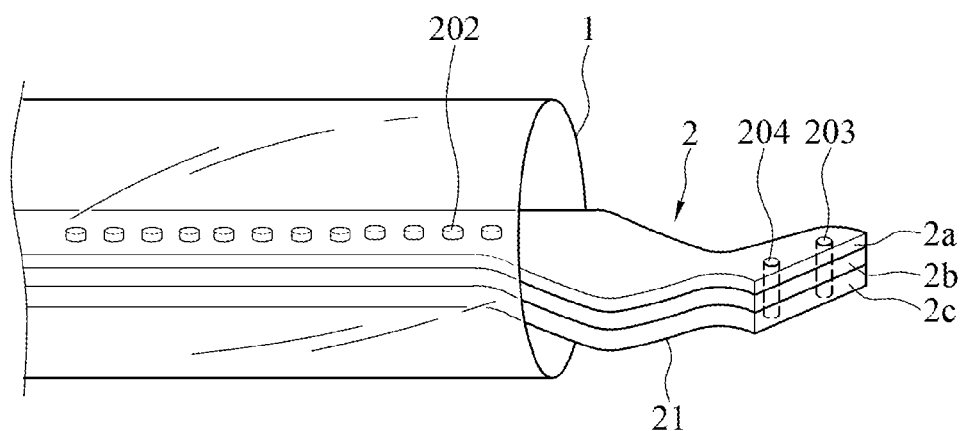
FIG. 9 is a perspective view schematically illustrating a bendable circuit sheet of an LED light strip formed with two conductive wiring layers according to another embodiment.
Figure 10:
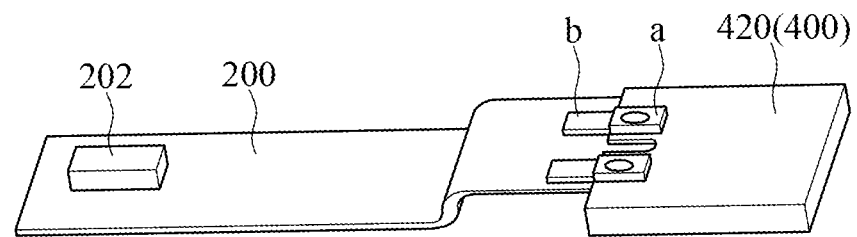
FIG. 10 is a perspective view of an exemplary bendable circuit sheet and a printed circuit board of a power supply soldered to each other, according to certain embodiments.

Referring to FIG. 4 and FIG. 9, an LED tube lamp in accordance with an embodiment includes a lamp tube 1, which may be formed of glass and may be referred to herein as a glass lamp tube 1; two end caps respectively disposed at two ends of the glass lamp tube 1; a power supply 5; and an LED light strip 2 disposed inside the glass lamp tube 1. For example, the end cap and the lamp tube are connected to each other in an adhesive manner such that there is no gap between the end cap and the lamp tube or there are extremely small gaps between the end cap and the lamp tube. The glass lamp tube 1 extending in a first direction along a length of the glass lamp tube 1 includes a main body region, a rear end region, and a transition region connecting the main body region and the rear end region, wherein the main body region and the rear end region are substantially parallel. As shown in the embodiment of FIG. 4, the bendable circuit sheet 2 (as an embodiment of the light strip 2) passes through a transition region to be soldered or traditionally wire-bonded with the power supply 5, and then the end cap of the LED tube lamp is adhered to the transition region, respectively to form a complete LED tube lamp. As discussed herein, a transition region of the lamp tube refers to regions outside a central portion of the lamp tube and inside terminal ends of the lamp tube. For example, a central portion of the lamp tube may have a constant diameter, and each transition region between the central portion and a terminal end of the lamp tube may have a changing diameter (e.g., at least part of the transition region may become more narrow moving in a direction from the central portion to the terminal end of the lamp tube). End caps including the power supply may be disposed at the terminal ends of the lamp tube, and may cover part of the transition region.

Figure 5:
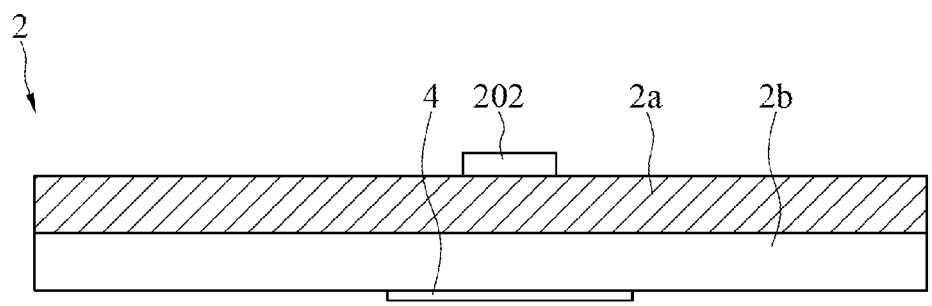
FIG. 5 is a cross-sectional view schematically illustrating a bi-layered structure of a bendable circuit sheet of an LED light strip of an LED tube lamp according to an embodiment.

With reference to FIG. 5, in this embodiment, the LED light strip 2 is fixed by the adhesive sheet 4 to an inner circumferential surface of the lamp tube 1, so as to increase the light illumination angle of the LED tube lamp and broaden the viewing angle to be greater than 330 degrees.

In one embodiment, the inner peripheral surface or the outer circumferential surface of the glass made lamp tube 1 is coated with an adhesive film such that the broken pieces are adhered to the adhesive film when the glass made lamp tube is broken. Therefore, the lamp tube 1 would not be penetrated to form a through hole connecting the inside and outside of the lamp tube 1 and this helps prevent a user from touching any charged object inside the lamp tube 1 to avoid electrical shock. In addition, in some embodiments, the adhesive film is able to diffuse light and allows the light to transmit such that the light uniformity and the light transmittance of the entire LED tube lamp increases. The adhesive film can be used in combination with the adhesive sheet 4, an insulation adhesive sheet, and an optical adhesive sheet to constitute various embodiments. As the LED light strip 2 is configured to be a bendable circuit sheet, no coated adhesive film is thereby required. In addition, in some embodiments, the vacuum degree of the lamp tube 1 may be below between about 0.001 Pa and about 1 Pa, which can reduce the problem(s) due to internal damp in the lamp tube 1.

In some embodiments, the light strip 2 may be an elongated aluminum plate, FR 4 board, or a bendable circuit sheet. When the lamp tube 1 is made of glass, adopting a rigid aluminum plate or FR4 board would make a broken lamp tube, e.g., broken into two parts, remain a straight shape so that a user may be under a false impression that the LED tube lamp is still usable and fully functional, and it is easy for him to incur electric shock upon handling or installation of the LED tube lamp. Because of added flexibility and bendability of the flexible substrate for the LED light strip 2, the problem faced by the aluminum plate, FR4 board, or conventional 3-layered flexible board having inadequate flexibility and bendability, are thereby addressed. In certain embodiments, a bendable circuit sheet is adopted as the LED light strip 2 because such an LED light strip 2 would not allow a ruptured or broken lamp tube to maintain a straight shape and therefore would instantly inform the user of the disability of the LED tube lamp to avoid possibly incurred electrical shock. The following are further descriptions of a bendable circuit sheet that may be used as the LED light strip 2.

Referring to FIG. 5, in one embodiment, the LED light strip 2 includes a bendable circuit sheet having a conductive wiring layer 2a and a dielectric layer 2b that are arranged in a stacked manner, wherein the wiring layer 2a and the dielectric layer 2b have same areas. The LED light source 202 is disposed on one surface of the wiring layer 2a, the dielectric layer 2b is disposed on the other surface of the wiring layer 2a that is away from the LED light sources 202 (e.g., a second, opposite surface from the first surface on which the LED light source 202 is disposed). The wiring layer 2a is electrically connected to the power supply 5 to carry direct current (DC) signals. Meanwhile, the surface of the dielectric layer 2b away from the wiring layer 2a (e.g., a second surface of the dielectric layer 2b opposite a first surface facing the wiring layer 2a) is fixed to the inner circumferential surface of the lamp tube 1 by means of the adhesive sheet 4. The portion of the dielectric layer 2b fixed to the inner circumferential surface of the lamp tube 1 may substantially conform to the shape of the inner circumferential surface of the lamp tube 1. The wiring layer 2a can be a metal layer or a power supply layer including wires such as copper wires.

In another embodiment, the outer surface of the wiring layer 2a or the dielectric layer 2b may be covered with a circuit protective layer made of an ink with function of resisting soldering and increasing reflectivity. Alternatively, the dielectric layer can be omitted and the wiring layer can be directly bonded to the inner circumferential surface of the lamp tube, and the outer surface of the wiring layer 2a may be coated with the circuit protective layer. Whether the wiring layer 2a has a one-layered, or two-layered structure, the circuit protective layer can be adopted. In some embodiments, the circuit protective layer is disposed only on one side/surface of the LED light strip 2, such as the surface having the LED light source 202. In some embodiments, the bendable circuit sheet is a one-layered structure made of just one wiring layer 2a, or a two-layered structure made of one wiring layer 2a and one dielectric layer 2b, and thus is more bendable or flexible to curl when compared with the conventional three-layered flexible substrate (one dielectric layer sandwiched with two wiring layers). As a result, the bendable circuit sheet of the LED light strip 2 can be installed in a lamp tube with a customized shape or non-tubular shape, and fitly mounted to the inner surface of the lamp tube. The bendable circuit sheet closely mounted to the inner surface of the lamp tube is preferable in some cases. In addition, using fewer layers of the bendable circuit sheet improves the heat dissipation and lowers the material cost.

Nevertheless, the bendable circuit sheet is not limited to being one-layered or two-layered; in other embodiments, the bendable circuit sheet may include multiple layers of the wiring layers 2a and multiple layers of the dielectric layers 2b, in which the dielectric layers 2b and the wiring layers 2a are sequentially stacked in a staggered manner, respectively. These stacked layers may be between the outermost wiring layer 2a (with respect to the inner circumferential surface of the lamp tube), which has the LED light source 202 disposed thereon, and the inner circumferential surface of the lamp tube, and may be electrically connected to the power supply 5. Moreover, in some embodiments, the length of the bendable circuit sheet is greater than the length of the lamp tube (not including the length of the two end caps respectively connected to two ends of the lamp tube), or at least greater than a central portion of the lamp tube between two transition regions (e.g., where the circumference of the lamp tube narrows) on either end. In one embodiment, the longitudinally projected length of the bendable circuit sheet as the LED light strip 2 is larger than the length of the lamp tube.

Figure 6:
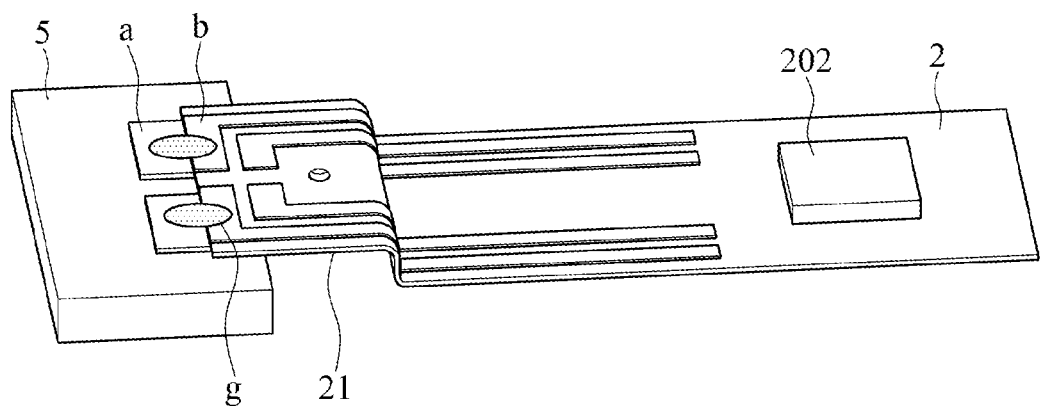
FIG. 6 is a perspective view schematically illustrating the soldering pad of a bendable circuit sheet of an LED light strip for soldering connection with a printed circuit board of a power supply of an LED tube lamp according to one embodiment.

Referring to FIG. 4, FIG. 6, and FIG. 9, in some embodiments, the LED light strip 2 is disposed inside the glass lamp tube 1 with a plurality of LED light sources 202 mounted on the LED light strip 2. The LED light strip 2 includes a bendable circuit sheet electrically connecting the LED light sources 202 with the power supply 5. The power supply 5 or power supply module may include various elements for providing power to the LED light strip 2. For example, the elements may include power converters or other circuit elements for providing power to the LED light strip 2. For example, the power supply may include a circuit that converts or generates power based on a received voltage, in order to supply power to operate an LED module and the LED light sources 202 of the LED tube lamp. A power supply, as described in connection with power supply 5, may be otherwise referred to as a power conversion module or circuit or a power module. A power conversion module or circuit, or power module, may supply or provide power from external signal(s), such as from an AC power line or from a ballast, to an LED module and the LED light sources 202.

In some embodiments, the length of the bendable circuit sheet is larger than the length of the glass lamp tube 1, and the bendable circuit sheet has a first end and a second end opposite to each other along the first direction, and at least one of the first and second ends of the bendable circuit sheet is bent away from the glass lamp tube 1 to form a freely extending end portion 21 along a longitudinal direction of the glass lamp tube 1. The freely extendable end portion 21 is an integral portion of the bendable circuit sheet 2. In some embodiments, if two power supplies 5 are adopted, then the other of the first and second ends might also be bent away from the glass lamp tube 1 to form another freely extending end portion 21 along the longitudinal direction of the glass lamp tube 1. The freely extending end portion 21 is electrically connected to the power supply 5. Specifically, in some embodiments, the power supply 5 has soldering pads "a"

which are capable of being soldered with the soldering pads "b" of the freely extending end portion 21 by soldering material "g".

Referring to FIG. 9, in one embodiment, the LED light strip 2 includes a bendable circuit sheet having in sequence a first wiring layer 2a, a dielectric layer 2b, and a second wiring layer 2c. The thickness of the second wiring layer 2c (e.g., in a direction in which the layers 2a through 2c are stacked) is greater than that of the first wiring layer 2a, and the length of the LED light strip 2 is greater than that of the lamp tube 1, or at least greater than a central portion of the lamp tube between two transition regions (e.g., where the circumference of the lamp tube narrows) on either end. The end region of the light strip 2 extending beyond the end portion of the lamp tube 1 without disposition of the light source 202 (e.g., an end portion without light sources 202 disposed thereon) may be formed with two separate through holes 203 and 204 to respectively electrically communicate the first wiring layer 2a and the second wiring layer 2c. The through holes 203 and 204 are not communicated to each other to avoid short.

In this way, the greater thickness of the second wiring layer 2c allows the second wiring layer 2c to support the first wiring layer 2a and the dielectric layer 2b, and meanwhile allow the LED light strip 2 to be mounted onto the inner circumferential surface without being liable to shift or deform, and thus the yield rate of product can be improved. In addition, the first wiring layer 2a and the second wiring layer 2c are in electrical communication such that the circuit layout of the first wiring later 2a can be extended downward to the second wiring layer 2c to reach the circuit layout of the entire LED light strip 2. Moreover, since the land for the circuit layout becomes two-layered, the area of each single layer and therefore the width of the LED light strip 2 can be reduced such that more LED light strips 2 can be put on a production line to increase productivity.

Furthermore, the first wiring layer 2a and the second wiring layer 2c of the end region of the LED light strip 2 that extends beyond the end portion of the lamp tube 1 without disposition of the light source 202 can be used to accomplish the circuit layout of a power supply module so that the power supply module can be directly disposed on the bendable circuit sheet of the LED light strip 2.

The power supply 5 according to some embodiments of the present invention can be formed on a single printed circuit board provided with a power supply module as depicted for example in in FIG. 4.

In still another embodiment, the connection between the power supply 5 and the LED light strip 2 may be accomplished via tin soldering, rivet bonding, or welding. One way to secure the LED light strip 2 is to provide the adhesive sheet 4 at one side thereof and adhere the LED light strip 2 to the inner surface of the lamp tube 1 via the adhesive sheet 4. Two ends of the LED light strip 2 can be either fixed to or detached from the inner surface of the lamp tube 1.

In case where two ends of the LED light strip 2 are fixed to the inner surface of the lamp tube and that the LED light strip 2 is connected to the power supply 5 via wire-bonding, any movement in subsequent transportation is likely to cause the bonded wires to break. Therefore, a useful option for the connection between the light strip 2 and the power supply 5 could be soldering. Specifically, referring to FIG. 4, the ends of the LED light strip 2 including the bendable circuit sheet are arranged to pass over the strengthened transition region and be directly solder bonded to an output terminal of the power supply 5. This may improve the product quality by avoiding using wires and/or wire bonding.

Referring to FIG. 6, an output terminal of the printed circuit board of the power supply 5 may have soldering pads "a" provided with an amount of solder (e.g., tin solder) with a thickness sufficient to later form a solder joint. Correspondingly, the ends of the LED light strip 2 may have soldering pads "b". The soldering pads "a" on the output terminal of the printed circuit board of the power supply 5 are soldered to the soldering pads "b" on the LED light strip 2 via the tin solder on the soldering pads "a". The soldering pads "a" and the soldering pads "b" may be face to face during soldering such that the connection between the LED light strip 2 and the printed circuit board of the power supply 5 is the most firm. However, this kind of soldering typically includes that a thermo-compression head presses on the rear surface of the LED light strip 2 and heats the tin solder, i.e. the LED light strip 2 intervenes between the thermo-compression head and the tin solder, and therefore may easily cause reliability problems.

Referring again to FIG. 6, two ends of the LED light strip 2 detached from the inner surface of the lamp tube 1 are formed as freely extending portions 21, while most of the LED light strip 2 is attached and secured to the inner surface of the lamp tube 1. One of the freely extending portions 21 has the soldering pads "b" as mentioned above. Upon assembling of the LED tube lamp, the freely extending end portions 21 along with the soldered connection of the printed circuit board of the power supply 5 and the LED light strip 2 would be coiled, curled up or deformed to be fittingly accommodated inside the lamp tube 1. When the bendable circuit sheet of the LED light strip 2 includes in sequence the first wiring layer 2a, the dielectric layer 2b, and the second wiring layer 2c as shown in FIG. 9, the freely extending end portions 21 can be used to accomplish the connection between the first wiring layer 2a and the second wiring layer 2c and arrange the circuit layout of the power supply 5.

In this embodiment, during the connection of the LED light strip 2 and the power supply 5, the soldering pads "b" and the soldering pads "a" and the LED light sources 202 are on surfaces facing toward the same direction and the soldering pads "b" on the LED light strip 2 are each formed with a through hole such that the soldering pads "b" and the soldering pads "a" communicate with each other via the through holes. When the freely extending end portions 21 are deformed due to contraction or curling up, the soldered connection of the printed circuit board of the power supply 5 and the LED light strip 2 exerts a lateral tension on the power supply 5. Furthermore, the soldered connection of the printed circuit board of the power supply 5 and the LED light strip 2 also exerts a downward tension on the power supply 5 when compared with the situation where the soldering pads "a" of the power supply 5 and the soldering pads "b" of the LED light strip 2 are face to face. This downward tension on the power supply 5 comes from the tin solders inside the through holes and forms a stronger and more secure electrical connection between the LED light strip 2 and the power supply 5. As described above, the freely extending portions 21 may be different from a fixed portion of the LED light strip 2 in that they fixed portion may conform to the shape of the inner surface of the lamp tube 1 and may be fixed thereto, while the freely extending portion 21 may have a shape that does not conform to the shape of the lamp tube 1. For example, there may be a space between an inner surface of the lamp tube 1 and the freely extending portion 21. As shown in FIG. 6, the freely extending portion 21 may be bent away from the lamp tube 1.

The through hole communicates the soldering pad "a" with the soldering pad "b" so that the solder (e.g., tin solder) on the soldering pads "a" passes through the through holes and finally reach the soldering pads "b". A smaller through hole would make it difficult for the tin solder to pass. The tin solder accumulates around the through holes upon exiting the through holes and condenses to form a solder ball "g" with a larger diameter than that of the through holes upon condensing. Such a solder ball "g" functions as a rivet to further increase the stability of the electrical connection between the soldering pads "a" on the power supply 5 and the soldering pads "b" on the LED light strip 2.

Figure 7:
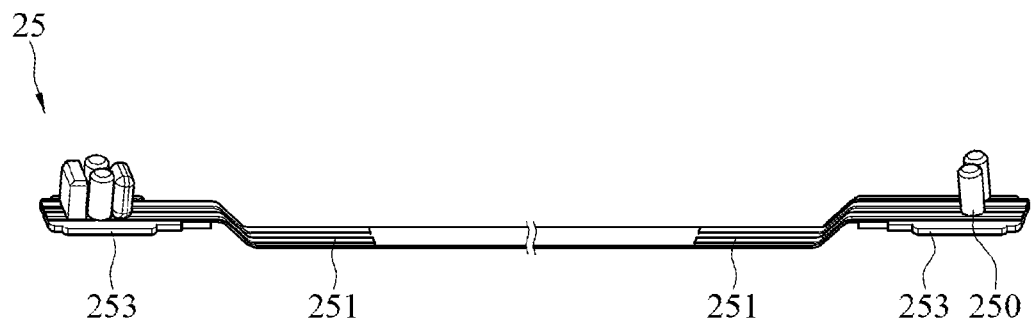
FIG. 7 is a perspective view schematically illustrating a circuit board assembly composed of a bendable circuit sheet of an LED light strip and a printed circuit board of a power supply according to another embodiment.
Figure 8:
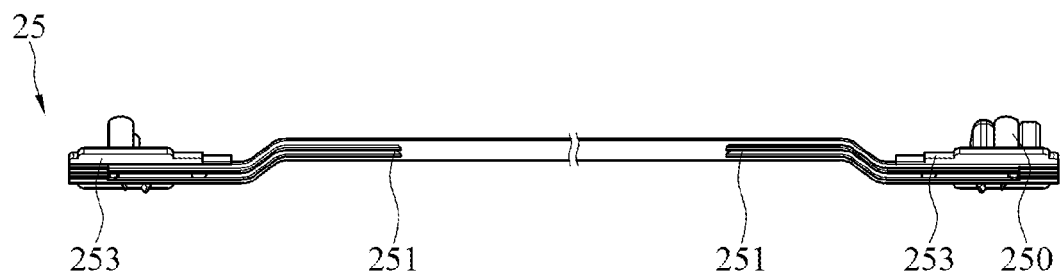
FIG. 8 is a perspective view schematically illustrating another exemplary arrangement of the circuit board assembly of FIG. 7.

Referring to FIGS. 7 and 8, in another embodiment, the LED light strip 2 and the power supply 5 may be connected by utilizing a circuit board assembly 25 instead of solder bonding. The circuit board assembly 25 has a long circuit sheet 251 and a short circuit board 253 that are adhered to each other with the short circuit board 253 being adjacent to the side edge of the long circuit sheet 251. The short circuit board 253 may be provided with power supply module 250 to form the power supply 5. The short circuit board 253 is stiffer or more rigid than the long circuit sheet 251 to be able to support the power supply module 250.

The long circuit sheet 251 may be the bendable circuit sheet of the LED light strip including a wiring layer 2a as shown in FIG. 5. The wiring layer 2a of the long circuit sheet 251 and the power supply module 250 may be electrically connected in various manners depending on the demand in practice. As shown in FIG. 7, the power supply module 250 and the long circuit sheet 251 having the wiring layer 2a on one surface are on the same side of the short circuit board 253 such that the power supply module 250 is directly connected to the long circuit sheet 251. As shown in FIG. 8, alternatively, the power supply module 250 and the long circuit sheet 251 including the wiring layer 2a on one surface are on opposite sides of the short circuit board 253 such that the power supply module 250 is directly connected to the short circuit board 253 and indirectly connected to the wiring layer 2a of the LED light strip 2 by way of the short circuit board 253.

As shown in FIG. 7, in one embodiment, the long circuit sheet 251 and the short circuit board 253 are adhered together first, and the power supply module 250 is subsequently mounted on the wiring layer 2a of the long circuit sheet 251 serving as the LED light strip 2. The long circuit sheet 251 of the LED light strip 2 herein is not limited to include only one wiring layer 2a and may further include another wiring layer such as the wiring layer 2c shown in FIG. 9. The light sources 202 are disposed on the wiring layer 2a of the LED light strip 2 and electrically connected to the power supply 5 by way of the wiring layer 2a. As shown in FIG. 8, in another embodiment, the long circuit sheet 251 of the LED light strip 2 may include a wiring layer 2a and a dielectric layer 2b. The dielectric layer 2b may be adhered to the short circuit board 253 first and the wiring layer 2a is subsequently adhered to the dielectric layer 2b and extends to the short circuit board 253. All these embodiments are within the scope of applying the circuit board assembly concept of the present invention.

In the above-mentioned embodiments, the short circuit board 253 may have a length generally of about 15 mm to about 40 mm and in some preferable embodiments about 19 mm to about 36 mm, while the long circuit sheet 251 may have a length generally of about 800 mm to about 2800 mm and in some embodiments of about 1200 mm to about 2400 mm. A ratio of the length of the short circuit board 253 to the length of the long circuit sheet 251 ranges from, for example, about 1:20 to about 1:200.

When the ends of the LED light strip 2 are not fixed on the inner surface of the lamp tube 1, the connection between the LED light strip 2 and the power supply 5 via soldering bonding would likely not firmly support the power supply 5, and it may be necessary to dispose the power supply 5 inside the end cap. For example, a longer end cap to have enough space for receiving the power supply 5 may be used. However, this will reduce the length of the lamp tube under the prerequisite that the total length of the LED tube lamp is fixed according to the product standard, and may therefore decrease the effective illuminating areas.

Figure 11:
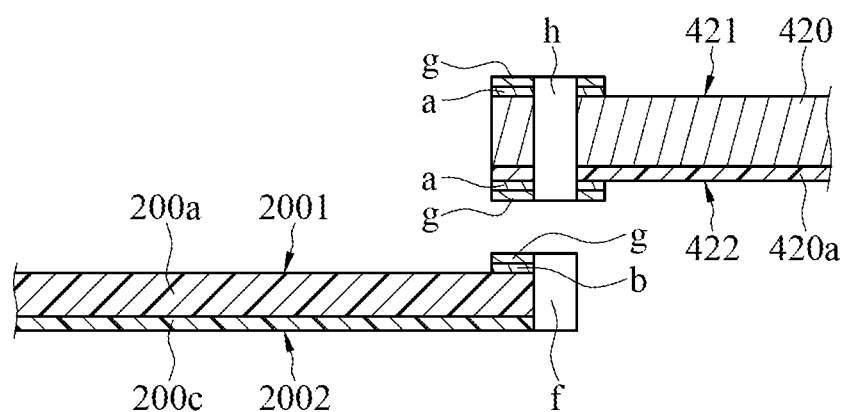
FIGS. 11 to 13 are diagrams of an exemplary soldering process of a bendable circuit sheet and a printed circuit board of a power supply, such as shown in the example of FIG. 10, according to certain embodiments.
Figure 12:
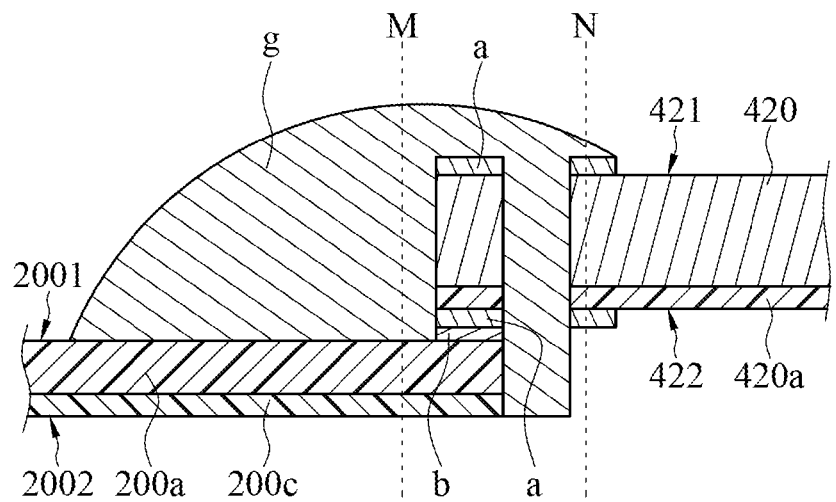
Figure 13:
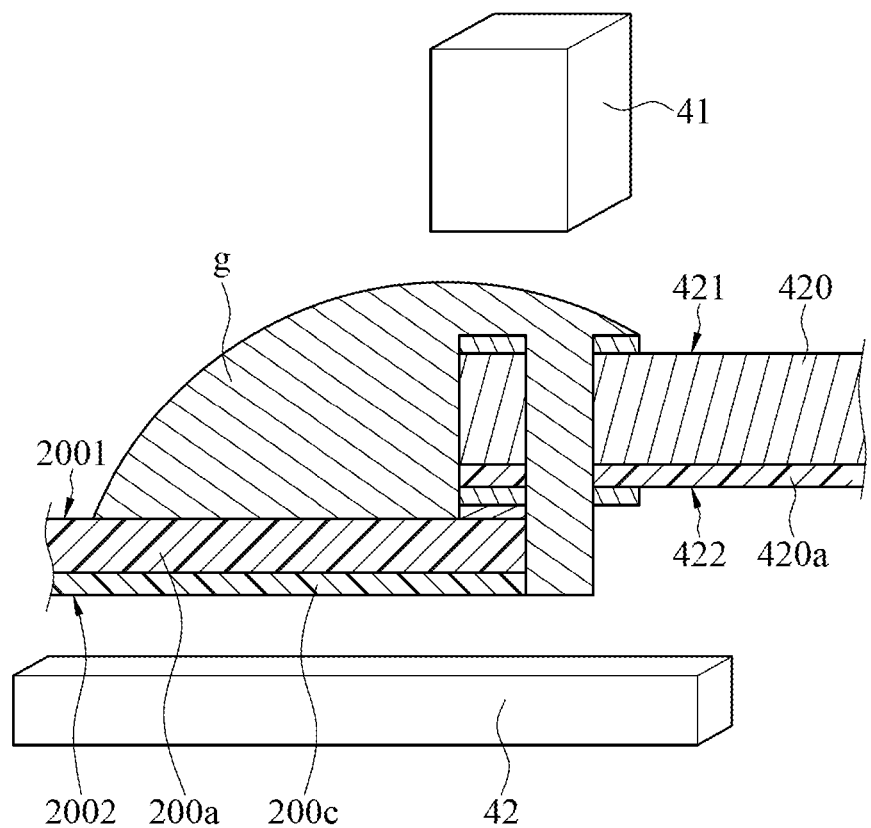

Referring to FIG. 10 to FIG. 13, FIG. 10 is a perspective view of a bendable circuit sheet 200 and a printed circuit board 420 of a power supply 400 soldered to each other and FIG. 11 to FIG. 13 are diagrams of a soldering process of the bendable circuit sheet 200 and the printed circuit board 420 of the power supply 400. In the embodiment, the bendable circuit sheet 200 and the freely extending end portion 21 have the same structure. The freely extending end portion 21 comprises the portions of two opposite ends of the bendable circuit sheet 200 and is utilized for being connected to the printed circuit board 420. The bendable circuit sheet 200 and the power supply 400 are electrically connected to each other by soldering. The bendable circuit sheet 200 comprises a circuit layer 200a and a circuit protection layer 200c over a side of the circuit layer 200a. Moreover, the bendable circuit sheet 200 comprises two opposite surfaces which are a first surface 2001 and a second surface 2002. The first surface 2001 is the one on the circuit layer 200a and away from the circuit protection layer 200c. The second surface 2002 is the other one on the circuit protection layer 200c and away from the circuit layer 200a. Several LED light sources 202 are disposed on the first surface 2001 and are electrically connected to circuits of the circuit layer 200a. The circuit protection layer 200c is made by polyimide (PI) having less thermal conductivity but being beneficial to protect the circuits. The first surface 2001 of the bendable circuit sheet 200 comprises soldering pads "b". Soldering material "g" can be placed on the soldering pads "b". In one embodiment, the bendable circuit sheet 200 further comprises a notch "f". The notch "f" is disposed on an edge of the end of the bendable circuit sheet 200 soldered to the printed circuit board 420 of the power supply 400. In some embodiments instead of a notch, a hole near the edge of the end of the bendable circuit sheet 200 may be used, which may thus provide additional contact material between the printed circuit board 420 and the bendable circuit sheet 200, thereby providing a stronger connection. The printed circuit board 420 comprises a power circuit layer 420a and soldering pads "a". Moreover, the printed circuit board 420 comprises two opposite surfaces which are a first surface 421 and a second surface 422. The second surface 422 is the one on the power circuit layer 420a. The soldering pads "a" are respectively disposed on the first surface 421 and the second surface 422. The soldering pads a on the first surface 421 are corresponding to those on the second surface 422. Soldering material "g" can be placed on the soldering pad "a". In one embodiment, considering the stability of soldering and the optimization of automatic process, the bendable circuit sheet 200 is disposed below the printed circuit board 420 (their relative positions are shown in FIG. 11). That is to say, the first surface 2001 of the bendable circuit sheet 200 is connected to the second surface 422 of the printed circuit board 420. Also, as shown, the soldering material "g" can contact, cover, and be soldered to a top surface of the bendable circuit sheet 200 (e.g., first surface 2001), end side surfaces of soldering pads "a," soldering pad "b," and power circuit layer 420a formed at an edge of the printed circuit board 420, and a top surface of soldering pad "a" at the top surface 421 of the printed circuit board 420. In addition, the soldering material "g" can contact side surfaces of soldering pads "a," soldering pad "b," and power circuit layer 420a formed at a hole in the printed circuit board 420 and/or at a hole or notch in bendable circuit sheet 200. The soldering material may therefore form a bump-shaped portion covering portions of the bendable circuit sheet 200 and the printed circuit board 420, and a rod-shaped portion passing through the printed circuit board 420 and through a hole or notch in the bendable circuit sheet 200. The two portions (e.g., bump-shaped portion and rod-shaped portion) may serve as a rivet, for maintaining a strong connection between the bendable circuit sheet 200 and the printed circuit board 420.

As shown in FIG. 12 and FIG. 13, in an exemplary soldering process of the bendable circuit sheet 200 and the printed circuit board 420, the circuit protection layer 200c of the bendable circuit sheet 200 is placed on a supporting table 42 (i.e., the second surface 2002 of the bendable circuit sheet 200 contacts the supporting table 42) in advance of soldering. The soldering pads "a" on the second surface 422 of the printed circuit board 420 directly sufficiently contact the soldering pads "b" on the first surface 2001 of the bendable circuit sheet 200. And then a heating head 41 presses on a portion of the soldering material "g" where the bendable circuit sheet 200 and the printed circuit board 420 are soldered to each other. When soldering, the soldering pads "b" on the first surface 2001 of the bendable circuit sheet 200 directly contact the soldering pads "a" on the second surface 422 of the printed circuit board 420, and the soldering pads "a" on the first surface 421 of the printed circuit board 420 contact the soldering material "g," which is pressed on by heating head 41. Under the circumstances, the heat from the heating heads 41 can directly transmit through the soldering pads "a" on the first surface 421 of the printed circuit board 420 and the soldering pads "a" on the second surface 422 of the printed circuit board 420 to the soldering pads "b" on the first surface 2001 of the bendable circuit sheet 200. The transmission of the heat between the heating heads 41 and the soldering pads "a" and "b" won't be affected by the circuit protection layer 200c which has relatively less thermal conductivity, since the circuit protection layer 200c is not between the heating head 41 and the circuit layer 200a. Consequently, the efficiency and stability regarding the connections and soldering process of the soldering pads "a" and "b" of the printed circuit board 420 and the bendable circuit sheet 200 can be improved. As shown in the exemplary embodiment of FIG. 12, the printed circuit board 420 and the bendable circuit sheet 200 are firmly connected to each other by the soldering material "g". Components between the virtual line M and the virtual line N of FIG. 12 from top to bottom are the soldering pads "a" on the first surface 421 of printed circuit board 420, the power circuit layer 420a, the soldering pads "a" on the second surface 422 of printed circuit board 420, the soldering pads "b" on the first surface 2001 of bendable circuit sheet 200, the circuit layer 200a of the bendable circuit sheet 200, and the circuit protection layer 200c of the bendable circuit sheet 200. The connection of the printed circuit board 420 and the bendable circuit sheet 200 are firm and stable. The soldering material "g" may extend higher than the soldering pads "a" on the first surface 421 of printed circuit board 420 and may fill in other spaces, as described above.

In other embodiments, an additional circuit protection layer (e.g., PI layer) can be disposed over the first surface 2001 of the circuit layer 200a. For example, the circuit layer 200a may be sandwiched between two circuit protection layers, and therefore the first surface 2001 of the circuit layer 200a can be protected by the circuit protection layer. A part of the circuit layer 200a (the part having the soldering pads "b") is exposed for being connected to the soldering pads "a" of the printed circuit board 420. Other parts of the circuit layer 200a are exposed by the additional circuit protection layer so they can connect to LED light sources 202. Under these circumstances, a part of the bottom of the each LED light source 202 contacts the circuit protection layer on the first surface 2001 of the circuit layer 200a, and another part of the bottom of the LED light source 202 contacts the circuit layer 200a.

According to the exemplary embodiments shown in FIG. 10 to FIG. 13, the printed circuit board 420 further comprises through holes "h" passing through the soldering pads "a". In an automatic soldering process, when the heating head 41 automatically presses the printed circuit board 420, the soldering material "g" on the soldering pads "a" can be pushed into the through holes "h" by the heating head 41 accordingly, which fits the need of automatic process.

Next, examples of the circuit design and using of the power supply module 250 are described as follows.

Figure 14A:
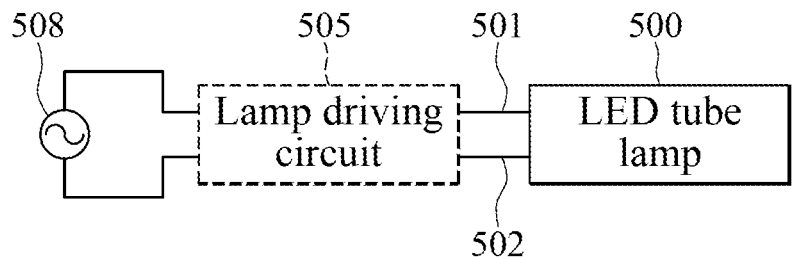
FIG. 14A is a block diagram of an exemplary power supply system for an LED tube lamp according to some embodiments.

FIG. 14A is a block diagram of a power supply system for an LED tube lamp according to an embodiment.

Referring to FIG. 14A, an AC power supply 508 is used to supply an AC supply signal, and may be an AC powerline with a voltage rating, for example, of 100-277 volts and a frequency rating, for example, of 50 or 60 Hz. A lamp driving circuit 505 receives and then converts the AC supply signal into an AC driving signal as an external driving signal (external, in that it is external to the LED tube lamp). Lamp driving circuit 505 may be for example an electronic ballast used to convert the AC powerline into a high-frequency high-voltage AC driving signal. Common types of electronic ballast include instant-start ballast, programmed-start or rapid-start ballast, etc., which may all be applicable to the LED tube lamp of the present disclosure. The voltage of the AC driving signal is in some embodiments higher than 300 volts, and is in some embodiments in the range of about 400-700 volts. The frequency of the AC driving signal is in some embodiments higher than 10 k Hz, and is in some embodiments in the range of about 20 k-50 k Hz. The LED tube lamp 500 receives an external driving signal and is thus driven to emit light via the LED light sources 202. In one embodiment, the external driving signal comprises the AC driving signal from lamp driving circuit 505. In one embodiment, LED tube lamp 500 is in a driving environment in which it is power-supplied at only one end cap having two conductive pins 501 and 502, which are coupled to lamp driving circuit 505 to receive the AC driving signal. The two conductive pins 501 and 502 may be electrically and physically connected to, either directly or indirectly, the lamp driving circuit 505. The two conductive pins 501 and 502 may be formed, for example, of a conductive material such as a metal. The conductive pins may have, for example, a protruding rod-shape, or a ball shape. Conductive pins such as 501 and 502 may be generally referred to as external connection terminals, for connecting the LED tube lamp 500 to an external socket. Under such circumstance, conductive pin 501 can be referred to as the first external connection terminal, and conductive pin 502 can be referred to as the second external connection terminal. The external connection terminals may have an elongated shape, a ball shape, or in some cases may even be flat or may have a female-type connection for connecting to protruding male connectors in a lamp socket. In another embodiment, the numbers of the conductive pins may more than two. In other words, the numbers of the conductive pins can vary depending on the needs of the application.

It is worth noting that lamp driving circuit 505 may be omitted and is therefore depicted by a dotted line. In one embodiment, if lamp driving circuit 505 is omitted, AC power supply 508 is directly connected to pins 501 and 502, which then receive the AC supply signal as an external driving signal.

Figure 14B:
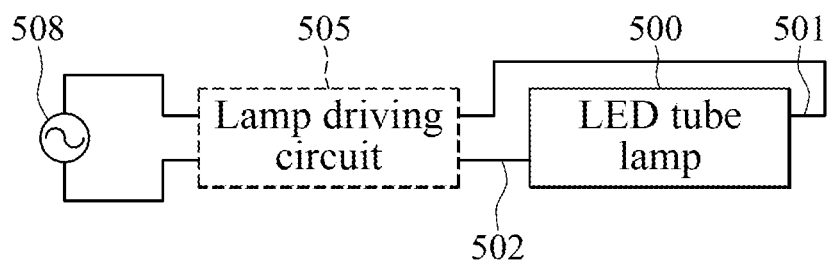
FIG. 14B is a block diagram of an exemplary power supply system for an LED tube lamp according to some embodiments.

In addition to the above use with a single-end power supply, LED tube lamp 500 may instead be used with a dual-end power supply to one pin at each of the two ends of an LED lamp tube. FIG. 14B is a block diagram of a power supply system for an LED tube lamp according to one embodiment. Referring to FIG. 14B, compared to that shown in FIG. 14A, pins 501 and 502 are respectively disposed at the two opposite end caps of LED tube lamp 500, forming a single pin at each end of LED tube lamp 500, with other components and their functions being the same as those in FIG. 14A.

Figure 14C:
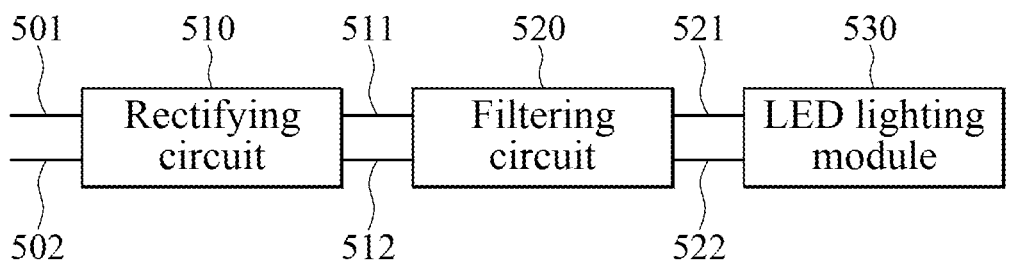
FIG. 14C is a block diagram showing elements of an exemplary LED lamp according to some embodiments.

FIG. 14C is a block diagram showing elements of an LED lamp according to one embodiment. Referring to FIG. 14C, the power supply module 250 of the LED lamp may include a rectifying circuit 510 and a filtering circuit 520, and may also include some components of an LED lighting module 530. Rectifying circuit 510 is coupled to pins 501 and 502 to receive and then rectify an external driving signal, so as to output a rectified signal at output terminals 511 and 512. The external driving signal may be the AC driving signal or the AC supply signal described with reference to FIGS. 14A and 14B, or may even be a DC signal, which in some embodiments does not alter the LED lamp of the present invention. Filtering circuit 520 is coupled to the first rectifying circuit for filtering the rectified signal to produce a filtered signal. For instance, filtering circuit 520 is coupled to terminals 511 and 512 to receive and then filter the rectified signal, so as to output a filtered signal at output terminals 521 and 522. LED lighting module 530 is coupled to filtering circuit 520, to receive the filtered signal for emitting light. For instance, LED lighting module 530 may include a circuit coupled to terminals 521 and 522 to receive the filtered signal and thereby to drive an LED unit (e.g., LED light sources 202 on an LED light strip 2, as discussed above, and not shown in FIG. 14C). For example, as described in more detail below, LED lighting module 530 may include a driving circuit coupled to an LED module to emit light. Details of these operations are described in below descriptions of certain embodiments.

It is worth noting that although there are two output terminals 511 and 512 and two output terminals 521 and 522 in embodiments of these Figs., in practice the number of ports or terminals for coupling between rectifying circuit 510, filtering circuit 520, and LED lighting module 530 may be one or more depending on the needs of signal transmission between the circuits or devices.

In addition, the power supply module of the LED lamp described in FIG. 14C, and embodiments of the power supply module of an LED lamp described below, may each be used in the LED tube lamp 500 in FIGS. 14A and 14B, and may instead be used in any other type of LED lighting structure having two conductive pins used to conduct power, such as LED light bulbs, personal area lights (PAL), plug-in LED lamps with different types of bases (such as types of PL-S, PL-D, PL-T, PL-L, etc.), etc.

Figure 14D:
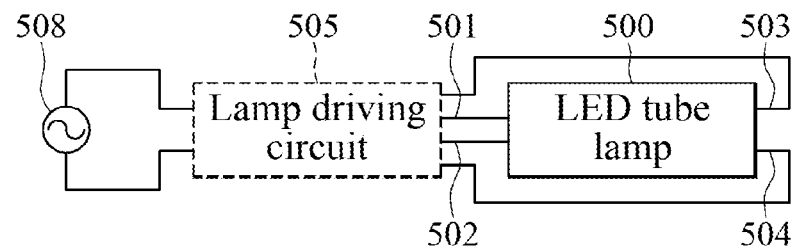
FIG. 14D is a block diagram of an exemplary power supply system for an LED tube lamp according to some embodiments.

FIG. 14D is a block diagram of a power supply system for an LED tube lamp according to an embodiment. Referring to FIG. 14D, an AC power supply 508 is used to supply an AC supply signal. A lamp driving circuit 505 receives and then converts the AC supply signal into an AC driving signal. An LED tube lamp 500 receives an AC driving signal from lamp driving circuit 505 and is thus driven to emit light. In this embodiment, LED tube lamp 500 is power-supplied at its both end caps respectively having two pins 501 and 502 and two pins 503 and 504, which are coupled to lamp driving circuit 505 to concurrently receive the AC driving signal to drive an LED unit (not shown) in LED tube lamp 500 to emit light. AC power supply 508 may be, e.g., the AC powerline, and lamp driving circuit 505 may be a stabilizer or an electronic ballast. It should be noted that different pins or external connection terminals described throughout this specification may be named as first pin/external connection terminal, second pin/external connection terminal, third pin/external connection terminal, etc., for discussion purposes. Therefore, in some situations, for example, external connection terminal 501 may be referred to as a first external connection terminal, and external connection terminal 503 may be referred to as a second external connection terminal. Also, the lamp tube may include two end caps respectively coupled to two ends thereof, and the pins may be coupled to the end caps, such that the pins are coupled to the lamp tube.

Figure 14E:
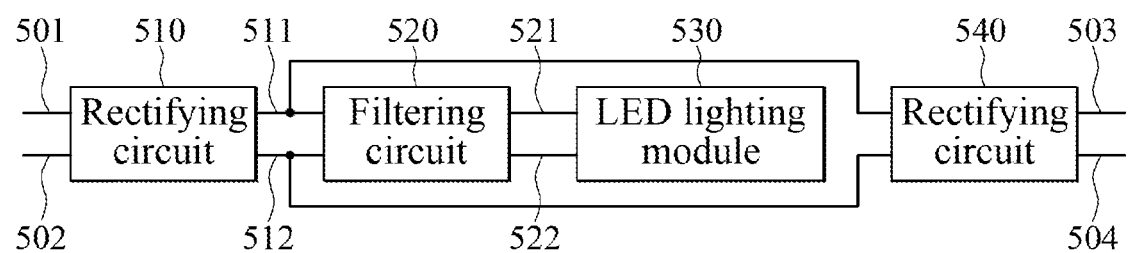
FIG. 14E is a block diagram showing elements of an LED lamp according to some embodiments.

FIG. 14E is a block diagram showing components of an LED lamp according to an embodiment. Referring to FIG. 14E, the power supply module of the LED lamp includes a rectifying circuit 510, a filtering circuit 520, and a rectifying circuit 540, and may also include some components of an LED lighting module 530. Rectifying circuit 510 is coupled to pins 501 and 502 to receive and then rectify an external driving signal conducted by pins 501 and 502. Rectifying circuit 540 is coupled to pins 503 and 504 to receive and then rectify an external driving signal conducted by pins 503 and 504. Therefore, the power supply module of the LED lamp may include two rectifying circuits 510 and 540 configured to output a rectified signal at output terminals 511 and 512. Filtering circuit 520 is coupled to terminals 511 and 512 to receive and then filter the rectified signal, so as to output a filtered signal at output terminals 521 and 522. LED lighting module 530 is coupled to terminals 521 and 522 to receive the filtered signal and thereby to drive an LED unit (not shown) of LED lighting module 530 to emit light.

The power supply module of the LED lamp in this embodiment of FIG. 14E may be used in LED tube lamp 500 with a dual-end power supply in FIG. 14D. It is worth noting that since the power supply module of the LED lamp comprises rectifying circuits 510 and 540, the power supply module of the LED lamp may be used in LED tube lamps 500 with a single-end power supply in FIGS. 14A and 14B, to receive an external driving signal (such as the AC supply signal or the AC driving signal described above). The power supply module of an LED lamp in this embodiment and other embodiments herein may also be used with a DC driving signal.

Figure 15A:
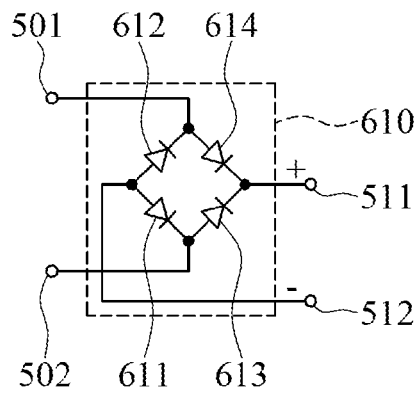
FIG. 15A is a schematic diagram of a rectifying circuit according to some embodiments.

FIG. 15A is a schematic diagram of a rectifying circuit according to an embodiment. Referring to FIG. 15A, rectifying circuit 610 includes rectifying diodes 611, 612, 613, and 614, configured to full-wave rectify a received signal. Diode 611 has an anode connected to output terminal 512, and a cathode connected to pin 502. Diode 612 has an anode connected to output terminal 512, and a cathode connected to pin 501. Diode 613 has an anode connected to pin 502, and a cathode connected to output terminal 511. Diode 614 has an anode connected to pin 501, and a cathode connected to output terminal 511.

When pins 501 and 502 (generally referred to as terminals) receive an AC signal, rectifying circuit 610 operates as follows. During the connected AC signal's positive half cycle, the AC signal is input through pin 501, diode 614, and output terminal 511 in sequence, and later output through output terminal 512, diode 611, and pin 502 in sequence. During the connected AC signal's negative half cycle, the AC signal is input through pin 502, diode 613, and output terminal 511 in sequence, and later output through output terminal 512, diode 612, and pin 501 in sequence. Therefore, during the connected AC signal's full cycle, the positive pole of the rectified signal produced by rectifying circuit 610 remains at output terminal 511, and the negative pole of the rectified signal remains at output terminal 512. Accordingly, the rectified signal produced or output by rectifying circuit 610 is a full-wave rectified signal.

When pins 501 and 502 are coupled to a DC power supply to receive a DC signal, rectifying circuit 610 operates as follows. When pin 501 is coupled to the anode of the DC supply and pin 502 to the cathode of the DC supply, the DC signal is input through pin 501, diode 614, and output terminal 511 in sequence, and later output through output terminal 512, diode 611, and pin 502 in sequence. When pin 501 is coupled to the cathode of the DC supply and pin 502 to the anode of the DC supply, the DC signal is input through pin 502, diode 613, and output terminal 511 in sequence, and later output through output terminal 512, diode 612, and pin 501 in sequence. Therefore, no matter what the electrical polarity of the DC signal is between pins 501 and 502, the positive pole of the rectified signal produced by rectifying circuit 610 remains at output terminal 511, and the negative pole of the rectified signal remains at output terminal 512.

Therefore, rectifying circuit 610 in this embodiment can output or produce a proper rectified signal regardless of whether the received input signal is an AC or DC signal.

Figure 15B:
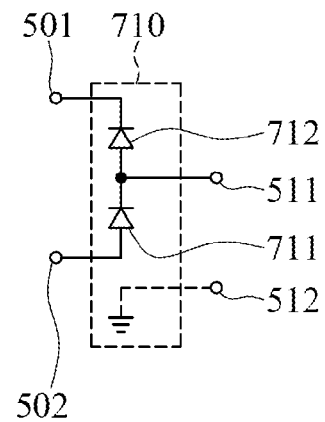
FIG. 15B is a schematic diagram of a rectifying circuit according to some embodiments.

FIG. 15B is a schematic diagram of a rectifying circuit according to an embodiment. Referring to FIG. 15B, rectifying circuit 710 includes rectifying diodes 711 and 712, configured to half-wave rectify a received signal. Diode 711 has an anode connected to pin 502, and a cathode connected to output terminal 511. Diode 712 has an anode connected to output terminal 511, and a cathode connected to pin 501. Output terminal 512 may be omitted or grounded depending on actual applications.

Next, exemplary operation(s) of rectifying circuit 710 is described as follows.

In one embodiment, during a received AC signal's positive half cycle, the electrical potential at pin 501 is higher than that at pin 502, so diodes 711 and 712 are both in a cutoff state as being reverse-biased, making rectifying circuit 710 not outputting a rectified signal. During a received AC signal's negative half cycle, the electrical potential at pin 501 is lower than that at pin 502, so diodes 711 and 712 are both in a conducting state as being forward-biased, allowing the AC signal to be input through diode 711 and output terminal 511, and later output through output terminal 512, a ground terminal, or another end of the LED tube lamp not directly connected to rectifying circuit 710. Accordingly, the rectified signal produced or output by rectifying circuit 710 is a half-wave rectified signal.

Figure 15C:
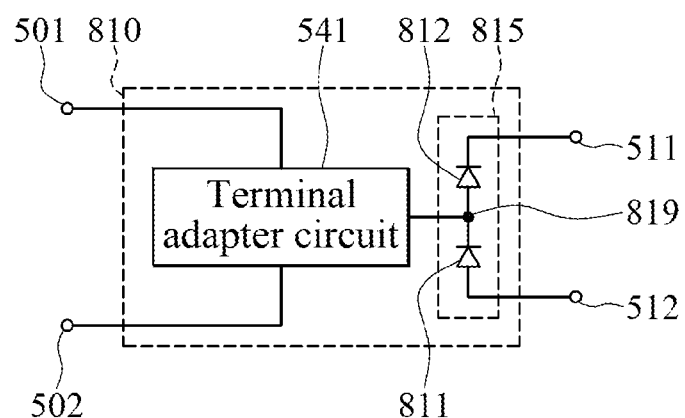
FIG. 15C is a schematic diagram of a rectifying circuit according to some embodiments.

FIG. 15C is a schematic diagram of a rectifying circuit according to an embodiment. Referring to FIG. 15C, rectifying circuit 810 includes a rectifying unit 815 and a terminal adapter circuit 541. In this embodiment, rectifying unit 815 comprises a half-wave rectifier circuit including diodes 811 and 812 and configured to half-wave rectify. Diode 811 has an anode connected to an output terminal 512, and a cathode connected to a half-wave node 819. Diode 812 has an anode connected to half-wave node 819, and a cathode connected to an output terminal 511. Terminal adapter circuit 541 is coupled to half-wave node 819 and pins 501 and 502, to transmit a signal received at pin 501 and/or pin 502 to half-wave node 819. By means of the terminal adapting function of terminal adapter circuit 541, rectifying circuit 810 includes two input terminals (connected to pins 501 and 502) and two output terminals 511 and 512.

Next, in certain embodiments, rectifying circuit 810 operates as follows.

During a received AC signal's positive half cycle, the AC signal may be input through pin 501 or 502, terminal adapter circuit 541, half-wave node 819, diode 812, and output terminal 511 in sequence, and later output through another end or circuit of the LED tube lamp. During a received AC signal's negative half cycle, the AC signal may be input through another end or circuit of the LED tube lamp, and later output through output terminal 512, diode 811, half-wave node 819, terminal adapter circuit 541, and pin 501 or 502 in sequence.

Terminal adapter circuit 541 may comprise a resistor, a capacitor, an inductor, or any combination thereof, for performing functions of voltage/current regulation or limiting, types of protection, current/voltage regulation, etc. Descriptions of these functions are presented below.

Figure 15D:
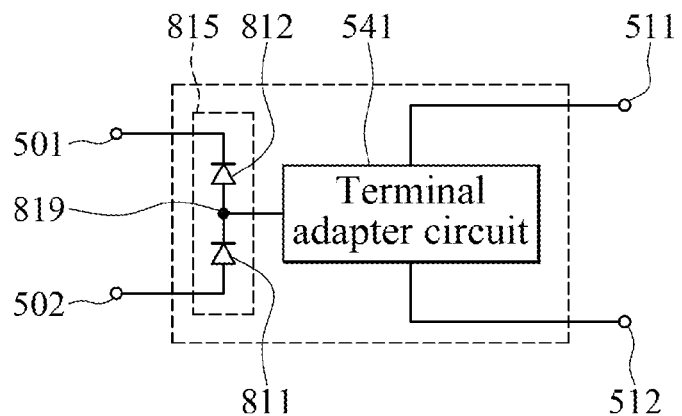
FIG. 15D is a schematic diagram of a rectifying circuit according to some embodiments.

In practice, rectifying unit 815 and terminal adapter circuit 541 may be interchanged in position (as shown in FIG. 15D), without altering the function of half-wave rectification. FIG. 15D is a schematic diagram of a rectifying circuit according to an embodiment. Referring to FIG. 15D, diode 811 has an anode connected to pin 502 and diode 812 has a cathode connected to pin 501. A cathode of diode 811 and an anode of diode 812 are connected to half-wave node 819. Terminal adapter circuit 541 is coupled to half-wave node 819 and output terminals 511 and 512. During a received AC signal's positive half cycle, the AC signal may be input through another end or circuit of the LED tube lamp, and later output through output terminal 511 or 512, terminal adapter circuit 541, half-wave node 819, diode 812, and pin 501 in sequence. During a received AC signal's negative half cycle, the AC signal may be input through pin 502, diode 811, half-wave node 819, terminal adapter circuit 541, and output node 511 or 512 in sequence, and later output through another end or circuit of the LED tube lamp.

Terminal adapter circuit 541 in embodiments shown in FIGS. 15C and 15D may be omitted and is therefore depicted by a dotted line. If terminal adapter circuit 541 of FIG. 15C is omitted, pins 501 and 502 will be coupled to half-wave node 819. If terminal adapter circuit 541 of FIG. 15D is omitted, output terminals 511 and 512 will be coupled to half-wave node 819.

Rectifying circuit 510 as shown and explained in FIGS. 15A-D can constitute or be the rectifying circuit 540 shown in FIG. 14E, as having pins 503 and 504 for conducting instead of pins 501 and 502.

Next, an explanation follows as to choosing embodiments and their combinations of rectifying circuits 510 and 540, with reference to FIGS. 14C and 14E.

Rectifying circuit 510 in embodiments shown in FIG. 14C may comprise, for example, the rectifying circuit 610 in FIG. 15A.

Rectifying circuits 510 and 540 in embodiments shown in FIG. 14E may each comprise, for example, any one of the rectifying circuits in FIGS. 15A-D, and terminal adapter circuit 541 in FIGS. 15C-D may be omitted without altering the rectification function used in an LED tube lamp. When rectifying circuits 510 and 540 each comprise a half-wave rectifier circuit described in FIGS. 15B-D, during a received AC signal's positive or negative half cycle, the AC signal may be input from one of rectifying circuits 510 and 540, and later output from the other rectifying circuit 510 or 540. Further, when rectifying circuits 510 and 540 each comprise the rectifying circuit described in FIG. 15C or 15D, or when they comprise the rectifying circuits in FIGS. 15C and 15D respectively, only one terminal adapter circuit 541 may be needed for functions of voltage/current regulation or limiting, types of protection, current/voltage regulation, etc. within rectifying circuits 510 and 540, omitting another terminal adapter circuit 541 within rectifying circuit 510 or 540.

Figure 16A:
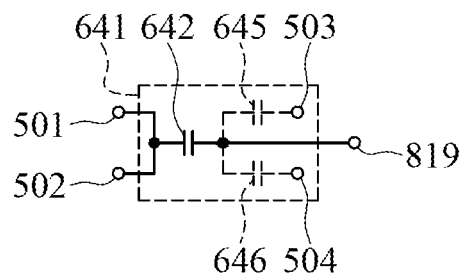
FIG. 16A is a schematic diagram of a terminal adapter circuit according to some embodiments.

FIG. 16A is a schematic diagram of a terminal adapter circuit according to an embodiment. Referring to FIG. 16A, terminal adapter circuit 641 comprises a capacitor 642 having an end connected to pins 501 and 502, and another end connected to half-wave node 819. In one embodiment, capacitor 642 has an equivalent impedance to an AC signal, which impedance increases as the frequency of the AC signal decreases, and decreases as the frequency increases. Therefore, capacitor 642 in terminal adapter circuit 641 in this embodiment works as a high-pass filter. Further, terminal adapter circuit 641 is connected in series to an LED unit in the LED tube lamp, producing an equivalent impedance of terminal adapter circuit 641 to perform a current/voltage limiting function on the LED unit, thereby preventing damaging of the LED unit by an excessive voltage across and/or current in the LED unit. In addition, choosing the value of capacitor 642 according to the frequency of the AC signal can further enhance voltage/current regulation.

Terminal adapter circuit 641 may further include a capacitor 645 and/or capacitor 646. Capacitor 645 has an end connected to half-wave node 819, and another end connected to pin 503. Capacitor 646 has an end connected to half-wave node 819, and another end connected to pin 504. For example, half-wave node 819 may be a common connective node between capacitors 645 and 646. And capacitor 642 acting as a current regulating capacitor is coupled to the common connective node and pins 501 and 502. In such a structure, series-connected capacitors 642 and 645 exist between one of pins 501 and 502 and pin 503, and/or series-connected capacitors 642 and 646 exist between one of pins 501 and 502 and pin 504. Through equivalent impedances of series-connected capacitors, voltages from the AC signal are divided. Referring to FIGS. 14E and 16A, according to ratios between equivalent impedances of the series-connected capacitors, the voltages respectively across capacitor 642 in rectifying circuit 510, filtering circuit 520, and LED lighting module 530 can be controlled, making the current flowing through an LED module coupled to LED lighting module 530 being limited within a current rating, and then protecting/preventing filtering circuit 520 and LED module from being damaged by excessive voltages.

Figure 16B:
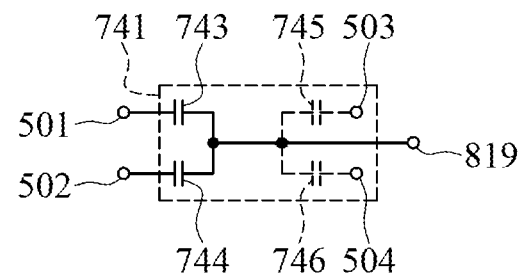
FIG. 16B is a schematic diagram of a terminal adapter circuit according to some embodiments.

FIG. 16B is a schematic diagram of a terminal adapter circuit according to an embodiment. Referring to FIG. 16B, terminal adapter circuit 741 comprises capacitors 743 and 744. Capacitor 743 has an end connected to pin 501, and another end connected to half-wave node 819. Capacitor 744 has an end connected to pin 502, and another end connected to half-wave node 819. Compared to terminal adapter circuit 641 in FIG. 16A, terminal adapter circuit 741 has capacitors 743 and 744 in place of capacitor 642. Capacitance values of capacitors 743 and 744 may be the same as each other, or may differ from each other depending on the magnitudes of signals to be received at pins 501 and 502.

Similarly, terminal adapter circuit 741 may further comprise a capacitor 745 and/or a capacitor 746, respectively connected to pins 503 and 504. Thus, each of pins 501 and 502 and each of pins 503 and 504 may be connected in series to a capacitor, to achieve the functions of voltage division and other protections.

Figure 16C:
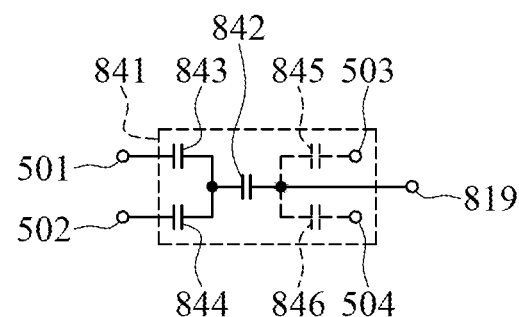
FIG. 16C is a schematic diagram of a terminal adapter circuit according to some embodiments.

FIG. 16C is a schematic diagram of the terminal adapter circuit according to an embodiment. Referring to FIG. 16C, terminal adapter circuit 841 comprises capacitors 842, 843, and 844. Capacitors 842 and 843 are connected in series between pin 501 and half-wave node 819. Capacitors 842 and 844 are connected in series between pin 502 and half-wave node 819. In such a circuit structure, if any one of capacitors 842, 843, and 844 is shorted, there is still at least one capacitor (of the other two capacitors) between pin 501 and half-wave node 819 and between pin 502 and half-wave node 819, which performs a current-limiting function. Therefore, in the event that a user accidentally gets an electric shock, this circuit structure will prevent an excessive current flowing through and then seriously hurting the body of the user.

Similarly, terminal adapter circuit 841 may further comprise a capacitor 845 and/or a capacitor 846, respectively connected to pins 503 and 504. Thus, each of pins 501 and 502 and each of pins 503 and 504 may be connected in series to a capacitor, to achieve the functions of voltage division and other protections.

Figure 16D:
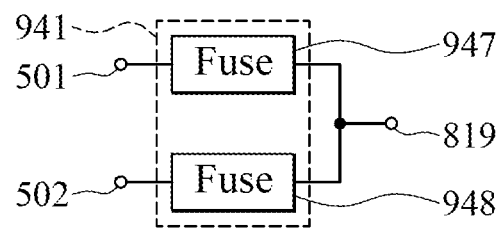
FIG. 16D is a schematic diagram of a terminal adapter circuit according to some embodiments.

FIG. 16D is a schematic diagram of a terminal adapter circuit according to an embodiment. Referring to FIG. 16D, terminal adapter circuit 941 comprises fuses 947 and 948. Fuse 947 has an end connected to pin 501, and another end connected to half-wave node 819. Fuse 948 has an end connected to pin 502, and another end connected to half-wave node 819. With the fuses 947 and 948, when the current through each of pins 501 and 502 exceeds a current rating of a corresponding connected fuse 947 or 948, the corresponding fuse 947 or 948 will accordingly melt and then break the circuit to achieve overcurrent protection. The terminal adapter circuits described above may be described as current limiting circuits, and/or voltage limiting circuits.

Each of the embodiments of the terminal adapter circuits as described in rectifying circuits 510 and 810 coupled to pins 501 and 502 and shown and explained above can be used or included in the rectifying circuit 540 shown in FIG. 14E, to be connected to conductive pins 503 and 504 in a similar manner as described above in connection with conductive pins 501 and 502.

Capacitance values of the capacitors in the embodiments of the terminal adapter circuits shown and described above are in some embodiments in the range, for example, of about 100 pF-100 nF. Also, a capacitor used in embodiments may be equivalently replaced by two or more capacitors connected in series or parallel. For example, each of capacitors 642 and 842 may be replaced by two series-connected capacitors, one having a capacitance value chosen from the range, for example of about 1.0 nF to about 2.5 nF and which may be in some embodiments preferably 1.5 nF, and the other having a capacitance value chosen from the range, for example of about 1.5 nF to about 3.0 nF, and which is in some embodiments about 2.2 nF.

Figure 17A:
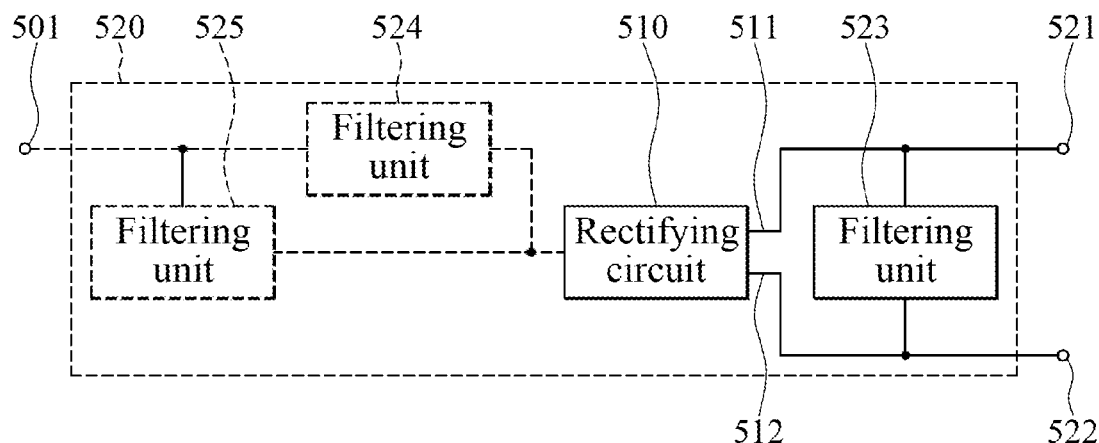
FIG. 17A is a block diagram of a filtering circuit according to some embodiments.

FIG. 17A is a block diagram of a filtering circuit according to an embodiment. Rectifying circuit 510 is shown in FIG. 17A for illustrating its connection with other components, without intending filtering circuit 520 to include rectifying circuit 510. Referring to FIG. 17A, filtering circuit 520 includes a filtering unit 523 coupled to rectifying output terminals 511 and 512 to receive, and to filter out ripples of a rectified signal from rectifying circuit 510, thereby outputting a filtered signal whose waveform is smoother than the rectified signal. Filtering circuit 520 may further comprise another filtering unit 524 coupled between a rectifying circuit and a pin, which are for example rectifying circuit 510 and pin 501, rectifying circuit 510 and pin 502, rectifying circuit 540 and pin 503, or rectifying circuit 540 and pin 504. Filtering unit 524 is for filtering of a specific frequency, in order to filter out a specific frequency component of an external driving signal. In this embodiment of FIG. 17A, filtering unit 524 is coupled between rectifying circuit 510 and pin 501. Filtering circuit 520 may further comprise another filtering unit 525 coupled between one of pins 501 and 502 and a diode of rectifying circuit 510, or between one of pins 503 and 504 and a diode of rectifying circuit 540, for reducing or filtering out electromagnetic interference (EMI). In this embodiment, filtering unit 525 is coupled between pin 501 and a diode (not shown in FIG. 17A) of rectifying circuit 510. Since filtering units 524 and 525 may be present or omitted depending on actual circumstances of their uses, they are depicted by a dotted line in FIG. 17A. Filtering units 523, 524, and 525 may be referred to herein as filtering sub-circuits of filtering circuit 520, or may be generally referred to as a filtering circuit.

Figure 17B:
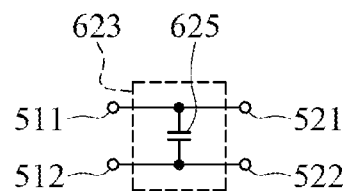
FIG. 17B is a schematic diagram of a filtering unit according to some embodiments.

FIG. 17B is a schematic diagram of a filtering unit according to one embodiment. Referring to FIG. 17B, filtering unit 623 includes a capacitor 625 having an end coupled to output terminal 511 and a filtering output terminal 521 and another end coupled to output terminal 512 and a filtering output terminal 522, and is configured to low-pass filter a rectified signal from output terminals 511 and 512, so as to filter out high-frequency components of the rectified signal and thereby output a filtered signal at output terminals 521 and 522.

Figure 17C:
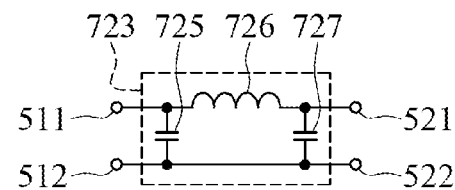
FIG. 17C is a schematic diagram of a filtering unit according to some embodiments.

FIG. 17C is a schematic diagram of a filtering unit according to one embodiment. Referring to FIG. 17C, filtering unit 723 comprises a pi filter circuit including a capacitor 725, an inductor 726, and a capacitor 727. As is well known, a pi filter circuit looks like the symbol π in its shape or structure. Capacitor 725 has an end connected to output terminal 511 and coupled to output terminal 521 through inductor 726, and has another end connected to output terminals 512 and 522. Inductor 726 is coupled between output terminals 511 and 521. Capacitor 727 has an end connected to output terminal 521 and coupled to output terminal 511 through inductor 726, and has another end connected to output terminals 512 and 522.

As seen between output terminals 511 and 512 and output terminals 521 and 522, filtering unit 723 compared to filtering unit 623 in FIG. 17B additionally has inductor 726 and capacitor 727, which are like capacitor 725 in performing low-pass filtering. Therefore, filtering unit 723 in this embodiment compared to filtering unit 623 in FIG. 17B has a better ability to filter out high-frequency components to output a filtered signal with a smoother waveform.

Inductance values of inductor 726 in the embodiment described above are chosen in some embodiments in the range of about 10 nH to about 10 mH. And capacitance values of capacitors 625, 725, and 727 in the embodiments described above are chosen in some embodiments in the range, for example, of about 100 pF to about 1 uF.

Figure 17D:
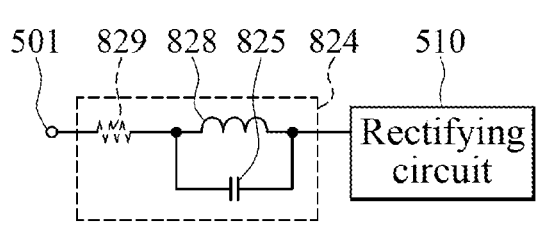
FIG. 17D is a schematic diagram of a filtering unit according to some embodiments.

FIG. 17D is a schematic diagram of a filtering unit according to one embodiment. Referring to FIG. 17D, filtering unit 824 includes a capacitor 825 and an inductor 828 connected in parallel. Capacitor 825 has an end coupled to pin 501, and another end coupled to rectifying output terminal 511 (not shown), and is configured to high-pass filter an external driving signal input at pin 501, so as to filter out low-frequency components of the external driving signal. Inductor 828 has an end coupled to pin 501 and another end coupled to rectifying output terminal 511, and is configured to low-pass filter an external driving signal input at pin 501, so as to filter out high-frequency components of the external driving signal. Therefore, the combination of capacitor 825 and inductor 828 works to present high impedance to an external driving signal at one or more specific frequencies. Thus, the parallel-connected capacitor and inductor work to present a peak equivalent impedance to the external driving signal at a specific frequency.

Through appropriately choosing a capacitance value of capacitor 825 and an inductance value of inductor 828, a center frequency f on the high-impedance band may be set at a specific value given by $$f = \frac{1}{2\pi)LC},$$

where L denotes inductance of inductor 828 and C denotes capacitance of capacitor 825. The center frequency is in some embodiments in the range of about 20~30 kHz, and may be in some embodiments about 25 kHz. In one embodiment, an LED lamp with filtering unit 824 is able to be certified under safety standards, for a specific center frequency, as provided by Underwriters Laboratories (UL).

In some embodiments, filtering unit 824 may further comprise a resistor 829, coupled between pin 501 and filtering output terminal 511. In FIG. 17D, resistor 829 is connected in series to the parallel-connected capacitor 825 and inductor 828. For example, resistor 829 may be coupled between pin 501 and parallel-connected capacitor 825 and inductor 828, or may be coupled between filtering output terminal 511 and parallel-connected capacitor 825 and inductor 828. In this embodiment, resistor 829 is coupled between pin 501 and parallel-connected capacitor 825 and inductor 828. Further, resistor 829 is configured for adjusting the quality factor (Q) of the LC circuit comprising capacitor 825 and inductor 828, to better adapt filtering unit 824 to application environments with different quality factor requirements. Since resistor 829 is an optional component, it is depicted in a dotted line in FIG. 17D.

Capacitance values of capacitor 825 are in some embodiments in the range of about 10 nF-2 uF. Inductance values of inductor 828 are in some embodiments smaller than 2 mH, and may be in some embodiments smaller than 1 mH. Resistance value of resistor 829 are in some embodiments larger than 50 ohms, and may be in some embodiments larger than 500 ohms.

Besides the filtering circuits shown and described in the above embodiments, traditional low-pass or band-pass filters can be used as the filtering unit in the filtering circuit in the present invention.

Figure 17E:
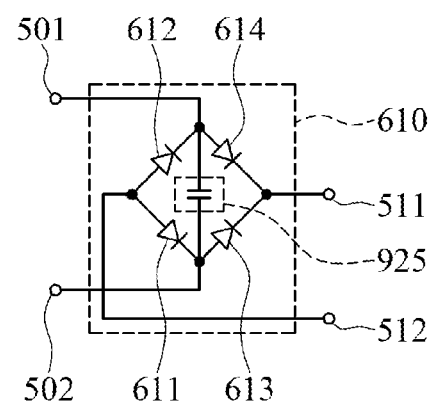
FIG. 17E is a schematic diagram of a filtering unit according to some embodiments.

FIG. 17E is a schematic diagram of a filtering unit according to an embodiment. Referring to FIG. 17E, in this embodiment filtering unit 925 is disposed in rectifying circuit 610 as shown in FIG. 15A, and is configured for reducing the EMI (Electromagnetic interference) caused by rectifying circuit 610 and/or other circuits. In this embodiment, filtering unit 925 includes an EMI-reducing capacitor coupled between pin 501 and the anode of rectifying diode 613, and also between pin 502 and the anode of rectifying diode 614, to reduce the EMI associated with the positive half cycle of the AC driving signal received at pins 501 and 502. The EMI-reducing capacitor of filtering unit 925 is also coupled between pin 501 and the cathode of rectifying diode 611, and between pin 502 and the cathode of rectifying diode 612, to reduce the EMI associated with the negative half cycle of the AC driving signal received at pins 501 and 502. In some embodiments, rectifying circuit 610 comprises a full-wave bridge rectifier circuit including four rectifying diodes 611, 612, 613, and 614. The full-wave bridge rectifier circuit has a first filtering node connecting an anode and a cathode respectively of two diodes 613 and 611 of the four rectifying diodes 611, 612, 613, and 614, and a second filtering node connecting an anode and a cathode respectively of the other two diodes 614 and 612 of the four rectifying diodes 611, 612, 613, and 614. And the EMI-reducing capacitor of the filtering unit 925 is coupled between the first filtering node and the second filtering node.

Similarly, with reference to FIGS. 15C, and 16A-16C, each capacitor in each of the circuits in FIGS. 16A-16C may be coupled between pins 501 and 502 (or pins 503 and 504) and any diode in FIG. 15C, so any or each capacitor in FIGS. 16A-16C can work as an EMI-reducing capacitor to achieve the function of reducing EMI. For example, rectifying circuit 510 in FIGS. 14C and 14E may comprise a half-wave rectifier circuit including two rectifying diodes and having a half-wave node connecting an anode and a cathode respectively of the two rectifying diodes, and any or each capacitor in FIGS. 16A-16C may be coupled between the half-wave node and at least one of the first pin and the second pin. And rectifying circuit 540 in FIG. 14E may comprise a half-wave rectifier circuit including two rectifying diodes and having a half-wave node connecting an anode and a cathode respectively of the two rectifying diodes, and any or each capacitor in FIGS. 16A-16C may be coupled between the half-wave node and at least one of the third pin and the fourth pin.

It's worth noting that the EMI-reducing capacitor in the embodiment of FIG. 17E may also act as capacitor 825 in filtering unit 824, so that in combination with inductor 828 the capacitor 825 performs the functions of reducing EMI and presenting high impedance to an external driving signal at specific frequencies. For example, when the rectifying circuit comprises a full-wave bridge rectifier circuit, capacitor 825 of filtering unit 824 may be coupled between the first filtering node and the second filtering node of the full-wave bridge rectifier circuit. When the rectifying circuit comprises a half-wave rectifier circuit, capacitor 825 of filtering unit 824 may be coupled between the half-wave node of the half-wave rectifier circuit and at least one of the first pin and the second pin.

Figure 18A:
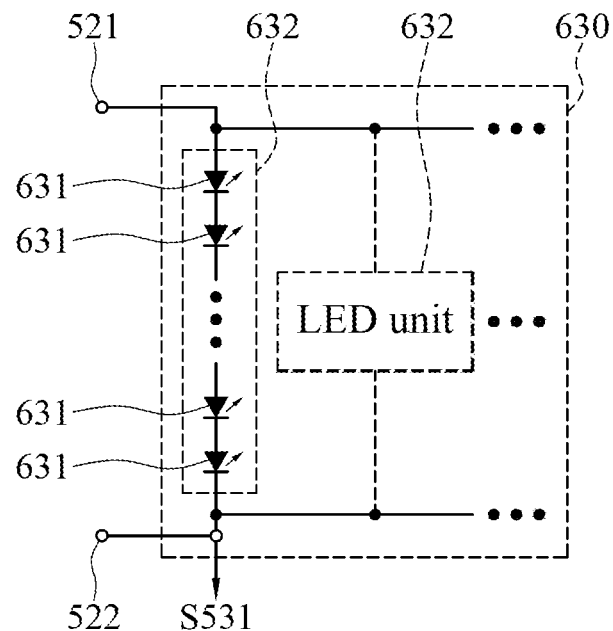
FIG. 18A is a schematic diagram of an LED module according to some embodiments.

FIG. 18A is a schematic diagram of an LED module according to an embodiment. Referring to FIG. 18A, LED module 630 has an anode connected to the filtering output terminal 521, has a cathode connected to the filtering output terminal 522, and comprises at least one LED unit 632. When two or more LED units are included, they are connected in parallel. An anode of each LED unit 632 forms the anode of LED module 630 and is connected to output terminal 521, and a cathode of each LED unit 632 forms the cathode of LED module 630 and is connected to output terminal 522. Each LED unit 632 includes at least one LED 631. When multiple LEDs 631 are included in an LED unit 632, they are connected in series, with the anode of the first LED 631 forming the anode of the LED unit 632 that it is a part of, and the cathode of the first LED 631 connected to the next or second LED 631. And the anode of the last LED 631 in this LED unit 632 is connected to the cathode of a previous LED 631, with the cathode of the last LED 631 forming the cathode of the LED unit 632 that it is a part of.

It's worth noting that LED module 630 may produce a current detection signal S531 reflecting a magnitude of current through LED module 630 and used for controlling or detecting current on the LED module 630. As described herein, an LED unit may refer to a single string of LEDs arranged in series, and an LED module may refer to a single LED unit, or a plurality of LED units connected to a same two nodes (e.g., arranged in parallel). For example, the LED light strip 2 described above may be an LED module and/or LED unit.

Figure 18B:
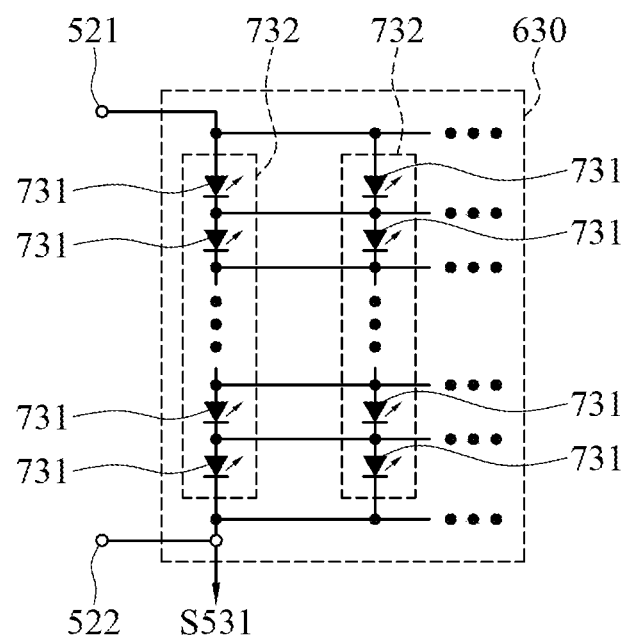
FIG. 18B is a schematic diagram of an LED module according to some embodiments.

FIG. 18B is a schematic diagram of an LED module according to an embodiment. Referring to FIG. 18B, LED module 630 has an anode connected to the filtering output terminal 521, has a cathode connected to the filtering output terminal 522, and comprises at least two LED units 732, with an anode of each LED unit 732 forming the anode of LED module 630, and a cathode of each LED unit 732 forming the cathode of LED module 630. Each LED unit 732 includes at least two LEDs 731 connected in the same way as described in FIG. 18A. For example, the anode of the first LED 731 in an LED unit 732 forms the anode of the LED unit 732 that it is a part of, the cathode of the first LED 731 is connected to the anode of the next or second LED 731, and the cathode of the last LED 731 forms the cathode of the LED unit 732 that it is a part of. Further, LED units 732 in an LED module 630 are connected to each other in this embodiment. All of the n-th LEDs 731 respectively of the LED units 732 are connected by every anode of every n-th LED 731 in the LED units 732, and by every cathode of every n-th LED 731, where n is a positive integer. In this way, the LEDs in LED module 630 in this embodiment are connected in the form of a mesh.

In some embodiments, LED lighting module 530 of the above embodiments includes LED module 630, but doesn't include a driving circuit for the LED module 630 (e.g., does not include an LED driving unit for the LED module or LED unit).

Similarly, LED module 630 in this embodiment may produce a current detection signal S531 reflecting a magnitude of current through LED module 630 and used for controlling or detecting current on the LED module 630.

In actual practice, the number of LEDs 731 included by an LED unit 732 is in some embodiments in the range of 15-25, and is may be preferably in the range of 18-22.

In various embodiments, an exemplary LED tube lamp may have at least some of the electronic components of its power supply module disposed on an LED light strip of the LED tube lamp. For example, the technique of printed electronic circuit (PEC) can be used to print, insert, or embed at least some of the electronic components onto the LED light strip (e.g., as opposed to being on a separate circuit board connected to the LED light strip).

In one embodiment, all electronic components of the power supply module are disposed directly on the LED light strip. For example, the production process may include or proceed with the following steps: preparation of the circuit substrate (e.g. preparation of a flexible printed circuit board); ink jet printing of metallic nano-ink; ink jet printing of active and passive components (as of the power supply module); drying/sintering; ink jet printing of interlayer bumps; spraying of insulating ink; ink jet printing of metallic nano-ink; ink jet printing of active and passive components (to sequentially form the included layers); spraying of surface bond pad(s); and spraying of solder resist against LED components. The production process may be different, however, and still result in some or all electronic components of the power supply module being disposed directly on the LED light strip.

In certain embodiments, if all electronic components of the power supply module are disposed on the light strip, electrical connection between terminal pins of the LED tube lamp and the light strip may be achieved by connecting the pins to conductive lines which are welded with ends of the light strip. In this case, another substrate for supporting the power supply module is not required, thereby allowing of an improved design or arrangement in the end cap(s) of the LED tube lamp. In some embodiments, (components of) the power supply module are disposed at two ends of the light strip, in order to significantly reduce the impact of heat generated from the power supply module's operations on the LED components. Since no substrate other than the light strip is used to support the power supply module in this case, the total amount of welding or soldering can be significantly reduced, improving the general reliability of the power supply module. If no additional substrate is used, the electronic components of the power supply module disposed on the light strip may still be positioned in the end caps of the LED tube lamp, or they may be positioned partly or wholly inside the lamp tube but not in the end caps.

Another case is that some of all electronic components of the power supply module, such as some resistors and/or smaller size capacitors, are printed onto the light strip, and some bigger size components, such as some inductors and/or electrolytic capacitors, are disposed on another substrate, for example in the end cap(s). The production process of the light strip in this case may be the same as that described above. And in this case disposing some of all electronic components on the light strip is conducive to achieving a reasonable layout of the power supply module in the LED tube lamp, which may allow of an improved design in the end cap(s).

As a variant embodiment of the above, electronic components of the power supply module may be disposed on the light strip by a method of embedding or inserting, e.g. by embedding the components onto a bendable or flexible light strip. In some embodiments, this embedding may be realized by a method using copper-clad laminates (CCL) for forming a resistor or capacitor; a method using ink related to silk-screen printing; or a method of ink jet printing to embed passive components, wherein an ink jet printer is used to directly print inks to constitute passive components and related functionalities to intended positions on the light strip. Then through treatment by ultraviolet (UV) light or drying/sintering, the light strip is formed where passive components are embedded. The electronic components embedded onto the light strip include for example resistors, capacitors, and inductors. In other embodiments, active components also may be embedded. Through embedding some components onto the light strip, a reasonable layout of the power supply module can be achieved to allow of an improved design in the end cap(s), because the surface area on a printed circuit board used for carrying components of the power supply module is reduced or smaller, and as a result the size, weight, and thickness of the resulting printed circuit board for carrying components of the power supply module is also smaller or reduced. Also in this situation since welding points on the printed circuit board for welding resistors and/or capacitors if they were not to be disposed on the light strip are no longer used, the reliability of the power supply module is improved, in view of the fact that these welding points are very liable to (cause or incur) faults, malfunctions, or failures. Further, the length of conductive lines needed for connecting components on the printed circuit board is therefore also reduced, which allows of a more compact layout of components on the printed circuit board and thus improving the functionalities of these components.

In some embodiments, luminous efficacy of the LED or LED component is 80 lm/W or above, and in some embodiments, it may be preferably 120 lm/W or above. Certain more optimal embodiments may include a luminous efficacy of the LED or LED component of 160 lm/W or above. White light emitted by an LED component may be produced by mixing fluorescent powder with the monochromatic light emitted by a monochromatic LED chip. The white light in its spectrum has major wavelength ranges of 430-460 nm and 550-560 nm, or major wavelength ranges of 430-460 nm, 540-560 nm, and 620-640 nm.

Figure 19:
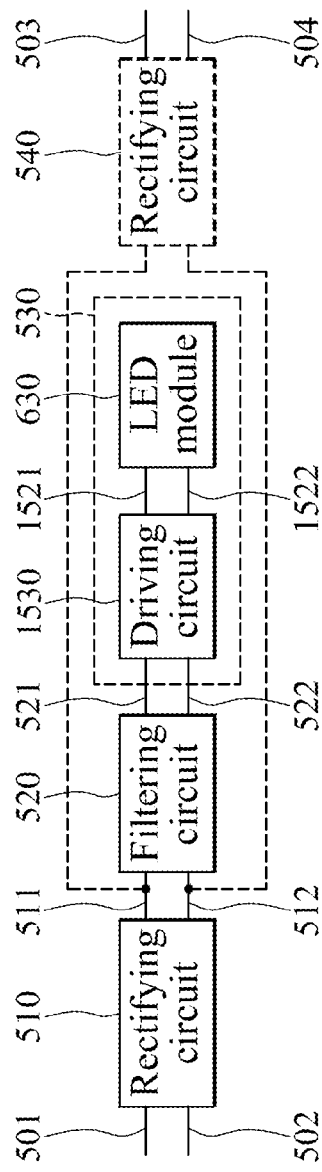
FIG. 19 is a block diagram of an LED lamp according to some embodiments.

FIG. 19 is a block diagram showing components of an LED lamp (e.g., an LED tube lamp) according to one embodiment. As shown in FIG. 19, the power supply module of the LED lamp includes rectifying circuits 510 and 540, a filtering circuit 520, and an LED driving circuit 1530, wherein an LED lighting module 530 includes the driving circuit 1530 and an LED module 630. According to the above description in FIG. 14E, driving circuit 1530 in FIG. 19 comprises a DC-to-DC converter circuit, and is coupled to filtering output terminals 521 and 522 to receive a filtered signal and then perform power conversion for converting the filtered signal into a driving signal at driving output terminals 1521 and 1522. The LED module 630 is coupled to driving output terminals 1521 and 1522 to receive the driving signal for emitting light. In some embodiments, the current of LED module 630 is stabilized at an objective current value. Exemplary descriptions of this LED module 630 are the same as those provided above with reference to FIGS. 18A-18B.

It's worth noting that rectifying circuit 540 is an optional element and therefore can be omitted, so it is depicted in a dotted line in FIG. 19. Therefore, the power supply module of the LED lamp in this embodiment can be used with a single-end power supply coupled to one end of the LED lamp, and can be used with a dual-end power supply coupled to two ends of the LED lamp. With a single-end power supply, examples of the LED lamp include an LED light bulb, a personal area light (PAL), etc.

With reference back to FIGS. 7 and 8, a short circuit board 253 includes a first short circuit substrate and a second short circuit substrate respectively connected to two terminal portions of a long circuit sheet 251, and electronic components of the power supply module are respectively disposed on the first short circuit substrate and the second short circuit substrate. The first short circuit substrate may be referred to as a first power supply substrate, or first end cap substrate. The second short circuit substrate may be referred to as a second power supply substrate, or second end cap substrate. The first power supply substrate and second power substrate may be separate substrates at different ends of an LED tube lamp.

The first short circuit substrate and the second short circuit substrate may have roughly the same length, or different lengths. In some embodiments, a first short circuit substrate (e.g. the right circuit substrate of short circuit board 253 in FIG. 7 and the left circuit substrate of short circuit board 253 in FIG. 8) has a length that is about 30%-80% of the length of the second short circuit substrate (i.e. the left circuit substrate of short circuit board 253 in FIG. 7 and the right circuit substrate of short circuit board 253 in FIG. 8). In some embodiments the length of the first short circuit substrate is about ⅓~⅔ of the length of the second short circuit substrate. For example, in one embodiment, the length of the first short circuit substrate may be about half the length of the second short circuit substrate. The length of the second short circuit substrate may be, for example in the range of about 15 mm to about 65 mm, depending on actual application occasions. In certain embodiments, the first short circuit substrate is disposed in an end cap at an end of the LED tube lamp, and the second short circuit substrate is disposed in another end cap at the opposite end of the LED tube lamp.

Some or all capacitors of the driving circuit in the power supply module may be arranged on the first short circuit substrate of short circuit board 253, while other components such as the rectifying circuit, filtering circuit, inductor(s) of the driving circuit, controller(s), switch(es), diodes, etc. are arranged on the second short circuit substrate of short circuit board 253. Since inductors, controllers, switches, etc. are electronic components with higher temperature, arranging some or all capacitors on a circuit substrate separate or away from the circuit substrate(s) of high-temperature components helps prevent the working life of capacitors (especially electrolytic capacitors) from being negatively affected by the high-temperature components, thus improving the reliability of the capacitors. Further, the physical separation between the capacitors and both the rectifying circuit and filtering circuit also contributes to reducing the problem of EMI.

In some embodiments, the driving circuit has power conversion efficiency of 80% or above, which may in some embodiments be 90% or above, and may in some embodiments be 92% or above. Therefore, without the driving circuit, luminous efficacy of the LED lamp according to some embodiments may preferably be 120 lm/W or above, and may even more preferably be 160 lm/W or above. On the other hand, with the driving circuit in combination with the LED component(s), luminous efficacy of the LED lamp may preferably be, in some embodiments, 120 lm/W*90%=108 lm/W or above, and may even more preferably be, in some embodiments 160 lm/W*92%=147.2 lm/W or above.

In view of the fact that the diffusion film or layer in an LED tube lamp generally has light transmittance of 85% or above, luminous efficacy of the LED tube lamp in some embodiments is 108 lm/W*85%=91.8 lm/W or above, and may be, in some more effective embodiments, 147.2 lm/W*85%=125.12 lm/W.

Figure 20A:
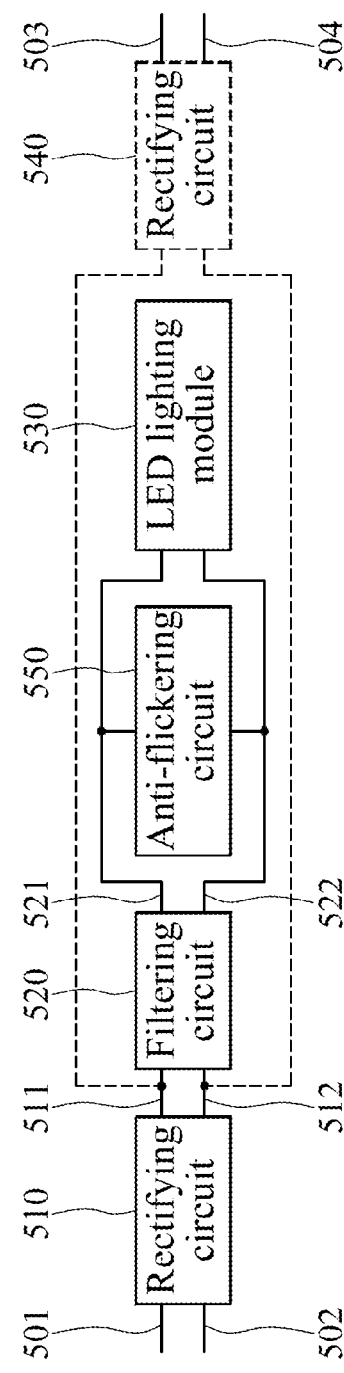
FIG. 20A is a block diagram of an LED lamp according to some embodiments.

FIG. 20A is a block diagram of an LED lamp according to an embodiment. Compared to FIG. 19, the embodiment of FIG. 20A includes rectifying circuits 510 and 540, and a filtering circuit 520, and further includes an anti-flickering circuit 550; wherein the power supply module may also include some components of an LED lighting module 530. The anti-flickering circuit 550 is coupled between filtering circuit 520 and LED lighting module 530. It's noted that rectifying circuit 540 may be omitted, as is depicted by the dotted line in FIG. 20A.

Anti-flickering circuit 550 is coupled to filtering output terminals 521 and 522, to receive a filtered signal, and under specific circumstances to consume partial energy of the filtered signal so as to reduce (the incidence of) ripples of the filtered signal disrupting or interrupting the light emission of the LED lighting module 530. In general, filtering circuit 520 has such filtering components as resistor(s) and/or inductor(s), and/or parasitic capacitors and inductors, which may form resonant circuits. Upon breakoff or stop of an AC power signal, as when the power supply of the LED lamp is turned off by a user, the amplitude(s) of resonant signals in the resonant circuits will decrease with time. But LEDs in the LED module of the LED lamp are unidirectional conduction devices and require a minimum conduction voltage for the LED module. When a resonant signal's trough value is lower than the minimum conduction voltage of the LED module, but its peak value is still higher than the minimum conduction voltage, the flickering phenomenon will occur in light emission of the LED module. In this case anti-flickering circuit 550 works by allowing a current matching a defined flickering current value of the LED component to flow through, consuming partial energy of the filtered signal which should be higher than the energy difference of the resonant signal between its peak and trough values, so as to reduce the flickering phenomenon. In certain embodiments, the anti-flickering circuit 550 may operate when the filtered signal's voltage approaches (and is still higher than) the minimum conduction voltage.

It's worth noting that anti-flickering circuit 550 may be more suitable for the situation in which LED lighting module 530 doesn't include driving circuit 1530, for example, when LED module 630 of LED lighting module 530 is (directly) driven to emit light by a filtered signal from a filtering circuit. In this case, the light emission of LED module 630 will directly reflect variation in the filtered signal due to its ripples. In this situation, the introduction of anti-flickering circuit 550 will prevent the flickering phenomenon from occurring in the LED lamp upon the breakoff of power supply to the LED lamp.

Figure 20B:
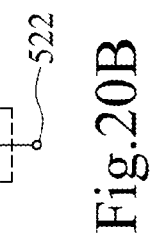
FIG. 20B is a schematic diagram of an anti-flickering circuit according to some embodiments.

FIG. 20B is a schematic diagram of the anti-flickering circuit according to an embodiment. Referring to FIG. 20B, anti-flickering circuit 650 includes at least a resistor, such as two resistors connected in series between filtering output terminals 521 and 522. In this embodiment, anti-flickering circuit 650 in use consumes partial energy of a filtered signal continually. When in normal operation of the LED lamp, this partial energy is far lower than the energy consumed by LED lighting module 530. But upon a breakoff or stop of the power supply, when the voltage level of the filtered signal decreases to approach the minimum conduction voltage of LED module 630, this partial energy is still consumed by anti-flickering circuit 650 in order to offset the impact of the resonant signals which may cause the flickering of light emission of LED module 630. In some embodiments, a current equal to or larger than an anti-flickering current level may be set to flow through anti-flickering circuit 650 when LED module 630 is supplied by the minimum conduction voltage, and then an equivalent anti-flickering resistance of anti-flickering circuit 650 can be determined based on the set current.

FIG. 21A is a block diagram of an LED lamp according to an embodiment. Compared to FIG. 19, the embodiment of FIG. 21A includes rectifying circuits 510 and 540, a filtering circuit 520, and a driving circuit 1530, and further includes a mode switching circuit 580; wherein an LED lighting module 530 is composed of driving circuit 1530 and an LED module 630. Mode switching circuit 580 is coupled to at least one of filtering output terminals 521 and 522 and at least one of driving output terminals 1521 and 1522, for determining whether to perform a first driving mode or a second driving mode, as according to a frequency of the external driving signal. In the first driving mode, a filtered signal from filtering circuit 520 is input into driving circuit 1530, while in the second driving mode the filtered signal bypasses at least a component of driving circuit 1530, making driving circuit 1530 stop working in conducting the filtered signal, allowing the filtered signal to (directly) reach and drive LED module 630. The bypassed component(s) of driving circuit 1530 may include an inductor or a switch, which when bypassed makes driving circuit 1530 unable to transfer and/or convert power, and then stop working in conducting the filtered signal. If driving circuit 1530 includes a capacitor, the capacitor can still be used to filter out ripples of the filtered signal in order to stabilize the voltage across the LED module. When mode switching circuit 580 determines on performing the first driving mode, allowing the filtered signal to be input to driving circuit 1530, driving circuit 1530 then transforms the filtered signal into a driving signal for driving LED module 630 to emit light. On the other hand, when mode switching circuit 580 determines on performing the second driving mode, allowing the filtered signal to bypass driving circuit 1530 to reach LED module 630, filtering circuit 520 then becomes in effect a driving circuit for LED module 630. Then filtering circuit 520 provides the filtered signal as a driving signal for the LED module for driving the LED module to emit light.

It's worth noting that mode switching circuit 580 can determine whether to perform the first driving mode or the second driving mode based on a user's instruction or a detected signal received by the LED lamp through pins 501, 502, 503, and 504. In some embodiments, a mode determination circuit 590 is used to determine the first driving mode or the second driving mode based on a signal received by the LED lamp and so the mode switching circuit 580 can determine whether to perform the first driving mode or the second driving mode based on a determined result signal S580 or/and S585. With the mode switching circuit, the power supply module of the LED lamp can adapt to or perform one of appropriate driving modes corresponding to different application environments or driving systems, thus improving the compatibility of the LED lamp. In some embodiments, rectifying circuit 540 may be omitted, as is depicted by the dotted line in FIG. 21A.

FIG. 21B is a schematic diagram of a mode determination circuit in an LED lamp according to an embodiment. Referring to FIG. 21B, the mode determination circuit 690 comprises a symmetrical trigger diode 691 and a resistor 692, configured to detect a voltage level of an external driving signal. The symmetrical trigger diode 691 and the resistor 692 are connected in series; and namely, one end of the symmetrical trigger diode 691 is coupled to the first filtering output terminal 521, the other end thereof is coupled to one end of the resistor 692, and the other end of the resistor 692 is coupled to the second filtering output terminal 522. A connection node of the symmetrical trigger diode 691 and the resistor 692 generates a determined result signal S580 transmitted to a mode switching circuit. When an external driving signal is a signal with high frequency and high voltage, the determined result signal S580 is at a high voltage level to make the mode switching circuit determine to operate at the second driving mode. For example, when the lamp driving circuit 505, as shown in FIG. 14A and FIG. 14D, exists, the lamp driving circuit 505 converts the AC power signal of the AC power supply 508 into an AC driving signal with high frequency and high voltage, transmitted into the LED tube lamp 500. At this time, the mode switching circuit determines to operate at the second driving mode and so the filtered signal, outputted by a first filtering output terminal 521 and a second filtering output terminal 522, directly drive the LED module 630 to light. When the external driving signal is a signal with low frequency and low voltage, the determined result signal S580 is at a low voltage level to make the mode switching circuit determine to operate at the first driving mode. For example, when the lamp driving circuit 505, as shown in FIG. 14A and FIG. 14D, does not exist, the AC power signal of the AC power supply 508 is directly transmitted into the LED tube lamp 500. At this time, the mode switching circuit determines to operate at the first driving mode and so the filtered signal, outputted by the first filtering output terminal 521 and the second filtering output terminal 522, is converted into an appropriate voltage level to drive the LED module 630 to light.

In some embodiments, a breakover voltage of the symmetrical trigger diode 691 is in a range of 400V~1300V, in some embodiments more specifically in a range of 450V~700V, and in some embodiments more specifically in a range of 500V~600V.

The mode determination circuit 690 may include a resistor 693 and a switch 694. The resistor 693 and the switch 694 could be omitted based on the practice application, thus the resistor 693 and the switch 694 and a connection line thereof are depicted in a dotted line in FIG. 21B. The resistor 693 and the switch 694 are connected in series; namely one end of the resistor 693 is coupled to the first filtering output terminal 521, the other end is coupled to one end of the switch 694, and another end of the switch 694 is coupled to a second filtering output terminal 522. A control end of the switch 694 is coupled to the connection node of the symmetrical trigger diode 691 and the resistor 692 for receiving the determined result signal S580. Accordingly, a connection node of the resistor 693 and the switch 694 generates another determined result signal S585. The determined result signal S585 is an inverted signal of the determined result signal S580 and so they could be applied to a mode switching circuit having switches for switching between two modes.

Figure 22A:
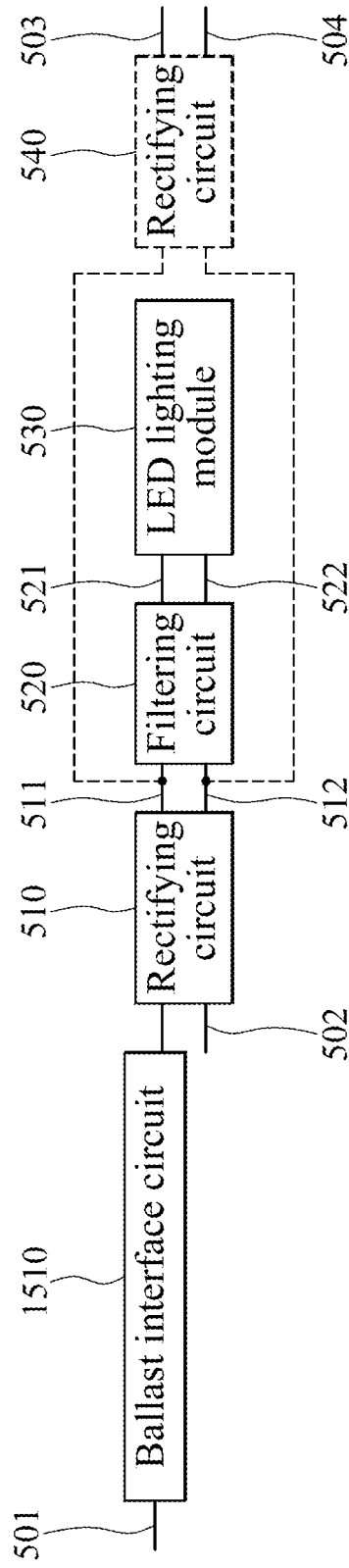
FIG. 22A is a block diagram of an LED lamp according to some embodiments.

FIG. 21C is a schematic diagram of a mode determination circuit in an LED lamp according to an embodiment. Referring to FIG. 21C, the mode determination circuit 790 includes a capacitor 791, resistors 791 and 793, and a switch 794. The capacitor 791 and the resistor 792 are connected in series as a frequency determination circuit 795 for detecting a frequency of an external driving signal. One end of the capacitor 792 is coupled to a first rectifying output terminal 511, the other end is coupled to one end of the resistor 791, and the other end of the resistor 791 is coupled to a second rectifying output terminal 512. The frequency determination circuit 795 generates the determined result signal S580 at a connection node of the resistor 791 and the capacitor 792. A voltage level of the determined result signal S580 is determined based on the frequency of the external driving signal. In some embodiments, the higher the frequency of the external driving signal is, the higher the voltage level of the determined result signal S580 is, and the lower the frequency of the external driving signal is, the lower the voltage level of the determined result signal S580 is. Hence, when the external driving signal is a higher frequency signal (e.g.: more than 20 KHz) and high voltage, the determined result signal S580 is at high voltage level to make the mode switching circuit determine to operate at second driving mode. When the external driving signal is a lower frequency signal and low voltage signal, the determined result signal S580 is at a low voltage level to make the mode switching circuit determine to operate at first driving mode. Similarly, in some embodiments, the mode determination circuit 790 may include a resistor 793 and a switch 794. The resistor 793 and the switch 794 are connected in series between the first filtering output terminal 521 and the second filtering output terminal 522, and a control end of the switch 794 is coupled to the frequency determination circuit 795 to receive the determined result signal S580. Accordingly, another determined result signal S585 is generated at a connection node of the resistor 793 and the switch 794 and is an inverted signal of the determined result signal S580. The determined result signals S580 and S585 may be applied to a mode switching circuit having two switches. The resistor 793 and the switch 794 could be omitted based on practice application and so are depicted in a dotted line FIG. 22A is a block diagram of an LED lamp according to one embodiment. Compared to FIG. 14E, the embodiment of FIG. 22A includes rectifying circuits 510 and 540, and a filtering circuit 520, and further includes a ballast interface circuit 1510; wherein the power supply module may also include some components of an LED lighting module 530. The ballast interface circuit 1510 is coupled to (the first) rectifying circuit 510, and may be coupled between pin 501 and/or pin 502 and rectifying circuit 510. This embodiment is explained assuming the ballast interface circuit 1510 to be coupled between pin 501 and rectifying circuit 510. With reference to FIGS. 14A and 14D in addition to FIG. 22A, in one embodiment, lamp driving circuit 505 comprises a ballast configured to provide an AC driving signal to drive the LED lamp.

In an initial stage upon the activation of the driving system of lamp driving circuit 505, lamp driving circuit 505's ability to output relevant signal(s) initially takes time to rise to a standard state, and at first has not risen to that state. However, in the initial stage the power supply module of the LED lamp instantly or rapidly receives or conducts the AC driving signal provided by lamp driving circuit 505, which initial conduction is likely to fail the starting of the LED lamp by lamp driving circuit 505 as lamp driving circuit 505 is initially loaded by the LED lamp in this stage. For example, internal components of lamp driving circuit 505 may retrieve power from a transformed output in lamp driving circuit 505, in order to maintain their operation upon the activation. In this case, the activation of lamp driving circuit 505 may end up failing as its output voltage could not normally rise to a required level in this initial stage; or the quality factor (Q) of a resonant circuit in lamp driving circuit 505 may vary as a result of the initial loading from the LED lamp, so as to cause the failure of the activation.

In one embodiment, in the initial stage upon activation, ballast interface circuit 1510 will be in an open-circuit state, preventing the energy of the AC driving signal from reaching the LED module. After a defined delay, which may be a specific delay period, after the AC driving signal as an external driving signal is first input to the LED tube lamp, ballast interface circuit 1510 switches, or changes, from a cutoff state during the delay to a conducting state, allowing the energy of the AC driving signal to start to reach the LED module. By means of the delayed conduction of ballast interface circuit 1510, operation of the LED lamp simulates the lamp-starting characteristics of a fluorescent lamp. For example, during lamp starting of a fluorescent lamp, internal gases of the fluorescent lamp will normally discharge for light emission after a delay upon activation of a driving power supply. Therefore, ballast interface circuit 1510 further improves the compatibility of the LED lamp with lamp driving circuits 505 such as an electronic ballast. In this manner, ballast interface circuit 1510, which may be described as a delay circuit, or an external signal control circuit, is configured to control and controls the timing for receiving an AC driving signal at a power supply module of an LED lamp (e.g., at a rectifier circuit and/or filter circuit of a power supply module).

In this embodiment, rectifying circuit 540 may be omitted and is therefore depicted by a dotted line in FIG. 22A.

It's noted that in the embodiments using the ballast interface circuit described with reference to FIGS. 22A~F in this disclosure, upon the external driving signal being initially input at the first pin and second pin (e.g., upon inserting or plugging an LED lamp into a socket), the ballast interface circuit will not enter a conduction state until a period of delay passes. In some embodiments, the period may be between about 10 milliseconds (ms) and about 1 second. More specifically, in some embodiments, the period may be between about 10 ms and about 300 ms.

Figure 22B:
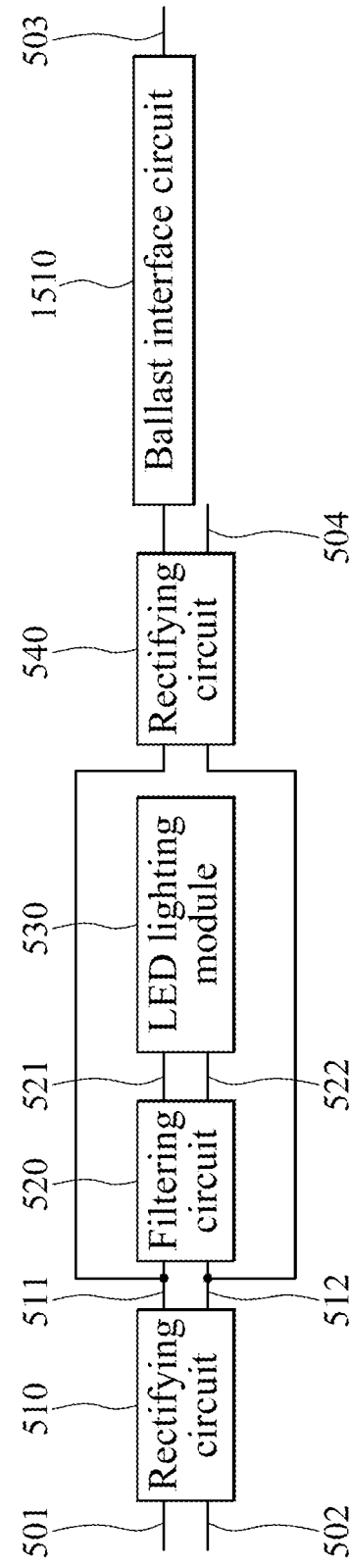
FIG. 22B is a block diagram of an LED lamp according to some embodiments.

FIG. 22B is a block diagram of an LED lamp according to one embodiment. Compared to FIG. 22A, ballast interface circuit 1510 in the embodiment of FIG. 22B is coupled between pin 503 and/or pin 504 and rectifying circuit 540. As explained regarding ballast interface circuit 1510 in FIG. 22A, ballast interface circuit 1510 in FIG. 22B performs the function of delaying the starting of the LED lamp, or causing the input of the AC driving signal to be delayed for a predefined time, in order to prevent the failure of starting by lamp driving circuits 505 such as an electronic ballast.

Apart from coupling ballast interface circuit 1510 between terminal pin(s) and rectifying circuit in the above embodiments, ballast interface circuit 1510 may alternatively be included within a rectifying circuit with a different structure. FIG. 22C illustrates an arrangement with a ballast interface circuit in an LED lamp according to an exemplary embodiment. Referring to FIG. 22C, the rectifying circuit has the circuit structure of rectifying circuit 810 in FIG. 15C. Rectifying circuit 810 includes rectifying unit 815 and terminal adapter circuit 541. Rectifying unit 815 is coupled to pins 501 and 502, terminal adapter circuit 541 is coupled to filtering output terminals 511 and 512, and the ballast interface circuit 1510 in FIG. 22C is coupled between rectifying unit 815 and terminal adapter circuit 541. In this case, in the initial stage upon activation of the ballast, an AC driving signal as an external driving signal is input to the LED tube lamp, where the AC driving signal can only reach rectifying unit 815, but cannot reach other circuits such as terminal adapter circuit 541, other internal filter circuitry, and the LED lighting module. Moreover, parasitic capacitors associated with rectifying diodes 811 and 812 within rectifying unit 815 are quite small in capacitance and may be ignored. Accordingly, lamp driving circuit 505 in the initial stage isn't loaded with or effectively connected to the equivalent capacitor or inductor of the power supply module of the LED lamp, and the quality factor (Q) of lamp driving circuit 505 is therefore not adversely affected in this stage, resulting in a successful starting of the LED lamp by lamp driving circuit 505. For example, the first rectifying circuit 510 may comprise a rectifying unit 815 and a terminal adapter circuit 541, and the rectifying unit is coupled to the terminal adapter circuit and is capable of performing half-wave rectification. In this example, the terminal adapter circuit is configured to transmit the external driving signal received via at least one of the first pin and the second pin.

It's worth noting that in one embodiment, under the condition that terminal adapter circuit 541 doesn't include components such as capacitors or inductors, interchanging rectifying unit 815 and terminal adapter circuit 541 in position, meaning rectifying unit 815 is connected to filtering output terminals 511 and 512 and terminal adapter circuit 541 is connected to pins 501 and 502, doesn't affect or alter the function of ballast interface circuit 1510.

Further, as explained in FIGS. 15A-15D, when a rectifying circuit is connected to pins 503 and 504 instead of pins 501 and 502, this rectifying circuit may constitute the rectifying circuit 540. For example, the circuit arrangement with a ballast interface circuit 1510 in FIG. 22C may be alternatively included in rectifying circuit 540 instead of rectifying circuit 810, without affecting the function of ballast interface circuit 1510.

In some embodiments, as described above terminal adapter circuit 541 doesn't include components such as capacitors or inductors. Or when rectifying circuit 610 in FIG. 15A constitutes the rectifying circuit 510 or 540, parasitic capacitances in the rectifying circuit 510 or 540 are quite small and may be ignored. These conditions contribute to not affecting the quality factor of lamp driving circuit 505.

FIG. 22D is a block diagram of an LED lamp according to an embodiment. Compared to the embodiment of FIG. 22A, ballast interface circuit 1510 in the embodiment of FIG. 22D is coupled between rectifying circuit 540 and filtering circuit 520. Since rectifying circuit 540 also doesn't include components such as capacitors or inductors, the function of ballast interface circuit 1510 in the embodiment of FIG. 22D will not be affected.

Figure 22E:
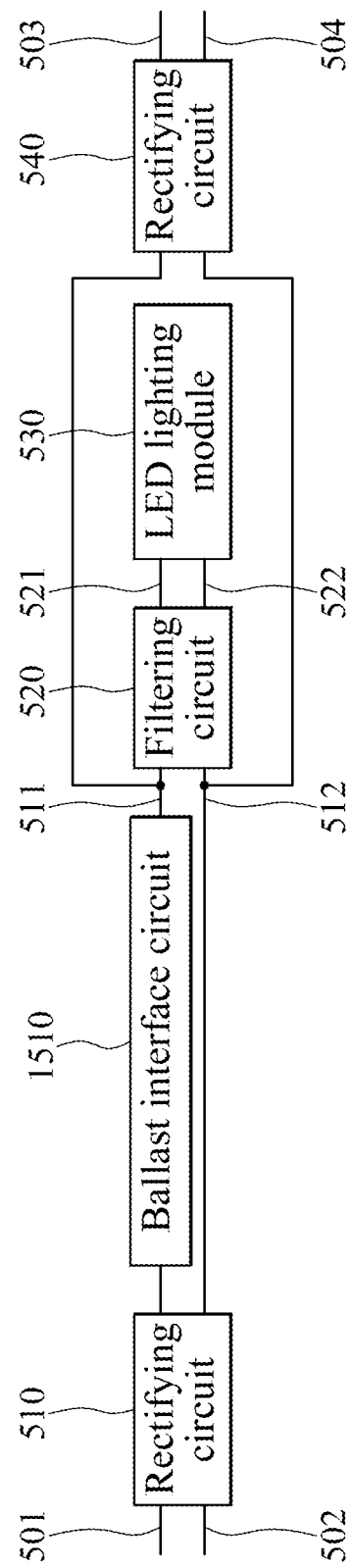
FIG. 22E is a block diagram of an LED lamp according to some embodiments.

FIG. 22E is a block diagram of an LED lamp according to an embodiment. Compared to the embodiment of FIG. 22A, ballast interface circuit 1510 in the embodiment of FIG. 22E is coupled between rectifying circuit 510 and filtering circuit 520. Similarly, since rectifying circuit 510 doesn't include components such as capacitors or inductors, the function of ballast interface circuit 1510 in the embodiment of FIG. 22E will not be affected. Still, under the configuration shown in FIG. 22E, the reception of a driving signal for driving an LED lamp (in this case a rectified driving signal) can be delayed. For example, in FIG. 22E, the reception of a driving signal at a filter circuit 520 may be delayed after the LED lamp is plugged in. The delay may be controlled by a ballast interface circuit.

As disclosed herein, the LED tube lamp may comprise a light strip attached to an inner surface of the lamp tube and which comprises a bendable circuit sheet. And the LED lighting module may comprise an LED module, which comprises an LED component (e.g., an LED or group of LEDs) and is disposed on the bendable circuit sheet. The ballast interface circuit may be between a ballast of an external power supply and the LED lighting module and/or LED module of the LED tube lamp. The ballast interface circuit may be configured to receive a signal derived from the external driving signal. For example, the signal may be a filtered signal passed through a rectifying circuit and a filtering circuit.

Figure 22F:
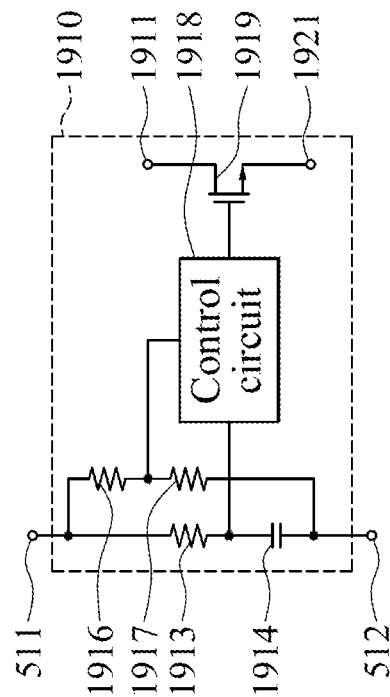
FIG. 22F is a schematic diagram of a ballast interface circuit according to some embodiments.

Referring to FIG. 22F, the ballast interface circuit 1910 comprises resistors 1913, 1916 and 1917, a capacitor 1914, a control circuit 1918, and a switch 1919. One end of the resistor 1913 is coupled to a first rectifying output terminal 511, the other end is coupled to one end of the capacitor 1914, and the other end of the capacitor 1914 is coupled to a second rectifying output terminal 512. A connection node of the resistor 1913 and the capacitor 1914 is coupled to the control circuit 1918 to provide power to the control circuit 1918 for operation. The resistors 1916 and 1917 are connected in series between the first rectifying output terminal 511 and the second rectifying output terminal 512, and generates a detection signal indicative of an external AC signal based on a voltage level of a rectified signal to the control circuit 1918. A control end of the switch 1919 is coupled to the control circuit 1918, and is turned on/off based on the control of the control circuit 1918. Two ends of the switch 1919 are coupled to ballast interface circuit terminals 1911 and 1921.

When the control circuit 1918 determines that the voltage level of the detection signal, generated by the resistors 1916 and 1917, is lower than a high determination level, the control circuit 1918 cuts the switch 1919 off. When the electronic ballast has just started, the voltage level of the output AC signal is not high enough and so the voltage level of detection signal is lower than the high determination level, the control circuit 1918 controls the switch 1919 on an open-circuit state. At this moment, the LED is open-circuited and stops operating. When the voltage level of the output AC signal rises to reach a sufficient amplitude (which is a defined level) in a time period, the voltage level of the detection signal is cyclically higher than the high determination level, the control circuit 1918 controls the switch 1919 to keep on a conduction state, and so the LED operates normally.

When an electronic ballast is applied, a level of an AC signal generated by the electronic ballast may range from about 200 to about 300 volts during the starting period (e.g., a time period shorter than 100 ms), and usually range from about 20 to about 30 ms and then the electronic ballast enters an normal state and the level of the AC signal is raised above the 300 volts. In some embodiments, a resistance of the resistor 1916 may range from about 200K to about 500K ohms; and in some embodiments from about 300K to about 400K ohms; a resistance of the resistor 1917 may range from about 0.5K to about 4 Kohms, and in some embodiments range from about 1.0K to 3K ohms; the high determination level may range from 0.9 to 1.25 volts, and in some embodiments be about 1.0 volts.

It is worth noting that the ballast interface circuit could be applicable to detect the inductive ballast. A characteristic of the inductive ballast is its current or voltage periodically crosses zero value as the current or voltage signal proceeds with time. When the inductive ballast is applied, the level of the detection signal generated by the resistors 1916 and 1917 is lower than a low determination level during the starting period powered by the commercial power, the control circuit 2018 controls the switch 1919 to keep on the conduction state and the LED tube lamp operates normally. In some embodiments, the low determination level is lower than 0.2 volts, and in some embodiments lower than 0.1 volts.

For example, in some embodiments, during the starting period, if the detection signal is higher than the low determination level and lower than the high determination level (the high determination level is higher than the low determination level), the control circuit 2018 controls the switch 1919 to be cut off. On the other hand, when the detection signal is lower than the low determination level or higher than the high determination level, the control circuit 2018 controls the switch 1919 to be conducted continuously. Hence, the LED tube lamp using the ballast interface circuit can normally operate to emit light regardless of whether the electronic ballast or the inductive ballast is applied.

The resistors 1916 and 1917 are used to detect the level of the external AC signal, and in certain applications, a frequency detection circuit may be used to replace the voltage detection circuit of the resistors 1916 and 1917. In general, the output signal of the electronic ballast has a frequency higher than 20 Khz, and that of the inductive ballast is lower than 400 Hz. By setting an appropriate frequency value, the frequency detection circuit could properly determine that an electronic ballast or an inductive ballast is applied, and so make the LED tube lamp operate normally to emit light.

On another aspect, to prevent the current through the switch 1919 (between ballast-compatible circuit terminals 1911 and 1921) to be excessive (which increases the risk of damaging switch 1919 or shortening its life) due to the magnitude of current coming from the LED unit 632 to ballast-compatible circuit terminal 1911 or 1921, a transistor such as a bipolar junction transistor (not shown in the Figs.) may be coupled in parallel to the switch 1919, wherein the bipolar junction transistor is configured to divert some current from flowing through the switch 1919 when the current through the switch 1919 reaches a threshold value. For example, the bipolar junction transistor has its collector terminal connected to the ballast-compatible circuit terminal 1911, has its emitter terminal connected to a reference voltage or the second rectifying output terminal 512, and has its base terminal connected to the ballast-compatible circuit terminal 1911; and a resistor is connected between the base and emitter terminals of the bipolar junction transistor. In this case, the current from the LED unit 632 typically flows through the switch 1919 and the added resistor in a circuit path, causing a voltage drop across the resistor. When the voltage across the resistor or between the base and emitter terminals of the bipolar junction transistor increases sufficiently (to about 0.7V) to cause the bipolar junction transistor to conduct current, the bipolar junction transistor provides more circuit path for the current flowing out of the switch 1919 and the added resistor, thus achieving the purpose of reducing or limiting the current through the switch 1919.

Figure 23A:
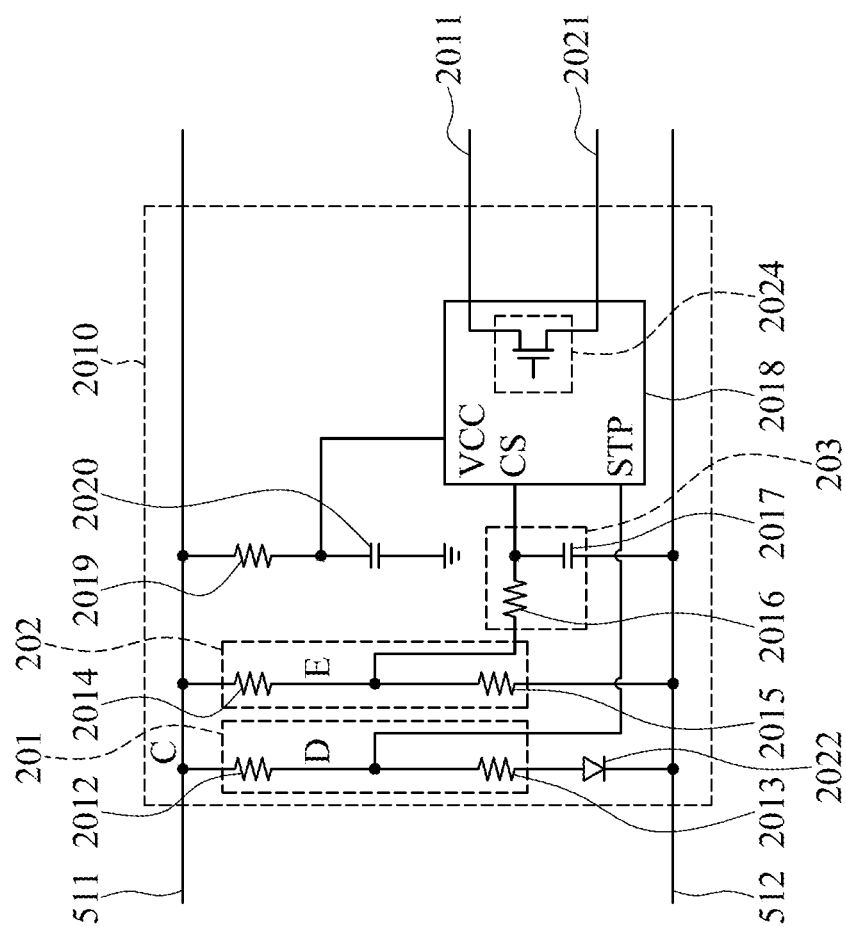
FIG. 23A is a block diagram of a mode determination circuit according to some embodiments.
Figure 23B:
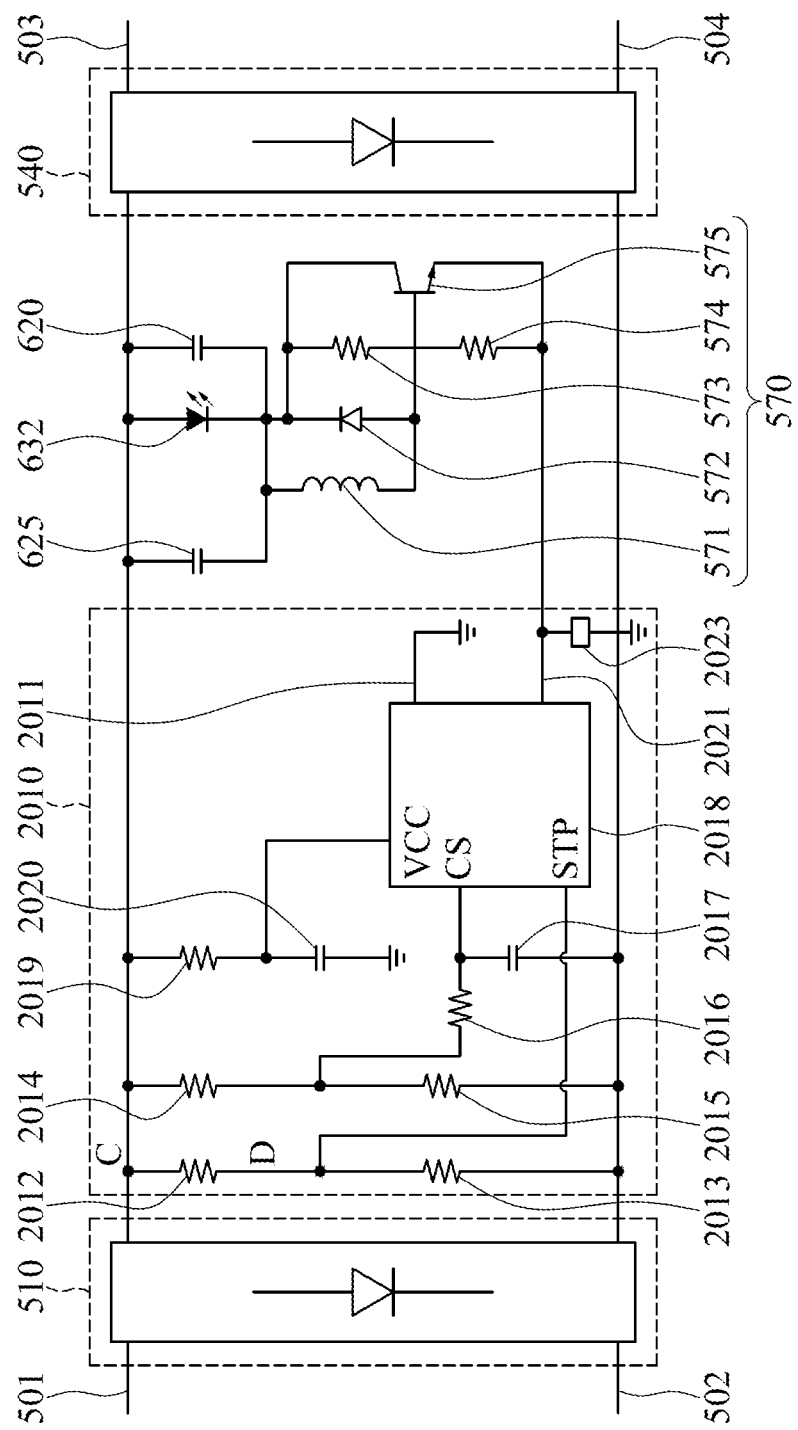
FIG. 23B is a block diagram of an LED tube lamp according to some embodiments.

FIG. 23A is a block diagram of a mode determination circuit according to some embodiments. FIG. 23B is a block diagram of an LED tube lamp including the exemplary mode determination circuit of FIG. 23A according to some embodiments. Referring to FIGS. 23A and 23B, mode determination circuit 2010 is coupled to the rectifying circuit, for receiving the rectified signal. The mode determination circuit 2010 has two functions of allowing a continual current to flow through the LED unit 632 and regulating the continuity of current to flow through the LED unit 632. The mode determination circuit 2010 detects a state of a property of the rectified signal and selectively determining on performing a first mode or a second mode of lighting according to the state of the property of the rectified signal. When performing the first mode of lighting, the mode determination circuit 2010 allows a continual current, which in some embodiments may be a continuous current without cessation, to flow through the LED unit until the external driving signal is disconnected from the LED tube lamp. When performing the second mode of lighting, the mode determination circuit 2010 regulates the continuity of current to flow through the LED unit, for example by allowing a discontinuous current to flow through the LED unit.

The mode determination circuit 2010 includes a first voltage divider 201, a second voltage divider 202, a resistor 2019, a capacitor 2020 and a control circuit 2018. The first voltage divider 201 includes a first resistor depicted in FIGS. 23A and 23B as resistor 2012, and a second resistor depicted in FIGS. 23A and 23B as resistor 2013. The resistor 2012 is connected to the resistor 2013 between the first output terminal 511 and the second output terminal 512. The second voltage divider 202 includes a third resistor depicted in FIGS. 23A and 23B as resistor 2014, and a fourth resistor depicted in FIGS. 23A and 23B as resistor 2015. The resistor 2014 is connected to the resistor 2015 between the first output terminal 511 and the second output terminal 512. The control circuit 2018 is coupled between the first voltage divider 201 and the LED unit 632, and the control circuit 2018 is also coupled between the second voltage divider 202 and the LED unit 632.

In some embodiments, the control circuit 2018 may be any circuit that has a function of controlling, for instance, a CPU or a MCU. The control circuit 2018 in this embodiment is an IC module having an input terminal VCC, an input terminal STP, an input terminal CS, a output terminal 2011 and a output terminal 2021. The input terminal VCC is connected to a connection node between the resistor 2019 and the capacitor 2020 for obtaining power from the rectifying circuit 510 for operation of the IC module. The output terminal 2011 is connected to a reference voltage such as the ground potential. The second output terminal 2021 is coupled to the LED unit 632. The first voltage divider 201 is used for receiving the rectified signal from the rectifying circuit 510 to produce a first fraction voltage of the rectified signal at a connection node D between the resistor 2012 and the resistor 2013. The terminal STP is connected to the connection node D. The control circuit 2018 receives the first fraction voltage at the terminal STP and determines whether to perform the first mode of lighting according to the first fraction voltage. In the first mode of lighting, the control circuit 2018 provides a continuous current at the output terminal 202 to allow the continual current to flow through the LED unit 632. The second voltage divider 202 is used for receiving the rectified signal from the rectifying circuit 510 to produce a second fraction voltage of the rectified signal at a connection node E between the resistor 2014 and the resistor 2015. The terminal CS is connected to the connection node E. The control circuit 2018 receives the second fraction voltage at the terminal CS and determines whether to perform the second mode of lighting according to the second fraction voltage. In the second mode of lighting, the control circuit 2018 provides a discontinuous current to regulate the continuity of the current to the LED unit 632.

In some embodiments, the control circuit 2018 includes a switching circuit 2024. The switching circuit 2024 is connected to the output terminals 2011 and 2021 to achieve the functions of allowing the continual current to the LED unit 632 and regulating the continuity of current to the LED unit 632. When performing the first mode of lighting, the control circuit 2018 allows the continuous current to flow through the LED unit 632 by continuously turning on the switching circuit 2024. When performing the second mode of lighting, the control circuit 2018 allows the discontinuous current to flow through the LED unit 632 by alternately turning on and off the switching circuit 2024.

The switching circuit 2024 may include an electronic switch such as a transistor. The transistor may be a MOSFET, wherein the source terminal of the MOSFET is connected to the terminal 2011 to connect to a reference voltage such as the ground potential, and the drain terminal of the MOSFET is connected to the terminal 2021 to couple to the LED unit 632. Accordingly, in the first and second modes of lighting the control circuit 2018 allows the continuous current to flow to the LED unit 632 by continuously turning on the MOSFET, and the control circuit 2018 allows the discontinuous current to flow to the LED unit 632 by alternately turning on and off the MOSFET.

In some embodiments, the switching circuit 2024 may be a component of the LED tube lamp not included in control circuit 2018. If the LED tube lamp further includes the switching circuit 2024, the switching circuit 2024 is coupled between the control circuit 2018 and the LED unit 632.

Accordingly, upon the LED lighting tube lamp being supplied by an electrical ballast, the control circuit 2018 receives the first fraction voltage at the terminal STP and determines whether the first fraction voltage is in the first voltage range. If the first fraction voltage is in the first voltage range, the control circuit 2018 continuously turns on the switching circuit 2024 to allow a continuous current to flow through the LED unit 632 to perform the first mode of lighting. In addition, the control circuit 2018 receives the second fraction voltage at the terminal CS and determines whether the second fraction voltage is in the second voltage range. If the second fraction voltage is in the second voltage range, the control circuit 2018 alternately turns on and off the switching circuit 2024 to allow the discontinuous current to flow through the LED unit to perform the second mode of lighting. The control circuit 2018 performs the first mode and second mode of lighting until the external driving signal is disconnected from the LED tube lamp. Once the LED tube lamp is started again, the control circuit 2018 determines again whether to perform the first mode or the second mode according to the first fraction voltage and the second fraction voltage of the rectified signal.

In some embodiments, the first voltage range is defined to encompass values less than a first voltage value or larger than a second voltage value which is larger than the first voltage value; Thereby, the control circuit 2018 performs the first mode of lighting if the first fraction voltage is greater than the second voltage value or less than the first voltage value. The first voltage value may be in some embodiments between 0 V and 0.5 V, and may be in some embodiments between 0 V and 0.1 V, and may be in some embodiments 0.1 V. The second voltage value is in some embodiments 1 V, and may be in some embodiments 1.2 V. The second voltage range is defined to encompass values larger than a third voltage value and less than a fourth voltage value which is larger than the third voltage value. The third voltage value may be in embodiments between 0.5 V and 0.85 V, and may be in some embodiments between 0.7 V and 0.8 V, and may be in some embodiments between 0.85 V and 1.0 V, and may be in some embodiments between 0.9 V and 0.98 V, and may be 0.95 V in some embodiments.

In some embodiments, the LED tube lamp further includes an RC circuit 203. The RC circuit 203 includes a resistor 2016 and a capacitor 2017. A first end of the resistor 2016 is connected to the connection node E. A second end of the resistor is connected to a first end of the capacitor 2017 and the control circuit 2018. A second end of the capacitor 2017 is connected to the second output terminal of the rectifying circuit 510. The RC circuit 203 is configured to receive the second fraction voltage at node E. When the second fraction voltage is in the second voltage range, the capacitor 2017 is charged and discharged repeatedly to produce a voltage variation at the first end of the capacitor 2017 to alternately turn on and off the switching circuit 2024 to allow the discontinuous current to flow through the LED unit 632. Resistance value of resistor 2016 may be between 0.5 K and 4K ohms, and may be in some embodiments between 1 K and 3 K ohms, and may be in some embodiments 1K. Capacitance value of the capacitor 2017 may be in some embodiments between 1 nF and 500 nF, and may be in some embodiments between 20 nF and 30 nF, and may be in some embodiments 4.7 nF.

In some embodiments, the RC circuit 203 may be disposed with the second voltage divider 202. That is, the second voltage divider 202 includes the resistors 2014 and 2015 and further includes the resistor 2016 and the capacitor 2017. In other embodiments, the RC circuit 203 may be a component of the control circuit 2018. The control circuit 2018 includes the IC module and further includes the resistor 2016 and the capacitor 2017. In this embodiment, the first end of the capacitor 2017 is connected to the switching circuit 2024 to control the switching circuit 2024.

Furthermore, in some embodiments, the RC circuit 203 may be replaced by a pulse width modulation circuit. The pulse width modulation circuit is coupled between the switching circuit 2024 and the connection node E. The pulse width modulation circuit is configured to receive the second fraction voltage and then produce a pulse signal with a duty-cycle responsive to the second fraction voltage, and the pulse signal is used to alternately turning on and off the switching circuit 2024 to allow the discontinuous current to flow to the LED unit 632.

In applications, when electronic ballast is applied, during the starting period (less than 100 ms, typically between about 20-30 ms) of the LED tube lamp, the voltage at node C may be between 200-300V, then the voltage at the node C rises when the ballast operates in steady state, causing the first fraction voltage at node D rise. When the second fraction voltage reaches the first voltage range, the switching circuit 2024 is turned on and being kept in conduction state. In this situation, a constant current is provided to the LED unit 632. In some embodiments, resistance values of resistors 2012 and 2013 may be 540 K ohms and 1 K ohms, respectively.

Similarly, when another type of the electronic ballast is applied, during the starting period, the second fraction voltage at node E may rise to reach the second voltage range when the electronic ballast operates in steady state. Then the switching circuit 2024 is alternately turned on and off by the RC circuit 203 or the pulse width modulation circuit. In this situation, a discontinuous current is provided to the LED unit 632. In some embodiments, resistance values of resistors 2014 and 2015 may be 420 K ohms and 1 K ohms, respectively.

When inductive ballast is applied, the characteristic of the inductive ballast is zero-cross. During the starting period of the LED tube lamp powered by the commercial power, the first fraction voltage produced by the first voltage divider 201 may be less than the first voltage value; this facilitates the switching circuit 2024 turned on and being kept in conducting state. The control circuit 2018 allows a constant current to flow to the LED unit 632.

In some embodiments, the mode determination circuit 2010 comprises a ballast interface circuit as an interface between the LED tube lamp and an electrical ballast used to supply the LED tube lamp. Accordingly, The LED tube lamp can be applied to or be supplied by each of an electronic ballast or an inductive ballast.

In addition, the mode determination circuit 2010 has another function of being open-circuit for a period during the initial stage of starting the LED tube lamp for preventing the energy of the AC driving signal from reaching the LED module 630. The mode determination circuit 2010 will not enter a conduction state until a period of delay passes. The period of delay may be a defined delay which is between about 10 milliseconds and about 1 second.

In some embodiments, the LED tube lamp may include essentially no current-limiting capacitor coupled in series with the LED unit 632. To a person of ordinary skill in the art, a capacitor having essentially or substantially no current limiting effect would exhibit similar properties as a conductive line or wire, and the reactive impedance of the current-limiting capacitor would be very small, which requires a relatively large capacitance of the current-limiting capacitor for a given frequency of signal on the current-limiting capacitor. In practice, to be regarded as the substantially non-current limiting capacitor, an equivalent current-limiting capacitance coupled in series with the LED unit 632 may be in a range similar to that of the capacitance of capacitor 825 in filtering circuit 520 shown in FIG. 17D (e.g., about 10 nF to 2 uF or 2000 nF mentioned in connection with capacitor 825 above), or in a range similar to that of the capacitance of an optional capacitor connected in parallel with the resistor 2013 in mode determination circuit 2010 (e.g., about 100 nF-500 nF mentioned below), both of the capacitor 825 and the optional capacitor in mode determination circuit 2010 are essentially coupled in series with the LED unit 632. The substantially non-current limiting capacitor may have a value so large as to present sufficiently low impedance/resistance to the received external driving signal to have only negligible effect on current flow to the LED unit 632. The actual intended value of the equivalent current-limiting capacitance coupled in series with the LED unit 632 is however dependent on the power supply system design of the LED tube lamp or the intended low level of the reactive impedance of the current-limiting capacitance coupled in series with the LED unit 632.

In some embodiments, in order to stabilize the voltage at the node D, the mode determination circuit 2010 may further comprise a capacitor connected in parallel with the resistor 2013. The capacitance of the capacitor may be in some embodiments between 100 nF and 500 nF, and may be in some embodiments between 200 nF to 300 nF, and may be in some embodiments 220 nF.

In some embodiments, the mode determination circuit 2010 may further comprises at least a diode 2022 coupled between the first voltage divider 201 and the second output terminal 502. The voltage drop of the diode 2022 when electrically conducting is larger than the first voltage value. Thereby, the voltage level at node D is always larger than the first voltage value, such that the mode determination circuit 2010 always performs the first mode of lighting with the first fraction voltage higher than the second voltage value.

In some embodiments, in order to increase a voltage rating of the IC module, the mode determination circuit 2010 may further include a discharge tube 2023. Two ends of the discharge tube 2023 are connected to the output terminal 2021 and the ground potential respectively. A voltage rating of the discharge tube 2023 in some embodiments may be between 300 V and 600 V, and may be in some embodiments between 400 V and 500V, and may be in some embodiments 400 V. In some embodiments, the discharge tube 2023 also may be replaced by a thyristor.

In some embodiments, the property of the rectified signal may be the frequency level or voltage level of the rectified signal. That is, a frequency detection circuit or other voltage detection circuits can be used to replace the voltage divider(s). Thus, the mode determination circuit 2010 can detect the voltage level or frequency level of the rectified signal to determine whether to perform the first mode and the second mode of lighting.

Referring to FIG. 23B again, in order to reduce a pulse current result from electrical ballasts, the LED tube lamp may further includes a noise suppressing circuit 570 coupled between the mode determination circuit 2010 and the LED unit 632, and the noise suppressing circuit 570 is connected in series with the LED unit 632. It is worth noting that the noise-suppressing circuit 570 is an optional element and therefore may be omitted. In one embodiment, if noise-suppressing circuit 570 is omitted, one end (i.e. the cathode as depicted in FIG. 23) of LED unit 632 is directly connected to the output terminal 2021 of the mode determination circuit 2010.

The noise suppressing circuit 570 includes an inductor 571 connected to the cathode of the LED unit 632 between the LED unit 632 and the output terminal 2021 of the mode determination circuit 2010 for reducing an abrupt change in the current provided to the LED unit 632. However, a current flowing through the inductor 571 may be larger than a current threshold, for instance, 0.35 A, in this situation, an over-current is generated and the inductor 571 is overheating result from the overcurrent. In order to eliminate the over-current, noise suppressing circuit 570 may further includes a resistor 573, a resistor 574 and a transistor 575 to form an over-current eliminating circuit. The third terminal of the transistor 575 is coupled to the output terminal 2021 of the mode determination circuit 2010, the second terminal of the transistor 575 is connected to the second end of the inductor 571, and the first terminal of the transistor 575 is connected to a connection node between the LED unit 632 and the inductor 571 to connect to the first end of the inductor 571. The resistor 574 is connected between the third terminal and the second terminal. The resistor 573 is connected between the first terminal and the second terminal.

The over-current protection circuit will be triggered when the current flowing through the inductor 571 is larger than the current threshold. In general, the current from the LED unit 632 flow through the inductor 571 and resistor 574 thereby incurring a voltage drop across the resistor 574. So, if the current increases, the voltage drop may increase to reach a conducting voltage (e.g. 0.7 V) of the transistor 575 thereby to turn on the transistor 575 to conduct current. Accordingly, when the transistor 575 operates in a conducting state, the conducting state of the transistor 575 diverts some current from flowing through the inductor 571 thus achieving the purpose of preventing excessive current from flowing through the inductor 571. The transistor 575 may comprise a BJT or a MOSFET. In some embodiments, the inductor 571 may be connected in parallel with the anti-flickering circuit 550 and 650 as depicted in FIGS. 20A and 20B, respectively. In some embodiments, inductance value of the inductor 571 may be between 1 mH and 10 mH, and may be in some embodiments between 1 mH and 8 mH, and may be in some embodiments 6 mH.

In some embodiments, the noise-suppressing circuit 570 may further include a freewheel diode 572 for providing a current path. A portion of the current flowing through the inductor 571 flow through the freewheel diode 572.

It is worth noting that the freewheel diode 572, resistor 573, resistor 574 and transistor 575 are optional elements and therefore can be omitted. In one embodiment, if freewheel diode 572, resistor 573, resistor 574 and transistor 575 are omitted, the second end of the inductor 571 is directly connected to the output terminal 2021 of the mode determination circuit 2010.

In some embodiments, noise-suppressing circuit 570 may be connected between a rectifying circuit 510 and the LED unit 632. In such cases, the function of the noise-suppressing circuit 570 will not be affected.

In some embodiments, the filtering circuit 520 may be coupled between the mode determination circuit 2010 and the LED unit 632, and capacitor 625 can be a component of the filtering circuit 520.

In various embodiments, the mode determination circuit 2010 may be referred to as a ballast interface circuit. The ballast interface circuit may also be coupled to the first external connection terminal and the second external connection terminal between the lamp driving circuit 505 such as an electrical ballast and the LED unit 632 for receiving an external driving signal from the electrical ballast for transmitting power from the electrical ballast to the LED unit 632. In some embodiments, the ballast interface circuit includes a detecting circuit and a control circuit coupled to the detecting circuit. The detecting circuit detects a state of a property of the external driving signal. In some embodiments, the property of the external driving signal is the voltage level of the external driving signal. The detecting circuit includes the first voltage divider 201 and the second voltage divider 202 in FIG. 23A for receiving the external driving signal to obtain a first fraction voltage of the external driving signal and a second fraction voltage of the external driving signal. The detecting circuit determines whether the first fraction voltage is in the first voltage range, and determines whether the second fraction voltage is in the second voltage range. According to the voltage level of external driving signal, the control circuit selectively determines on performing a first mode or a second mode of lighting. When performing the first mode of lighting, the control circuit allows continual current to flow through the LED unit until the external driving signal is disconnected from the LED tube lamp; and when performing the second mode of lighting, the control circuit regulates the continuity of current to flow through the LED unit 632.

In other embodiments, the property of the external driving signal may be the frequency level of the external driving signal. In various embodiments, a frequency detection circuit or other voltage detection circuits can be used to replace the first voltage divider 201 and the second voltage divider 202. Accordingly, the ballast interface circuit can detect the voltage level or the frequency level of the external driving signal to determine whether to perform the first mode and the second mode of lighting.

Figure 23C:
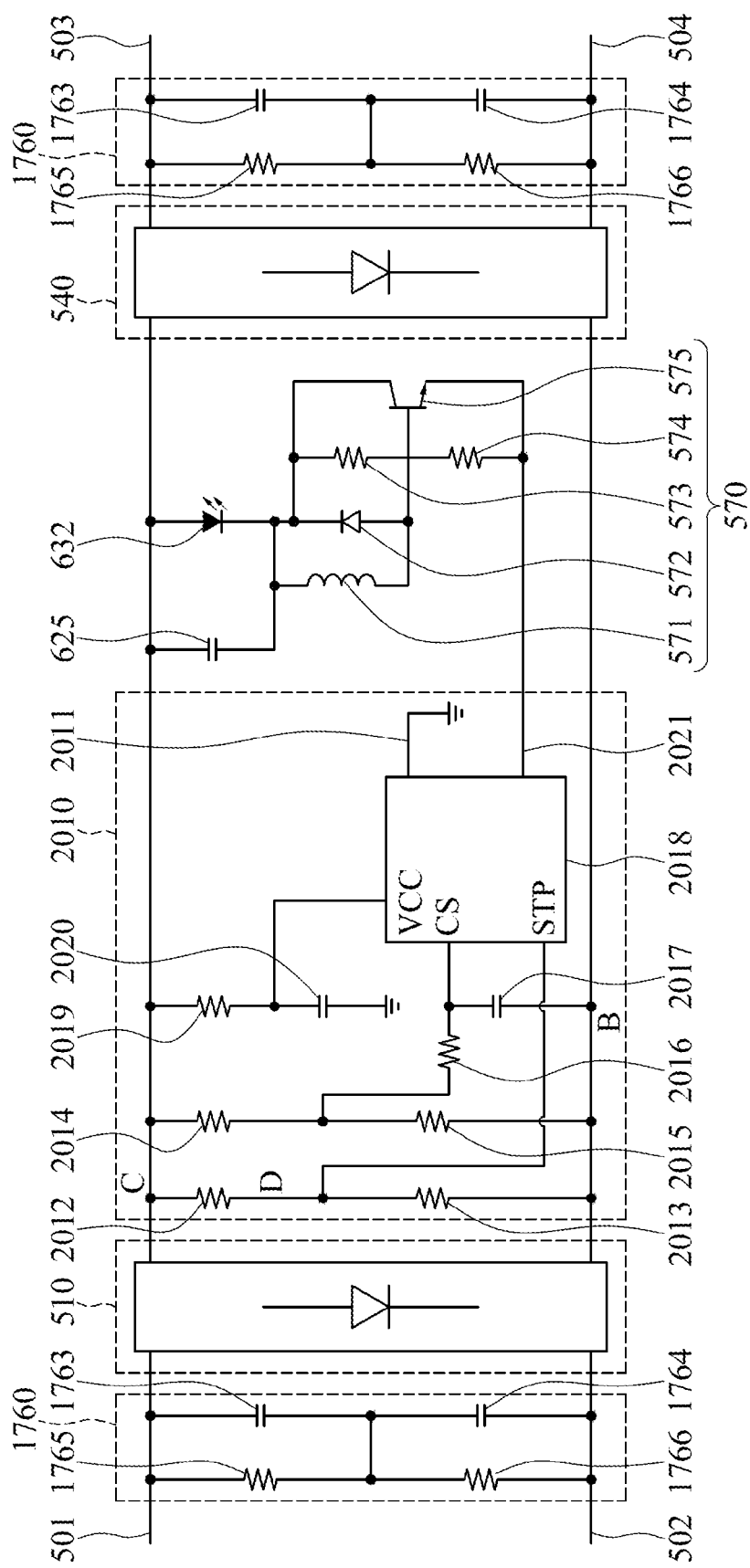
FIG. 23C is a block diagram of an LED tube lamp according to an embodiment.

FIG. 23C is a block diagram of an LED tube lamp according to an embodiment. Compared to that shown in FIG. 23B, the present embodiment comprises the rectifying circuits 510 and 540, the capacitor 625, the noise suppressing circuit 570, and the LED unit 632, and further includes two filament-simulating circuits 1760. The filament-simulating circuits 1760 are respectively coupled between the pins 501 and 502 and coupled between the pins 503 and 504. The filament-simulating circuit 1760 includes capacitors 1763 and 1764, and the resistors 1765 and 1766. The capacitors 1763 and 1764 are connected in series and coupled between the pins 503 and 504 and coupled between the pins 501 and 502. The resistors 1765 and 1766 are connected in series and coupled between the pins 503 and 504 and coupled between the pins 501 and 502. Furthermore, the connection node between the capacitors 1763 and 1764 is coupled to that of the resistors 1765 and 1766. Accordingly, the LED tube lamp in this embodiment can be applied to or be supplied by programmed-start ballasts. When a programmed-start ballast is applied, in a process of preheating, an AC current flows through the capacitors 1763 and 1764 and resistors 1765 and 1766 to achieve the function of simulating the operation of actual filaments. Accordingly, the LED tube lamp is compatible with the programmed-start ballast. That is, the programmed-start ballast can successfully start the LED tube lamp in the embodiments.

Resistance values of resistors 1766 and 1765 may be between 10 K and 1 M ohms, and may be in some embodiments between 100 K and 1 M ohms, and may be in some embodiments 100 K. Capacitance values of the capacitors 1763 and 1764 may be in some embodiments between 3 nF and 2 pF, and may be in some embodiments 3 nF and 100 nF, and may be in some embodiments 4.7 nF.

In some embodiments, resistors 1766 and 1765 may be resistors with negative temperature coefficient. If the filament-simulating circuits 1760 includes resistors 1766 and 1765 with negative temperature coefficient, resistance value of the resistors 1766 and 1765 may be no greater than 15 ohms, and may be in some embodiments between 2 to 10 ohms, and may be in some embodiments between 4 ohms and 5 ohms.

In applications, with reference back to FIGS. 7 and 8, the filtering circuit 520, one of the filament-simulating circuits 1760, the rectifying circuit 510, anti-flickering circuit 550 and 650, and the LED module 630 may be disposed on the long circuit sheet 251 of the LED light strip 2. The mode determination circuit 2010, another filament-simulating circuit 1760, noise suppressing circuit 570, and the rectifying circuit 540 may be disposed on the short circuit board 253. In some embodiments, if filtering circuit 520 includes the capacitor 625, the capacitor 625 may be implemented by two film capacitors connected to each other and to be disposed on the long circuit sheet 251 of the LED light strip 2. In some embodiments, both of the filament-simulating circuits 1760 may be disposed on the short circuit board 253 together. In one embodiment, the inductance 571 may be disposed on the short circuit board 253 if the inductance value of the inductor 571 is 6 mH. This 6-mh inductor is too heavy to dispose on the long circuit sheet 251 due to the difficulty of the manufacturing of the long circuit sheet 251 with bendable structure.

With reference back to FIG. 5, welding defects may exist between the soldering pads "a" of power supply 5 and soldering pads "b" of the LED light strip 2. Welding defects may block the intended current path between the power supply 5 and the LED light strip 2 (which light strip 2 may comprise a flexible printed circuit board (FPC)) after supplying power, such that a high voltage (typically 600 V) exists between an anode electrode and cathode electrode of the power supply 5, or between a anode electrode and a cathode electrode of the LED unit 632 on the LED light strip 2. Such high voltage causes the LED module 630 having one or more LED unit 632 damages from sparkling or arcing.

To prevent (the effects caused by) arcing and sparkling, the LED tube lamp may include a discharge device 620. The discharge device 620 is disposed on the circuit board and configured to connect in parallel with the LED unit 632 (i.e. connected between anode and cathode electrodes of the LED unit 632) on the LED light strip 2. In a case that power is supplied normally, the LED 631 limits the voltage between the anode and cathode electrodes of the LED unit 632. Under such circumstances, the voltage across the LED unit 632 may be less than 200 V. But, if welding defects exist, after the LED tube lamp is supplied by power, an instantaneously high (e.g. larger than a threshold voltage) voltage may occur across the anode and cathode electrodes of the LED unit 632. Then, the discharge device 620 can discharge electricity to serve to prevent the instantaneously high voltage across the LED unit 632 from being larger than the threshold voltage. The discharge device 620 thus protects the LED unit 632 against arcing or sparkling due to the instantaneously high voltage across the LED unit 632. In some embodiments, the discharge device 620 may be disposed on the short circuit board 253.

The discharge device 620 may include a capacitor, a discharge tube, or a diode. The discharge device 620 may have a voltage rating in the range of about 1.2 to 5 times that of the LED unit 632. And the voltage rating of the capacitor may be between 200-600 V, for example. In addition, if the discharge device 620 includes a capacitor, the capacitor can achieve a function of filtering when power is normally supplied. In this function, the discharge device 620 may be a component of the filtering circuit 520.

FIG. 24A is a block diagram of an LED tube lamp according to an embodiment. Compared to that shown in FIG. 14E, the present embodiment comprises the rectifying circuits 510 and 540, the filtering circuit 520, and the LED lighting module 530, and further comprises two filament-simulating circuits 1560. The filament-simulating circuits 1560 are respectively coupled between the pins 501 and 502 and coupled between the pins 503 and 504, for improving a compatibility with a lamp driving circuit having filament detection function, e.g.: programmed-start ballast.

In an initial stage upon the lamp driving circuit having filament detection function being activated, the lamp driving circuit will determine whether the filaments of the lamp operate normally or are in an abnormal condition of short-circuit or open-circuit. When determining the abnormal condition of the filaments, the lamp driving circuit stops operating and enters a protection state. In order to avoid that the lamp driving circuit erroneously determines the LED tube lamp to be abnormal due to the LED tube lamp having no filament, the two filament-simulating circuits 1560 simulate the operation of actual filaments of a fluorescent tube to have the lamp driving circuit enter into a normal state to start the LED lamp normally.

FIG. 24B is a schematic diagram of a filament-simulating circuit according to an embodiment. The filament-simulating circuit comprises a capacitor 1663 and a resistor 1665 connected in parallel, and two ends of the capacitor 1663 and two ends of the resistor 1665 are re respectively coupled to filament simulating terminals 1661 and 1662. Referring to FIG. 24A, the filament simulating terminals 1661 and 1662 of the two filament-simulating circuit 1660 are respectively coupled to the pins 501 and 502 and the pins 503 and 504. During the filament detection process, the lamp driving circuit outputs a detection signal to detect the state of the filaments. The detection signal passes the capacitor 1663 and the resistor 1665 and so the lamp driving circuit determines that the filaments of the LED lamp are normal.

In addition, a capacitance value of the capacitor 1663 is low and so a capacitive reactance (equivalent impedance) of the capacitor 1663 is far lower than an impedance of the resistor 1665 due to the lamp driving circuit outputting a high-frequency alternative current (AC) signal to drive LED lamp. Therefore, the filament-simulating circuit 1660 consumes fairly low power when the LED lamp operates normally, and so it almost does not affect the luminous efficiency of the LED lamp.

FIG. 24C is a schematic diagram of a filament-simulating circuit according to another embodiment. A filament-simulating circuit 1760 comprises capacitors 1763 and 1764, and the resistors 1765 and 1766. The capacitors 1763 and 1764 are connected in series and coupled between the filament simulating terminals 1661 and 1662. The resistors 1765 and 1766 are connected in series and coupled between the filament simulating terminals 1661 and 1662. Furthermore, the connection node of capacitors 1763 and 1764 is coupled to that of the resistors 1765 and 1766. Referring to FIG. 24A, the filament simulating terminals 1661 and 1662 of the filament-simulating circuit 1760 are respectively coupled to the pins 501 and 502 and the pins 503 and 504. When the lamp driving circuit outputs the detection signal for detecting the state of the filament, the detection signal passes the capacitors 1763 and 1764 and the resistors 1765 and 1766 so that the lamp driving circuit determines that the filaments of the LED lamp are normal.

In some embodiments, capacitance values of the capacitors 1763 and 1764 are low and so a capacitive reactance of the serially connected capacitors 1763 and 1764 is far lower than an impedance of the serially connected resistors 1765 and 1766 due to the lamp driving circuit outputting the high-frequency AC signal to drive LED lamp. Therefore, the filament-simulating circuit 1760 consumes fairly low power when the LED lamp operates normally, and so it almost does not affect the luminous efficiency of the LED lamp. Moreover, whether any one of the capacitor 1763 and the resistor 1765 is short circuited or open circuited, or any one of the capacitor 1764 and the resistor 1766 is short circuited or open circuited, the detection signal still passes through the filament-simulating circuit 1760 between the filament simulating terminals 1661 and 1662. Therefore, the filament-simulating circuit 1760 still operates normally when any one of the capacitor 1763 and the resistor 1765 is short circuited or is an open circuit or any one of the capacitor 1764 and the resistor 1766 is short circuited or is an open circuit, and so it has quite high fault tolerance.

FIG. 25A is a block diagram of an LED tube lamp according to an embodiment. Compared to that shown in FIG. 14E, the present embodiment comprises the rectifying circuits 510 and 540, the filtering circuit 520, and the LED lighting module 530, and further comprises an over voltage protection (OVP) circuit 1570. The OVP circuit 1570 is coupled to the filtering output terminals 521 and 522 for detecting the filtered signal. The OVP circuit 1570 clamps the level of the filtered signal when determining the level thereof higher than a defined OVP value. Hence, the OVP circuit 1570 protects the LED lighting module 530 from damage due to an OVP condition. The rectifying circuit 540 may be omitted and is therefore depicted by a dotted line.

FIG. 25B is a schematic diagram of an overvoltage protection (OVP) circuit according to an embodiment. The OVP circuit 1670 comprises a voltage clamping diode 1671, such as a zener diode, coupled to the filtering output terminals 521 and 522. The voltage clamping diode 1671 is conducted to clamp a voltage difference at a breakdown voltage when the voltage difference of the filtering output terminals 521 and 522 (i.e., the level of the filtered signal) reaches the breakdown voltage. The breakdown voltage may be in a range of about 40 V to about 100 V. In some embodiments, the breakdown voltage may be in a range of about 55 V to about 75V.

FIG. 25C is a schematic diagram of an overvoltage protection (OVP) circuit according to an embodiment of the present invention. Referring to FIG. 25C, the over voltage protection circuit 1770 comprises a symmetrical trigger diode 1771, resistors 1772, 1774 and 1776, a capacitor 1733 and a switch 1775. The symmetrical trigger diode 1771, the resistor 1772 and the capacitor 1733 are connected in series between a first filtering output terminal 521 and a second filtering output terminal 522. One end of the symmetrical trigger diode 1771 is coupled to the first filtering output terminal 521, one end of the capacitor 1773 is coupled to the second filtering output terminal 522, and the resistor 1772 is coupled between the symmetrical trigger diode 1771 and the capacitor 1773. The resistor 1774 and the switch 1775 are connected in series between the first filtering output terminal 521 and the second filtering output terminal 522. One end of the resistor 1774 is coupled to the first filtering output terminal 521, the other end is coupled to the switch 1775. One end of the switch 1775 is coupled to the second filtering output terminal 522, and one control end is coupled to a connection node of the resistor 1772 and the capacitor 1773 through the resistor 1776. When a voltage difference of the first filtering output terminal 521 and the second filtering output terminal 522 (i.e., the voltage level of the filtered signal) reaches or is higher than the breakover voltage of the symmetrical trigger diode 1771, the symmetrical trigger diode 1771 is conducted, and so a voltage of the capacitor 1773 is raised to trigger the switch 1775 to be conducted to protect the LED lighting module 530.

In some embodiments, the breakover voltage of the symmetrical trigger diode 1771 ranges from about 400 to about 1300 volts, in some embodiments from about 450 to about 700 volts, and in further embodiments from about 500 to about 600 volts.

The LED tube lamps according to various different embodiments of the present invention are described as above. With respect to an entire LED tube lamp, the features including for example "adopting the bendable circuit sheet as the LED light strip" and "utilizing the circuit board assembly to connect the LED light strip and the power supply" may be applied in practice singly or integrally such that only one of the features is practiced or a number of the features are simultaneously practiced.

As an example, the feature "adopting the bendable circuit sheet as the LED light strip" may include "the connection between the bendable circuit sheet and the power supply is by way of wire bonding or soldering bonding; the bendable circuit sheet includes a wiring layer and a dielectric layer arranged in a stacked manner; the bendable circuit sheet has a circuit protective layer made of ink to reflect light and has widened part along the circumferential direction of the lamp tube to function as a reflective film."

As an example, the feature "utilizing the circuit board assembly to connect the LED light strip and the power supply" may include "the circuit board assembly has a long circuit sheet and a short circuit board that are adhered to each other with the short circuit board being adjacent to the side edge of the long circuit sheet; the short circuit board is provided with a power supply module to form the power supply; the short circuit board is stiffer than the long circuit sheet."

According to examples of the power supply module, the external driving signal may be low frequency AC signal (e.g., commercial power), high frequency AC signal (e.g., that provided by a ballast), or a DC signal (e.g., that provided by a battery), input into the LED tube lamp through a drive architecture of single-end power supply or dual-end power supply. For the drive architecture of dual-end power supply, the external driving signal may be input by using only one end thereof as single-end power supply.

The LED tube lamp may omit the rectifying circuit when the external driving signal is a DC signal.

According examples of the rectifying circuit in the power supply module, in certain embodiments, there may be a single rectifying circuit, or dual rectifying circuits. First and second rectifying circuits of the dual rectifying circuit may be respectively coupled to the two end caps disposed on two ends of the LED tube lamp. The single rectifying circuit is applicable to the drive architecture of signal-end power supply, and the dual rectifying circuit is applicable to the drive architecture of dual-end power supply. Furthermore, the LED tube lamp having at least one rectifying circuit is applicable to the drive architecture of low frequency AC signal, high frequency AC signal or DC signal.

The single rectifying circuit may be a half-wave rectifier circuit or full-wave bridge rectifying circuit. The dual rectifying circuit may comprise two half-wave rectifier circuits, two full-wave bridge rectifying circuits or one half-wave rectifier circuit and one full-wave bridge rectifying circuit.

According to examples of the pin in the power supply module, in certain embodiments, there may be two pins in a single end (the other end has no pin), two pins in corresponding ends of two ends, or four pins in corresponding ends of two ends. The designs of two pins in single end two pins in corresponding ends of two ends are applicable to signal rectifying circuit design of the of the rectifying circuit. The design of four pins in corresponding ends of two ends is applicable to dual rectifying circuit design of the of the rectifying circuit, and the external driving signal can be received by two pins in only one end or in two ends.

According to the design of the LED lighting module according to some embodiments, the LED lighting module may comprise the LED module and a driving circuit or only the LED module.

If there is only the LED module in the LED lighting module and the external driving signal is a high frequency AC signal, a capacitive circuit may be in at least one rectifying circuit and the capacitive circuit may be connected in series with a half-wave rectifier circuit or a full-wave bridge rectifying circuit of the rectifying circuit and may serve as a current modulation circuit to modulate the current of the LED module since the capacitor acts as a resistor for a high frequency signal. Thereby, even when different ballasts provide high frequency signals with different voltage levels, the current of the LED module can be modulated into a defined current range for preventing overcurrent. In addition, an energy-releasing circuit may be connected in parallel with the LED module. When the external driving signal is no longer supplied, the energy-releasing circuit releases the energy stored in the filtering circuit to lower a resonance effect of the filtering circuit and other circuits for restraining the flicker of the LED module.

In some embodiments, if there are the LED module and the driving circuit in the LED lighting module, the driving circuit may be a buck converter, a boost converter, or a buck-boost converter. The driving circuit stabilizes the current of the LED module at a defined current value, and the defined current value may be modulated based on the external driving signal. For example, the defined current value may be increased with the increasing of the level of the external driving signal and reduced with the reducing of the level of the external driving signal. Moreover, a mode switching circuit may be added between the LED module and the driving circuit for switching the current from the filtering circuit directly or through the driving circuit inputting into the LED module.

According to some embodiments, the LED module comprises plural strings of LEDs connected in parallel with each other, wherein each LED may have a single LED chip or plural LED chips emitting different spectrums. Each LEDs in different LED strings may be connected with each other to form a mesh connection.

According to the design of the ballast interface circuit of the power supply module in some embodiments, the ballast interface circuit may be connected in series with the rectifying circuit. Under the design of being connected in series with the rectifying circuit, the ballast interface circuit is initially in a cutoff state and then changes to a conducting state in or after an objective delay. The ballast interface circuit makes the electronic ballast activate during the starting stage and enhances the compatibility for instant-start ballast. Furthermore, the ballast interface circuit maintains the compatibilities with other ballasts, e.g., programmed-start and rapid-start ballasts.

According to the design of the mode determination circuit in some embodiments, the mode determination circuit may be connected to the rectifying circuit for detecting the state of the property of the rectified signal to selectively determine whether to perform a first mode or a second mode of lighting according to the state of the property of the rectified signal. Accordingly, the LED tube lamp is compatible with different types of the electrical ballasts, e.g. electronic ballasts and inductive (or magnetic) ballasts.

According to the design of the mode determination circuit in some embodiments, the mode determination circuit may be connected to the electrical ballast for detecting the state of the property of the external driving signal to selectively determine whether to perform a first mode or a second mode of lighting according to the state of the property of the external driving signal. Accordingly, the LED tube lamp is compatible with different types of the electrical ballasts, e.g. electronic ballasts and inductive ballasts.

According to the design of the mode determination circuit in some embodiments, the mode determination circuit includes a ballast interface circuit as an interface between the LED tube lamp and electrical ballast used to supply the LED tube lamp. Accordingly, the LED tube lamp is compatible with different types of the electrical ballasts, e.g. electronic ballasts and inductive ballasts.

According to the design of the mode determination circuit in some embodiments, the mode determination circuit includes a discharge device to be conducted when welding defects existed between the positive electrodes of the LED unit and the negative electrodes of the LED unit for preventing the LED unit from arcing.

The above-mentioned features can be accomplished in any combination to improve the LED tube lamp, and the above embodiments are described by way of example only. The present invention is not herein limited, and many variations are possible without departing from the spirit of the present invention and the scope as defined in the appended claims.

What is claimed is:

1. A light emitting diode (LED) tube lamp configured to receive an external driving signal, comprising:
   an LED module for emitting light, the LED module comprising an LED unit comprising an LED;
   a rectifying circuit for rectifying the external driving signal to produce a rectified signal;
   a filtering circuit connected in parallel with the LED unit;
   a discharge device connected in parallel with the LED unit and for discharging when a voltage across the LED unit is larger than a threshold voltage; and
   a mode determination circuit configured to detect a state of a property of the rectified signal, for selectively determining on performing a first mode or a second mode of lighting according to the state of the property of the rectified signal;
   wherein the mode determination circuit is configured such that when the LED tube lamp performs the first mode of lighting, the mode determination circuit allows continual current to flow through the LED unit until the external driving signal is disconnected from the LED tube lamp; and when the LED tube lamp performs the second mode of lighting, the mode determination circuit regulates the continuity of current to flow through the LED unit.

2. The light emitting diode tube lamp according to claim 1, wherein the mode determination circuit comprises:
   a voltage divider for producing a first fraction voltage of the rectified signal and a second fraction voltage of the rectified signal; and
   a control circuit for determining whether the voltage level of the first fraction voltage is in a first voltage range, and whether the voltage level of the second fraction voltage is in a second voltage range;
   wherein when the first fraction voltage signal is in the first voltage range, the mode determination circuit determines on performing the first mode of lighting; and when the second fraction voltage is in the second voltage range, the mode determination circuit determines on performing the second mode of lighting.

3. The light emitting diode tube lamp according to claim 2, wherein the control circuit comprises a switching circuit; when the LED tube lamp performs the first mode of lighting, the mode determination circuit allows continuous current to flow through the LED unit by continuously turning on the switching circuit; and when the LED tube lamp performs the second mode of lighting, the mode determination circuit allows discontinuous current to flow through the LED unit by alternately turning on and off the switching circuit.

4. The light emitting diode tube lamp according to claim 3, wherein the switching circuit has two terminals respectively coupled to the LED unit and a reference voltage.

5. The light emitting diode tube lamp according to claim 2, further comprising a switching circuit; when the LED tube lamp performs the first mode of lighting, the mode determination circuit allows continuous current to flow through the LED unit by continuously turning on the switching circuit; and when the LED tube lamp performs the second mode of lighting, the mode determination circuit allows discontinuous current to flow through the LED unit by alternately turning on and off the switching circuit.

6. The light emitting diode tube lamp according to claim 5, wherein the switching circuit has two terminals respectively coupled to the LED unit and a reference voltage.

7. The light emitting diode tube lamp according to claim 2, wherein the rectifying circuit has a first output terminal and a second output terminal for outputting the rectified signal, and the voltage divider comprises:
   a first voltage divider comprising a first resistor and a second resistor connected to each other between the first and second output terminals of the rectifying circuit, to produce the first fraction voltage; and
   a second voltage divider comprising a third resistor and a fourth resistor connected to each other between the first and second output terminals of the rectifying circuit, to produce the second fraction voltage;
   wherein the control circuit is coupled to a connection node between the first resistor and the second resistor, for receiving the first fraction voltage; and the control circuit is coupled to a connection node between the third resistor and the fourth resistor, for receiving the second fraction voltage.

8. The light emitting diode tube lamp according to claim 7, further comprising a switching circuit for the LED tube lamp to perform the second mode of lighting, wherein the second voltage divider further comprises an RC circuit comprising a resistor and a capacitor; one end of the resistor is connected to a connection node between the third resistor and the fourth resistor; another end of the resistor is connected to one end of the capacitor and the control circuit; another end of the capacitor is connected to the second output terminal; and the RC circuit is configured to receive the second fraction voltage and then be charged and discharged repeatedly to alternately turning on and off the switching circuit.

9. The light emitting diode tube lamp according to claim 7, further comprising a switching circuit for the LED tube lamp to perform the second mode of lighting, wherein the second voltage divider further comprises a pulse width modulation circuit coupled between the switching circuit and a connection node between the third resistor and the fourth resistor, and the pulse width modulation circuit is configured to receive the second fraction voltage and then produce a pulse signal with a duty-cycle responsive to the second fraction voltage, and the pulse signal is used to alternately turning on and off the switching circuit.

10. The light emitting diode tube lamp according to claim 7, further comprising a switching circuit for the LED tube lamp to perform the second mode of lighting, wherein the control circuit comprises an RC circuit coupled to the switching circuit and a connection node between the third resistor and the fourth resistor, and the RC circuit is configured to receive the second fraction voltage and then be charged and discharged repeatedly to alternately turning on and off the switching circuit.

11. The light emitting diode tube lamp according to claim 7, further comprising a switching circuit for the LED tube lamp to perform the second mode of lighting, wherein the control circuit comprises a pulse width modulation circuit coupled between the switching circuit and a connection node between the third resistor and the fourth resistor, the pulse width modulation circuit is configured to receive the second fraction voltage and then produce a pulse signal with a duty-cycle responsive to the second fraction voltage, and the pulse signal is used to alternately turning on and off the switching circuit.

12. The light emitting diode tube lamp according to claim 2, wherein the first voltage range is defined to encompass values less than a first voltage value or larger than a second voltage value which is larger than the first voltage value; and the second voltage range is defined to encompass values larger than a third voltage value and less than a fourth voltage value which is larger than the third voltage value.

13. The light emitting diode tube lamp according to claim 1, wherein the mode determination circuit comprises a ballast interface circuit as an interface between the LED tube lamp and an electrical ballast used to supply the LED tube lamp.

14. The light emitting diode tube lamp according to claim 1, wherein the property is the voltage level or the frequency level of the rectified signal.

15. The light emitting diode tube lamp according to claim 1, wherein the mode determination circuit is configured such that upon the external driving signal being initially input to the LED tube lamp, the mode determination circuit will not enter a conduction state until a period of delay passes, wherein the period of delay is between about 10 milliseconds and about 1 second.

16. A light emitting diode (LED) tube lamp configured to receive an external driving signal, comprising:
an LED module for emitting light, the LED module comprising an LED unit comprising an LED;
a rectifying circuit for rectifying the external driving signal to produce a rectified signal;
a mode determination circuit configured to detect a state of a property of the rectified signal, for selectively determining on performing a first mode or a second mode of lighting according to the state of the property of the rectified signal, wherein the mode determination circuit is configured such that when the LED tube lamp performs the first mode of lighting, the mode determination circuit allows continual current to flow through the LED unit until the external driving signal is disconnected from the LED tube lamp; and when the LED tube lamp performs the second mode of lighting, the mode determination circuit regulates the continuity of current to flow through the LED unit; and a capacitor coupled in series with the LED, wherein an equivalent current-limiting capacitance of the capacitor is a value presenting low impedance to the received external driving signal and having substantially no current-limiting effect on current entering the LED unit.

17. The light emitting diode tube lamp according to claim 7, wherein the first voltage range is defined to encompass values less than a first voltage value or larger than a second voltage value which is larger than the first voltage value; and the mode determination circuit further comprises at least a diode coupled between the first voltage divider and the second output terminal, and the voltage drop of the at least a diode when electrically conducting is larger than the first voltage value.

18. A light emitting diode tube lamp according to claim 1, further comprising a noise suppressing circuit comprising an inductor coupled between the LED unit and an output terminal of the mode determination circuit.

19. A light emitting diode tube lamp according to claim 18, wherein the inductor has a first end and a second end, the first end is connected to a cathode terminal of the LED unit, and the noise suppressing circuit further comprises:
a resistor connected in series with the inductor between the inductor and the output terminal of the mode determination circuit; and
a transistor having a first terminal, a second terminal, and a third terminal, the first terminal connected to a connection node between the inductor and the LED unit, the second terminal and the third terminal respectively connected to two ends of the resistor, wherein the transistor is configured to conduct current according to a voltage drop of the resistor;
wherein the transistor is configured such that a conducting state of the transistor diverts some current from flowing through the inductor.

20. A light emitting diode tube lamp according to claim 5, wherein the switching circuit comprises an electronic switch.

21. The light emitting diode tube lamp according to claim 1, wherein the discharge device has a voltage rating in the range of about 1.2 to 5 times that of the LED unit.

22. The light emitting diode tube lamp according to claim 1, wherein the discharge device comprises a capacitor, a discharge tube, or a diode.

23. A light emitting diode tube lamp according to claim 1, further comprising:
a lamp tube;
a light strip attached to an inner surface of the lamp tube; and
an end cap coupled to an end of the tube and for containing a circuit board;
wherein the filtering circuit, the rectifying circuit and the LED module are disposed on the light strip, and the discharge device and the mode determination circuit are disposed on the circuit board.

24. The light emitting diode tube lamp according to claim 23, further comprising:
another rectifying circuit coupled to the LED module;
a first filament-simulating circuit coupled to the first rectifying circuit; and
a second filament-simulating circuit coupled to the second rectifying circuit;
wherein the first filament-simulating circuit is disposed on the light strip, and the second filament-simulating circuit and the another rectifying circuit are disposed on the circuit board.

25. The light emitting diode tube lamp according to claim 1, comprising essentially no current-limiting capacitor coupled in series with the LED.

26. A light emitting diode tube lamp, comprising:
a lamp tube;
a first external connection terminal and a second external connection terminal coupled to the lamp tube and for receiving an external driving signal from an electrical ballast;
a rectifying circuit for rectifying the external driving signal to produce a rectified signal;
a ballast interface circuit configured to detect a state of a property of the rectified signal, for selectively determining on performing a first mode or a second mode of lighting according to the state of the property of the rectified signal;
an LED module for emitting light, the LED module comprising an LED unit comprising an LED;
a filtering circuit connected in parallel with the LED unit; and
a discharge device connected in parallel with the LED unit and for discharging when a voltage across the LED unit is larger than a threshold voltage;
wherein the ballast interface circuit is configured such that when the LED tube lamp performs the first mode of lighting, the ballast interface circuit allows continual current to flow through the LED unit until the external driving signal is disconnected from the LED tube lamp; and when the LED tube lamp performs the second mode of lighting, the ballast interface circuit regulates the continuity of current to flow through the LED unit.

27. The light emitting diode tube lamp according to claim 26, wherein the electrical ballast comprises an inductive ballast or an electronic ballast.

28. The light emitting diode tube lamp according to claim 16, wherein the mode determination circuit comprises:
a voltage divider for producing a first fraction voltage of the rectified signal and a second fraction voltage of the rectified signal; and
a control circuit for determining whether the voltage level of the first fraction voltage is in a first voltage range, and whether the voltage level of the second fraction voltage is in a second voltage range;
wherein when the first fraction voltage signal is in the first voltage range, the mode determination circuit determines on performing the first mode of lighting; and when the second fraction voltage is in the second voltage range, the mode determination circuit determines on performing the second mode of lighting.

29. The light emitting diode tube lamp according to claim 1, wherein the rectifying circuit has a first output terminal and a second output terminal for outputting the rectified signal, and the mode determination circuit comprises:
a voltage divider comprising two elements connected in series between the first and second output terminals of the rectifying circuit, for producing a fraction voltage of the rectified signal; and
a control circuit coupled to a connection node between the two elements, for receiving the fraction voltage to detect a state of a property of the rectified signal,
wherein the control circuit includes or is coupled to a switching circuit coupled to the rectifying circuit, and when the external driving signal is from an electrical ballast, the switching circuit is configured to be triggered on and off by the detected state of the property of the rectified signal, to allow discontinuous current to flow through the LED unit.

30. The light emitting diode tube lamp according to claim 26, wherein the rectifying circuit has a first output terminal and a second output terminal for outputting the rectified signal, and the ballast interface circuit comprises:
a voltage divider comprising two elements connected in series between the first and second output terminals of the rectifying circuit, for producing a fraction voltage of the rectified signal; and
a control circuit coupled to a connection node between the two elements, for receiving the fraction voltage to detect a state of a property of the rectified signal,
wherein the control circuit includes or is coupled to a switching circuit coupled to the rectifying circuit, and when the external driving signal is from an electrical ballast, the switching circuit is configured to be triggered on and off by the detected state of the property of the rectified signal, to allow discontinuous current to flow through the LED unit.

* * * * *